US010910039B2

(12) United States Patent
Masuoka et al.

(10) Patent No.: US 10,910,039 B2
(45) **Date of Patent: *Feb. 2, 2021**

(54) SEMICONDUCTOR DEVICE WITH A PLURALITY OF SURROUNDING GATE TRANSISTORS

(71) Applicant: Unisantis Electronics Singapore Pte. Ltd., Singapore (SG)

(72) Inventors: Fujio Masuoka, Tokyo (JP); Masamichi Asano, Tokyo (JP)

(73) Assignee: UNISANTIS ELECTRONICS SINGAPORE PTE. LTD., Singapore (SG)

(*) Notice: Subject to any disclaimer, the term of this patent is extended or adjusted under 35 U.S.C. 154(b) by 7 days.

This patent is subject to a terminal disclaimer.

(21) Appl. No.: 16/386,748

(22) Filed: Apr. 17, 2019

(65) Prior Publication Data

US 2019/0348109 A1 Nov. 14, 2019

Related U.S. Application Data

(63) Continuation of application No. 14/886,637, filed on Oct. 19, 2015, now Pat. No. 10,311,945, which is a (Continued)

(51) Int. Cl.

*G11C 11/418* (2006.01)
*H01L 27/092* (2006.01)

(Continued)

(52) U.S. Cl.

CPC ............ *G11C 11/418* (2013.01); *G11C 5/063* (2013.01); *G11C 8/08* (2013.01); *G11C 8/10* (2013.01);

(Continued)

(58) Field of Classification Search

CPC .. G11C 5/063; G11C 8/08; G11C 8/10; G11C 11/418; H01L 21/823885;

(Continued)

(56) References Cited

U.S. PATENT DOCUMENTS 4,756,221 A 7/1988 Nitschmann et al.
5,031,809 A 7/1991 Roberts et al.

(Continued)

FOREIGN PATENT DOCUMENTS

JP 2009/081389 A 4/2009
JP 2009/088134 A 4/2009

(Continued)

OTHER PUBLICATIONS

Yoshizawa, Hirokazu, "CMOS OP Amplifier Circuit, Basis of Practical Design", May 15, 2007, pp. 23, CQ Publishing Co., Ltd.

(Continued)

*Primary Examiner* — Richard Elms
*Assistant Examiner* — R Lance Reidlinger
(74) *Attorney, Agent, or Firm* — Brinks Gilson & Lione

(57) ABSTRACT

A semiconductor device constituting a decoder circuit for memory selection and having a smaller area is provided by using surrounding gate transistors (SGTs), which are vertical transistors. In a decoder circuit formed by a plurality of MOS transistors arranged in m rows and n columns, the MOS transistors that constitute the decoder circuit are arranged on a planar silicon layer formed on a substrate. Each has a structure including a drain, a gate, and a source arranged in a vertical direction, the gate surrounding a semiconductor pillar. The planar silicon layer is formed by a first active region of a first conductivity type and a second active region of a second conductivity type, and the regions are connected to each other via a conductive region formed on the surface of the planar silicon layer. Consequently, a (Continued)

BL201A semiconductor device that constitutes a decoder circuit having a smaller area is provided.

25 Claims, 70 Drawing Sheets

Related U.S. Application Data continuation of application No. PCT/JP2013/078725, filed on Oct. 23, 2013.

(51) Int. Cl.

| | |
|---|---|
| ***H01L 21/8238*** | (2006.01) |
| ***G11C 8/08*** | (2006.01) |
| ***G11C 8/10*** | (2006.01) |
| ***H01L 27/11*** | (2006.01) |
| ***H01L 29/423*** | (2006.01) |
| ***G11C 5/06*** | (2006.01) |
| ***H01L 29/16*** | (2006.01) |
| ***H01L 29/78*** | (2006.01) |

(52) U.S. Cl.

CPC .... *H01L 21/823885* (2013.01); *H01L 27/092* (2013.01); *H01L 27/1104* (2013.01); *H01L 27/1108* (2013.01); *H01L 27/1116* (2013.01); *H01L 29/16* (2013.01); *H01L 29/42356* (2013.01); *H01L 29/42392* (2013.01); *H01L 29/7827* (2013.01)

(58) Field of Classification Search

CPC ............... H01L 27/092; H01L 27/1104; H01L 27/1108; H01L 27/1116; H01L 29/16; H01L 29/42356; H01L 29/42392; H01L 29/7827

See application file for complete search history.

(56) References Cited

U.S. PATENT DOCUMENTS

| | | | |
|---|---|---|---|
| 5,130,596 A | 7/1992 | Umeki | |
| 8,039,893 B2 | 10/2011 | Masuoka et al. | |
| 8,154,076 B2 | 4/2012 | Takaishi | |
| 8,212,298 B2 | 7/2012 | Masuoka et al. | |
| 8,378,425 B2 | 2/2013 | Masuoka et al. | |
| 10,311,945 B2 * | 6/2019 | Masuoka | H01L 27/092 |
| 2009/0085102 A1 | 4/2009 | Takaishi | |
| 2010/0219483 A1 | 9/2010 | Masuoka et al. | |
| 2010/0295135 A1 | 11/2010 | Masuoka et al. | |
| 2011/0115011 A1 | 5/2011 | Masuoka et al. | |

FOREIGN PATENT DOCUMENTS

| | | |
|---|---|---|
| WO | WO 2009/096465 A1 | 8/2009 |
| WO | WO 2009/096468 A1 | 8/2009 |

OTHER PUBLICATIONS

Oklobdzija et al., Digital Design and Fabrication, CRC Press 2007, Chapter 5 Semiconductor Memory Circuts.

Siddiqi, Muzaffer, Dynamic RAM Technology Advancements, CRC Press 2012, DOI: 10.1201/b13005-9, Ch. 8 Memory Perepheral Circuits, pp. 301-342.

* cited by examiner

FIG. 2

| | XA0 | XA1 | XA2 | XA3 | XA4 | XA5 | XA6 | XA7 | XB0 | XB1 | XB2 | XB3 | XC0 | XC1 | … | XC7 |
|---|---|---|---|---|---|---|---|---|---|---|---|---|---|---|---|---|
| DECOUT0 | ○ | · | · | · | · | · | · | · | ○ | · | · | · | ○ | · | · | · |
| DECOUT1 | · | ○ | · | · | · | · | · | · | ○ | · | · | · | ○ | · | · | · |
| DECOUT2 | · | · | ○ | · | · | · | · | · | ○ | · | · | · | ○ | · | · | · |
| DECOUT3 | · | · | · | ○ | · | · | · | · | ○ | · | · | · | ○ | · | · | · |
| DECOUT4 | · | · | · | · | ○ | · | · | · | ○ | · | · | · | ○ | · | · | · |
| DECOUT5 | · | · | · | · | · | ○ | · | · | ○ | · | · | · | ○ | · | · | · |
| DECOUT6 | · | · | · | · | · | · | ○ | · | ○ | · | · | · | ○ | · | · | · |
| DECOUT7 | · | · | · | · | · | · | · | ○ | ○ | · | · | · | ○ | · | · | · |
| DECOUT8 | ○ | · | · | · | · | · | · | · | · | ○ | · | · | ○ | · | · | · |
| DECOUT9 | · | ○ | · | · | · | · | · | · | · | ○ | · | · | ○ | · | · | · |
| DECOUT10 | · | · | ○ | · | · | · | · | · | · | ○ | · | · | ○ | · | · | · |
| DECOUT11 | · | · | · | ○ | · | · | · | · | · | ○ | · | · | ○ | · | · | · |
| DECOUT12 | · | · | · | · | ○ | · | · | · | · | ○ | · | · | ○ | · | · | · |
| DECOUT13 | · | · | · | · | · | ○ | · | · | · | ○ | · | · | ○ | · | · | · |
| ODECUT14 | · | · | · | · | · | · | ○ | · | · | ○ | · | · | ○ | · | · | · |
| DECOUT15 | · | · | · | · | · | · | · | ○ | · | ○ | · | · | ○ | · | · | · |

○ : Contact

FIG. 14

| | XA0 | XA1 | XA2 | XA3 | XB0 | XB1 | XB2 | XB3 | XC0 | XC1 | XC2 | XC3 | XD0 | XD1 | XD2 | XD3 |
|---|---|---|---|---|---|---|---|---|---|---|---|---|---|---|---|---|
| DECOUT0 | ○ | - | - | - | ○ | - | - | - | ○ | - | - | - | ○ | - | - | - |
| DECOUT1 | - | ○ | - | - | ○ | - | - | - | ○ | - | - | - | ○ | - | - | - |
| DECOUT2 | - | - | ○ | - | ○ | - | - | - | ○ | - | - | - | ○ | - | - | - |
| DECOUT3 | - | - | - | ○ | ○ | - | - | - | ○ | - | - | - | ○ | - | - | - |
| DECOUT4 | ○ | - | - | - | - | ○ | - | - | ○ | - | - | - | ○ | - | - | - |
| DECOUT5 | - | ○ | - | - | - | ○ | - | - | ○ | - | - | - | ○ | - | - | - |
| DECOUT6 | - | - | ○ | - | - | ○ | - | - | ○ | - | - | - | ○ | - | - | - |
| DECOUT7 | - | - | - | ○ | - | ○ | - | - | ○ | - | - | - | ○ | - | - | - |
| DECOUT8 | ○ | - | - | - | - | - | ○ | - | ○ | - | - | - | ○ | - | - | - |
| DECOUT9 | - | ○ | - | - | - | - | ○ | - | ○ | - | - | - | ○ | - | - | - |
| DECOUT10 | - | - | ○ | - | - | - | ○ | - | ○ | - | - | - | ○ | - | - | - |
| DECOUT11 | - | - | - | ○ | - | - | ○ | - | ○ | - | - | - | ○ | - | - | - |
| DECOUT12 | ○ | - | - | - | - | - | - | ○ | ○ | - | - | - | ○ | - | - | - |
| DECOUT13 | - | ○ | - | - | - | - | - | ○ | ○ | - | - | - | ○ | - | - | - |
| DECOUT14 | - | - | ○ | - | - | - | - | ○ | ○ | - | - | - | ○ | - | - | - |
| DECOUT15 | - | - | - | ○ | - | - | - | ○ | ○ | - | - | - | ○ | - | - | - |

○ : Contact

SEMICONDUCTOR DEVICE WITH A PLURALITY OF SURROUNDING GATE TRANSISTORS

CROSS REFERENCES TO RELATED APPLICATIONS

This application is a continuation of U.S. patent application Ser. No. 14/886,637, filed Oct. 19, 2015, which is a continuation of international patent application PCT/JP2013/078725, filed Oct. 23, 2013, the entire contents of which are incorporated herein by reference.

BACKGROUND

Field of the Invention

The present invention relates to a semiconductor device.

Description of the Related Art

The scale of semiconductor integrated circuits is becoming larger. For leading-edge microprocessor units (MPUs), semiconductor chips including more than one billion transistors are being developed. In transistors formed by using a planar process based on the related art, namely, in planar transistors, an n-well region that constitutes a p-channel metal-oxide semiconductor (PMOS) and a p-type silicon substrate (or a p-well region) that constitutes an n-channel metal-oxide semiconductor (NMOS) need to be completely isolated from each other, as described in Hirokazu Yoshizawa, CMOS OP AMP KAIRO JITSUMU SEKKEI NO KISO (CMOS OP Amplifier Circuit, Basics of Practical Design), CQ Publishing Co., Ltd., p. 23. Furthermore, the n-well region and the p-type silicon substrate respectively need body terminals for applying potentials. Accordingly, the planar transistors further need a larger area.

As a solution to address the above-described issue, surrounding gate transistors (SGTs) having a structure, in which the source, the gate, and the drain are arranged in a direction perpendicular to a substrate and the gate surrounds the island-shaped semiconductor layers, has been proposed, and a method for manufacturing SGTs, a CMOS inverter using SGTs, a NAND circuit using SGTs, and a static random access memory (SRAM) cell using SGTs have been disclosed (see Japanese Patent No. 5130596, Japanese Patent No. 5031809, Japanese Patent No. 4756221, and International Publication WO2009/096465, for example).

FIG. 19 is a circuit diagram of a static memory cell (hereinafter referred to as an SRAM cell) using SGTs, and FIG. 20A, FIG. 20B, FIG. 20C, FIG. 20D, and FIG. 21 are layout charts of the SRAM cell or SRAM cells.

The details of the SRAM cell are described in International Publication WO2009/096465, and therefore, a brief description is given below.

FIG. 19 is a circuit diagram of an SRAM cell where Qp1 and Qp2 denote p-channel MOS transistors (hereinafter referred to as PMOS transistors), Qn1, Qn2, Qn3, and Qn4 denote n-channel MOS transistors (hereinafter referred to as NMOS transistors), BL denotes a bit line, BLB denotes an inversion bit line, WL denotes a word line (row line), Vcc denotes a supply voltage, and Vss denotes a reference voltage.

FIG. 20A is a plan view of a layout in which the SRAM cell illustrated in FIG. 19 is formed by using SGTs, for example. FIG. 208 is a cross-sectional view taken along cut line A-A' in FIG. 20A. FIG. 20C is a cross-sectional view taken along cut line B-B' in FIG. 20A. FIG. 200 is a cross-sectional view taken along cut line C-C' in FIG. 20A.

In FIG. 20A, the NMOS transistor Qn2, the PMOS transistor Qp2, and the NMOS transistor Qn4 of the SRAM cell illustrated in FIG. 19 are arranged in the first row (the upper row in FIG. 20A) in order from the left, and the NMOS transistor Qn3, the PMOS transistor Qp1, and the NMOS transistor Qn1 of the SRAM cell illustrated in FIG. 19 are arranged in the second row (the lower row in FIG. 20A) in order from the left.

On an insulating film, such as a buried oxide (BOX) film layer 1, formed on a substrate, planer silicon layers (hereinafter also referred to as lower diffusion layers) 2*pa*, 2*pb*, 2*na*, 2*nb*, 2*nc*, and 2*nd* are formed. The planer silicon layers 2*pa* and 2*pb* are respectively formed as p+ diffusion layers, and the planer silicon layers 2*na*, 2*nb*, 2*nc*, and 2*nd* are respectively formed as n+ diffusion layers, through impurity implantation or the like. Reference numeral 3 denotes a silicide layer formed on the surfaces of the planar silicon layers 2*pa*, 2*pb*, 2*na*, 2*nb*, 2*nc*, and 2*nd*. The silicide layer 3 connects the planer silicon layers 2*nc*, 2*pb*, and 2*nd* to one another, and connects the planer silicon layers 2*nb*, 2*pa*, and 2*na* to one another.

Reference numerals 4*n*1 and 4*n*2 denote n-type silicon pillars. Reference numerals 4*p*1, 4*p*2, 4*p*3, and 4*p*4 denote p-type silicon pillars. Reference numeral 5 denotes a gate insulating film that surrounds the silicon pillars 4*n*1, 4*n*2, 4*p*1, 4*p*2, 4*p*3, and 4*p*4. Reference numeral 6 denotes a gate electrode. Reference numerals 6*a*, 6*b*, 6*c*, and 6*d* denote gate lines. On the top portions of the silicon pillars 4*n*1 and 4*n*2, p+ diffusion layers (hereinafter also referred to as upper diffusion layers) 7*p*1 and 7*p*2 are respectively formed through impurity implantation or the like. On the top portions of the silicon pillars 4*p*1, 4*p*2, 4*p*3, and 4*p*4, n+ diffusion layers (hereinafter also referred to as upper diffusion layers) 7*n*1, 7*n*2, 7*n*3, and 7*n*4 are respectively formed through impurity implantation or the like. Reference numeral 8 denotes a silicon nitride film for protecting the gate insulating film 5. Reference numerals 9*p*1, 9*p*2, 9*n*1, 9*n*2, 9*n*3, and 9*n*4 denote silicide layers respectively connected to the p+ diffusion layers 7*p*1 and 7*p*2 and the n+ diffusion layers 7*n*1, 7*n*2, 7*n*3, and 7*n*4. Reference numerals 10*p*1, 10*p*2, 10*n*1, 10*n*2, 10*n*3, and 10*n*4 denote contacts that respectively connect the silicide layers 9*p*1, 9*p*2, 9*n*1, 9*n*2, 9*n*3, and 9*n*4 to first metal lines 13*c*, 13*g*, 13*a*, 13*f*, 13*e*, and 13*h*. Reference numeral 11*a* denotes a contact that connects the gate line 6*a* to a first metal line 13*b*. Reference numeral 11*b* denotes a contact that connects the gate line 6*b* to a first metal line 13*d*. Reference numeral 11*c* denotes a contact that connects the gate line 6*c* to a first metal line 13*i*. Reference numeral 11*d* denotes a contact that connects the gate line 6*d* to a first metal line 13*j*.

Reference numeral 12*a* denotes a contact that connects the silicide layer 3 connecting the lower diffusion layers 2*nb*, 2*pa*, and 2*na* to one another to the first metal line 13*d*. Reference numeral 12*b* denotes a contact that connects the silicide layer 3 connecting the lower diffusion layers 2*nd*, 2*pb*, and 2*nc* to one another to the first metal line 13*b*.

The silicon pillar 4*n*1, the lower diffusion layer 2*pa*, the upper diffusion layer 7*p*1, the gate insulating film 5, and the gate electrode 6 constitute the PMOS transistor Qp1. The silicon pillar 4*n*2, the lower diffusion layer 2*pb*, the upper diffusion layer 7*p*2, the gate insulating film 5, and the gate electrode 6 constitute the PMOS transistor Qp2. The silicon pillar 4*p*1, the lower diffusion layer 2*na*, the upper diffusion layer 7*n*1, the gate insulating film 5, and the gate electrode 6 constitute the NMOS transistor Qn1. The silicon pillar 4*p*2, the lower diffusion layer 2*nc*, the upper diffusion layer 7*n*2, the gate insulating film 5, and the gate electrode 6 constitute the NMOS transistor Qn2. The silicon pillar 4*p*3, the lower diffusion layer 2*nb*, the upper diffusion layer 7*n*3, the gate insulating film 5, and the gate electrode 6 constitute the NMOS transistor Qn3. The silicon pillar 4*p*4, the lower diffusion layer 2*nd*, the upper diffusion layer 7*n*4, the gate insulating film 5, and the gate electrode 6 constitute the NMOS transistor Qn4.

To the gate electrodes 6 of the PMOS transistor Qp1 and the NMOS transistor Qn1, the gate line 6*a* is connected. To the gate electrodes 6 of the PMOS transistor Qp2 and the NMOS transistor Qn2, the gate line 6*b* is connected. To the gate electrode 6 of the NMOS transistor Qn3, the gate line 6*c* is connected. To the gate electrode 6 of the NMOS transistor Qn4, the gate line 6*d* is connected.

The lower diffusion layers 2*pa*, 2*na*, and 2*nb* serve as a common drain of the PMOS transistor Qp1 and the NMOS transistors Qn1 and Qn3 via the silicide layer 3, and are connected to the first metal line 13*d* via the contact 12*a*. The first metal line 13*d* is connected to the gate line 6*b* via the contact 11*b*. Similarly, the lower diffusion layers 2*pb*, 2*nc*, and 2*nd* serve as a common drain of the PMOS transistor Qp2 and the NMOS transistors Qn2 and Qn4 via the silicide layer 3, and are connected to the first metal line 13*b* via the contact 12*b*. The first metal line 13*b* is connected to the gate line 6*a* via the contact 11*a*.

The upper diffusion layers 7*p*1 and 7*p*2 that respectively serve as the sources of the PMOS transistors Qp1 and Qp2 are respectively connected to the first metal lines 13*c* and 13*g* via the silicide layers 9*p*1 and 9*p*2 and via the contacts 10*p*1 and 10*p*2. The first metal lines 13*c* and 13*g* are connected to a second metal line 15*a* via contacts 14*p*1 and 14*p*2 respectively. To the second metal line 15*a*, the supply voltage Vcc is supplied.

The upper diffusion layers 7*n*1 and 7*n*2 that respectively serve as the sources of the NMOS transistors Qn1 and Qn2 are respectively connected to the first metal lines 13*a* and 13*f* via the silicide layers 9*n*1 and 9*n*2 and via the contacts 10*n*1 and 10*n*2. To the first metal lines 13*a* and 13*f*, the reference voltage Vss is supplied.

The upper diffusion layer 7*n*3 that serves as the source of the NMOS transistor Qn3 is connected to the first metal line 13*e* via the silicide layer 9*n*3 and via the contact 10*n*3. The first metal line 13*e* is connected to a second metal line 15*b* via a contact 14*n*3. The second metal line 15*b* serves as the bit line BL. The upper diffusion layer 7*n*4 that serves as the source of the NMOS transistor Qn4 is connected to the first metal line 13*h* via the silicide layer 9*n*4 and via the contact 10*n*4. The first metal line 13*h* is connected to a second metal line 15*c* via a contact 14*n*4. The second metal line 15*c* serves as the inversion bit line BLB. The gate electrodes 6 of the NMOS transistors Qn3 and Qn4 are respectively connected to the gate lines 6*c* and 6*d*. The gate line 6*d* is connected to a third metal line 17 via the contact 11*d*, the first metal line 13*j*, a contact 14*b*, a second metal line 15*e*, and a contact 16*b*, as illustrated in FIG. 200. The third metal line 17 serves as the word line (row selection signal) WL. Similarly, the gate line 6*c* is connected to the third metal line 17 via the contact 11*c*, the first metal line 13*i*, a contact 14*a*, a second metal line 15*d*, and a contact 16*a*.

Consequently, the SRAM cell illustrated in FIG. 19, which includes the PMOS transistors Qp1 and Qp2 and the NMOS transistors Qn1, Qn2, Qn3, and Qn4 arranged in two rows and three columns as illustrated in FIG. 20A and which has minimum dimensions, can be provided.

Note that a block surrounded by a thin line in FIG. 20A represents the unit of the SRAM cell, and the dimension in the longitudinal direction is denoted by Ly1.

FIG. 21 illustrates an SRAM cell array that includes SRAM cells arranged in a matrix. For convenience sake, four SRAM cells of M(0, 0), M(1, 0), M(0, 1) and M(1, 1) are arranged. As is apparent from FIG. 21, an SRAM cell having a two-row three-column arrangement is assumed to be a minimum unit, and the SRAM cells can be arranged without space therebetween to thereby provide an SRAM cell array with a minimum area.

In an SRAM using SGTs, PMOS transistors and NMOS transistors are completely isolated from each other in the structure, and therefore, well isolation is not needed unlike planar transistors. Further, silicon pillars are floating bodies, and therefore, body terminals for supplying potentials to the wells are not needed unlike planar transistors. Accordingly, the SRAM using SGTs is characterized by a very compact layout (arrangement).

As described above, the most notable feature of SGTs is that a lower layer line that is constituted by a silicide layer located at the lower portion of the silicon pillar closer to the substrate, and an upper layer line that is located at the upper portion of the silicon pillar and is connected to a contact can be used because of the structure of the SGTs.

SUMMARY

An object of the present invention is to provide a low-cost semiconductor device having a minimum area by implementing a row selection decoder having an m-row n-column arrangement that is aligned with an SRAM cell having a two-row arrangement so as to attain a compact arrangement, by taking advantage of the feature of SGTs described above.

(1) In order to attain the above-described object, a semiconductor device according to an aspect of the present invention is a semiconductor device that constitutes a decoder circuit including a plurality of transistors arranged on a substrate in m rows and n columns, each of the plurality of transistors being formed by arranging a source, a drain, and a gate in layers in a direction perpendicular to the substrate. Each of the plurality of transistors includes a silicon pillar, an insulator that surrounds a side surface of the silicon pillar, a gate that surrounds the insulator, a source region that is arranged on the top or on the bottom of the silicon pillar, and a drain region that is arranged on the top or on the bottom of the silicon pillar, the drain region being arranged on a side of the silicon pillar opposite to the source region. The decoder circuit includes at least n P-channel MOS transistors and n N-channel MOS transistors. In the n P-channel MOS transistors and the n N-channel MOS transistors, a k-th P-channel MOS transistor, where k=1 to n, and a k-th N-channel MOS transistor constitute a pair, and the gate of the k-th P-channel MOS transistor and the gate of the k-th N-channel MOS transistor are connected to each other. The drain regions of the n P-channel MOS transistors and the drain region of a first N-channel MOS transistor are arranged on a side of the silicon pillars closer to the substrate, and the drain regions of the n P-channel MOS transistors and the drain region of the first N-channel MOS transistor are connected to one another via a silicide region. The source region of an s-th N-channel MOS transistor, where s=1 to n−1, and the drain region of an s+1-th N-channel MOS transistor are connected to each other. The source regions of the n P-channel MOS transistors are each connected to a supply voltage line, and the source region of an n-th N-channel MOS transistor is connected to a reference voltage line. The gates of n pairs of MOS transistors, the gates of each pair of MOS transistors being connected to each other, are connected to input signal lines. The supply voltage line, the reference voltage line, and the input signal lines extend in an identical direction.

(2) According to a preferable embodiment of the present invention, in the semiconductor device, the n P-channel MOS transistors are arranged in one row and n columns; the n N-channel MOS transistors are arranged in one row and n columns; and the supply voltage line, the reference voltage line, and the input signal lines extend in a direction perpendicular to a row direction.

(3) According to another embodiment, in the semiconductor device, the source regions of the n P-channel MOS transistors are connected to a first metal line; the source region of an N-channel MOS transistor in an n-th column is connected to another first metal line; the supply voltage line and the reference voltage line that extend perpendicular to the row are constituted by second metal lines; and the source regions of the n P-channel MOS transistors are connected to one of the second metal lines via the first metal line, and the source region of the N-channel MOS transistor in the n-th column is connected to the other of the second metal lines via the other first metal line.

(4) According to another embodiment, in the semiconductor device, the input signal lines that extend perpendicular to the row are constituted by second metal lines; and the gates of the n pairs of MOS transistors, the gates of each pair of MOS transistors being connected to each other, are connected to the second metal lines via first metal lines that extend in the row direction.

(5) According to another embodiment, in the semiconductor device, the decoder circuit further includes a first inverter having a two-row n-column arrangement; the drain regions of the n P-channel MOS transistors and the drain region of an N-channel MOS transistor in a first column, the drain regions of the n P-channel MOS transistors and the drain region of the N-channel MOS transistor in the first column being connected in common to one another, are connected to input of the first inverter; and output of the first inverter serves as output of the decoder circuit.

(6) According to another embodiment, in the semiconductor device, the n P-channel MOS transistors are arranged in n rows and one column; the n N-channel MOS transistors are arranged in n rows and one column; and the supply voltage line, the reference voltage line, and the input signal lines extend in a direction perpendicular to a row direction.

(7) According to another embodiment, in the semiconductor device, the source regions of the n P-channel MOS transistors are connected to a first metal line; the source region of an N-channel MOS transistor in an n-th row is connected to another first metal line; the supply voltage line and the reference voltage line that extend perpendicular to the rows are constituted by second metal lines; and the source regions of the n P-channel MOS transistors are connected to one of the second metal lines via the first metal line, and the source region of the N-channel MOS transistor in the n-th row is connected to the other of the second metal lines via the other first metal line.

(8) According to another embodiment, in the semiconductor device, the input signal lines that extend perpendicular to the rows are constituted by second metal lines; and the gates of the n pairs of MOS transistors, the gates of each pair of MOS transistors being connected to each other, are connected to the second metal lines via first metal lines that extend in a direction parallel to the rows.

(9) According to another embodiment, in the semiconductor device, the decoder circuit further includes a first inverter having a one-row n-column arrangement; the drain regions of the n P-channel MOS transistors and the drain region of an N-channel MOS transistor in a first row, the drain regions of the n P-channel MOS transistors and the drain region of the N-channel MOS transistor in the first row being connected in common to one another, are connected to input of the first inverter; and output of the first inverter serves as output of the decoder circuit.

(10) A semiconductor device according to an aspect of the present invention is a semiconductor device that constitutes a decoder circuit including a plurality of transistors arranged on a substrate in m rows and n columns, each of the plurality of transistors being formed by arranging a source, a drain, and a gate in layers in a direction perpendicular to the substrate. Each of the plurality of transistors includes a silicon pillar, an insulator that surrounds a side surface of the silicon pillar, a gate that surrounds the insulator, a source region that is arranged on the top or on the bottom of the silicon pillar, and a drain region that is arranged on the top or on the bottom of the silicon pillar, the drain region being arranged on a side of the silicon pillar opposite to the source region. The decoder circuit includes at least n P-channel MOS transistors and n N-channel MOS transistors. In the n P-channel MOS transistors and the n N-channel MOS transistors, a k-th P-channel MOS transistor, where k=1 to n, and a k-th N-channel MOS transistor constitute a pair, and the gate of the k-th P-channel MOS transistor and the gate of the k-th N-channel MOS transistor are connected to each other. The source regions of the n P-channel MOS transistors and the source region of a first N-channel MOS transistor are arranged on a side of the silicon pillars closer to the substrate, and the drain regions of the n P-channel MOS transistors and the drain region of the first N-channel MOS transistor are connected to one another via contacts. The source region of an s-th N-channel MOS transistor, where s=1 to n−1, and the drain region of an s+1-th N-channel MOS transistor are connected to each other. The source regions of the n P-channel MOS transistors are each connected to a supply voltage line, and the source region of an n-th N-channel MOS transistor is connected to a reference voltage line. The gates of n pairs of MOS transistors, the gates of each pair of MOS transistors being connected to each other, are connected to input signal lines. The supply voltage line, the reference voltage line, and the input signal lines extend in an identical direction.

(11) According to a preferable embodiment of the present invention, in the semiconductor device, the n P-channel MOS transistors are arranged in one row and n columns; the n N-channel MOS transistors are arranged in one row and n columns; and the supply voltage line, the reference voltage line, and the input signal lines extend in a direction perpendicular to a row direction.

(12) According to another embodiment, in the semiconductor device, the source regions of the n P-channel MOS transistors are connected to a first metal line that extends in a direction parallel to the row; the source region of an N-channel MOS transistor in an n-th column is connected to another first metal line; the supply voltage line and the reference voltage line that extend perpendicular to the row are constituted by second metal lines; and the source regions of the n P-channel MOS transistors are connected to one of the second metal lines via the first metal line, and the source region of the N-channel MOS transistor in the n-th column is connected to the other of the second metal lines via the other first metal line.

(13) According to another embodiment, in the semiconductor device, the input signal lines that extend perpendicular to the row are constituted by second metal lines; and the gates of the n pairs of MOS transistors, the gates of each pair of MOS transistors being connected to each other, are connected to the second metal lines via first metal lines that extend in the row direction.

(14) According to another embodiment, in the semiconductor device, a plurality of the decoder circuits are arranged in a column direction; the source regions of P-channel MOS transistors adjacent to each other in each of the decoder circuits are connected in common via a silicide region; and the source regions of N-channel MOS transistors adjacent to each other in each of the decoder circuits are connected in common via a silicide region.

(15) According to another embodiment, in the semiconductor device, the decoder circuit further includes a first inverter having a two-row n-column arrangement; the drain regions of the n P-channel MOS transistors and the drain region of an N-channel MOS transistor in a first column, the drain regions of the n P-channel MOS transistors and the drain region of the N-channel MOS transistor in the first column being connected in common to one another via contacts, are connected to input of the first inverter; and output of the first inverter serves as output of the decoder circuit.

(16) According to another embodiment, in the semiconductor device, the first inverter includes at least an n+1-th P-channel MOS transistor and an n+1-th N-channel MOS transistor; the source regions of the n P-channel MOS transistors and the source region of the n+1-th P-channel MOS transistor are connected in common via a silicide region, and are connected to a first metal line; the source region of the N-channel MOS transistor in the n-th column and the source region of the n+1-th N-channel MOS transistor are connected in common via a silicide region, and are connected to another first metal line; the supply voltage line and the reference voltage line that extend perpendicular to the row are constituted by second metal lines; and the source regions of the n P-channel MOS transistors are connected to one of the second metal lines via the first metal line, and the source region of the N-channel MOS transistor in the n-th column is connected to the other of the second metal lines via the other first metal line.

(17) According to another embodiment, in the semiconductor device, the n P-channel MOS transistors are arranged in n rows and one column; the n N-channel MOS transistors are arranged in n rows and one column; and the supply voltage line, the reference voltage line, and the input signal lines extend in a direction perpendicular to a row direction.

(18) According to another embodiment, in the semiconductor device, the source regions of the n P-channel MOS transistors are connected to a first metal line; the source region of an N-channel MOS transistor in an n-th row is connected to another first metal line; the supply voltage line and the reference voltage line that extend perpendicular to the rows are constituted by second metal lines; and the source regions of the n P-channel MOS transistors are connected to one of the second metal lines via the first metal line, and the source region of the N-channel MOS transistor in the n-th row is connected to the other of the second metal lines via the other first metal line.

(19) According to another embodiment, in the semiconductor device, the input signal lines that extend perpendicular to the row direction are constituted by second metal lines; and the gates of the n pairs of MOS transistors, the gates of each pair of MOS transistors being connected to each other, are connected to the second metal lines via first metal lines that extend in a direction along the rows.

(20) According to another embodiment, in the semiconductor device, the decoder circuit further includes a first inverter having a one-row and two-column arrangement; the drain regions of the n P-channel MOS transistors and the drain region of an N-channel MOS transistor in a first row, the drain regions of the n P-channel MOS transistors and the drain region of the N-channel MOS transistor in the first row being connected in common to one another via contacts, are connected to input of the first inverter; and output of the first inverter serves as output of the decoder circuit.

(21) According to another embodiment, in the semiconductor device, the first inverter includes at least an n+1-th P-channel MOS transistor and an n+1-th N-channel MOS transistor; the source regions of the n P-channel MOS transistors and the source region of the n+1-th P-channel MOS transistor are connected in common via a silicide region, and are connected to a first metal line; the source region of the N-channel MOS transistor in the n-th row and the source region of the n+1-th N-channel MOS transistor are connected in common via a silicide region, and are connected to another first metal line; the supply voltage line and the reference voltage line that extend perpendicular to the rows are constituted by second metal lines; and the source regions of the n P-channel MOS transistors are connected to one of the second metal lines via the first metal line, and the source region of the N-channel MOS transistor in the n-th row is connected to the other of the second metal lines via the other first metal line.

(22) A semiconductor device according to an aspect of the present invention is a semiconductor device that constitutes a static memory including a plurality of transistors arranged on a substrate, each of the plurality of transistors being formed by arranging a source, a drain, and a gate in layers in a direction perpendicular to the substrate. The static memory includes a plurality of static memory cells that each include at least six MOS transistors arranged on an insulating film formed on the substrate and that are arranged in a matrix; a plurality of row address circuits that each specify one row-line of the static memory cells; and a plurality of row decoder circuits that each include a plurality of MOS transistors and that each select one row of the static memory cells in accordance with signals from the row address circuits. Each of the six MOS transistors that constitute each of the static memory cells, and each of the plurality of MOS transistors that constitute each of the row decoder circuits includes a silicon pillar, an insulator that surrounds a side surface of the silicon pillar, a gate that surrounds the insulator, a source region that is arranged on the top or on the bottom of the silicon pillar, and a drain region that is arranged on the top or on the bottom of the silicon pillar, the drain region being arranged on a side of the silicon pillar opposite to the source region. The six MOS transistors included in each of the static memory cells are arranged in two rows and three columns. Each of the row decoder circuits includes at least n P-channel MOS transistors arranged in one row and n columns, n N-channel MOS transistors arranged in one row and n columns, and an inverter. In the n P-channel MOS transistors and the n N-channel MOS transistors, a P-channel MOS transistor in a k-th column, where k=1 to n, arranged in one row and an N-channel MOS transistor in the k-th column arranged in one row constitute a pair, and the gate of the P-channel MOS transistor in the k-th column and the gate of the N-channel MOS transistor in the k-th column are connected to each other. The drain regions of the n P-channel MOS transistors and the drain region of an N-channel MOS transistor in a first column are arranged on a side of the silicon pillars closer to the substrate, and the drain regions of the n P-channel MOS transistors and the drain region of the N-channel MOS transistor in the first column are connected to one another via a silicide region. The source region of an N-channel MOS transistor in an s-th column, where s=1 to n−1, and the drain region of an N-channel MOS transistor in an s+1-th column are connected to each other. The source regions of the n P-channel MOS transistors are each connected to a supply voltage line that extends in a direction perpendicular to the row, and the source region of an N-channel MOS transistor in an n-th column is connected to a reference voltage line that extends in the direction perpendicular to the row. Input signal lines that are connected to the gates of n pairs of MOS transistors, the gates of each pair of MOS transistors being connected to each other, are constituted by lines that extend in the direction perpendicular to the row. The drain regions of the n P-channel MOS transistors and the drain region of the N-channel MOS transistor in the first column are connected to an input gate of the inverter, and output of the inverter is connected to a row selection line of the static memory cells.

(23) According to another embodiment, in the semiconductor device, the source regions of the n P-channel MOS transistors are connected to a first metal line; the source region of the N-channel MOS transistor in the n-th column is connected to another first metal line; the supply voltage line and the reference voltage line that extend perpendicular to the row are constituted by second metal lines; the source regions of the n P-channel MOS transistors are connected to one of the second metal lines via the first metal line, and the source region of the N-channel MOS transistor in the n-th column is connected to the other of the second metal lines via the other first metal line; the input signal lines that extend perpendicular to the row are constituted by second metal lines; and the gates of the n pairs of MOS transistors, the gates of each pair of MOS transistors being connected to each other, are connected to the second metal lines via first metal lines that extend in a direction along the row.

(24) A semiconductor device according to an aspect of the present invention is a semiconductor device that constitutes a static memory including a plurality of transistors arranged on a substrate, each of the plurality of transistors being formed by arranging a source, a drain, and a gate in layers in a direction perpendicular to the substrate. The static memory includes a plurality of static memory cells that each include at least six MOS transistors arranged on an insulating film formed on the substrate and that are arranged in a matrix; a plurality of row address circuits that each specify one row-line of the static memory cells; and a plurality of row decoder circuits that each include a plurality of MOS transistors and that each select one row of the static memory cells in accordance with signals from the row address circuits. Each of the six MOS transistors that constitute each of the static memory cells, and each of the plurality of MOS transistors that constitute each of the row decoder circuits includes a silicon pillar, an insulator that surrounds a side surface of the silicon pillar, a gate that surrounds the insulator, a source region that is arranged on the top or on the bottom of the silicon pillar, and a drain region that is arranged on the top or on the bottom of the silicon pillar, the drain region being arranged on a side of the silicon pillar opposite to the source region. The six MOS transistors included in each of the static memory cells are arranged in two rows and three columns. Each of the row decoder circuits includes at least n P-channel MOS transistors arranged in one row and n columns, n N-channel MOS transistors arranged in one row and n columns, and an inverter. In the n P-channel MOS transistors and the n N-channel MOS transistors, a P-channel MOS transistor in a k-th column, where k=1 to n, arranged in one row and an N-channel MOS transistor in the k-th column arranged in one row constitute a pair, and the gate of the P-channel MOS transistor in the k-th column and the gate of the N-channel MOS transistor in the k-th column are connected to each other. The source regions of the n P-channel MOS transistors and the source region of an N-channel MOS transistor in a first column are arranged on a side of the silicon pillars closer to the substrate, and the drain regions of the n P-channel MOS transistors and the drain region of the N-channel MOS transistor in the first column are connected to one another via contacts. The source region of an N-channel MOS transistor in an s-th column, where s=1 to n−1, and the drain region of an N-channel MOS transistor in an s+1-th column are connected to each other. The source regions of the n P-channel MOS transistors are each connected to a supply voltage line that extends in a direction perpendicular to the row, and the source region of an N-channel MOS transistor in an n-th column is connected to a reference voltage line that extends in the direction perpendicular to the row. Input signal lines that are connected to the gates of n pairs of MOS transistors, the gates of each pair of MOS transistors being connected to each other, are constituted by lines that extend in the direction perpendicular to the row. The drain regions of the n P-channel MOS transistors and the drain region of the N-channel MOS transistor in the first column are connected to an input gate of the inverter, and output of the inverter is connected to a row selection line of the static memory cells.

(25) According to another embodiment, in the semiconductor device, the source regions of the n P-channel MOS transistors are connected to a first metal line that extends in a direction parallel to the row; the source region of the N-channel MOS transistor in the n-th column is connected to another first metal line; the supply voltage line and the reference voltage line that extend perpendicular to the row are constituted by second metal lines; the source regions of the n P-channel MOS transistors are connected to one of the second metal lines via the first metal line, and the source region of the N-channel MOS transistor in the n-th column is connected to the other of the second metal lines via the other first metal line; the input signal lines that extend perpendicular to the row are constituted by second metal lines; and the gates of the n pairs of MOS transistors, the gates of each pair of MOS transistors being connected to each other, are connected to the second metal lines via first metal lines that extend in a direction along the row.

BRIEF DESCRIPTION OF THE SEVERAL VIEWS OF THE DRAWINGS

FIG. 2 is a selection operation chart of a row selection decoder according to embodiments of the present invention.

FIG. 14 is a selection operation chart of a row selection decoder according to other embodiments of the present invention.

DETAILED DESCRIPTION

First Embodiment

Figure 1:
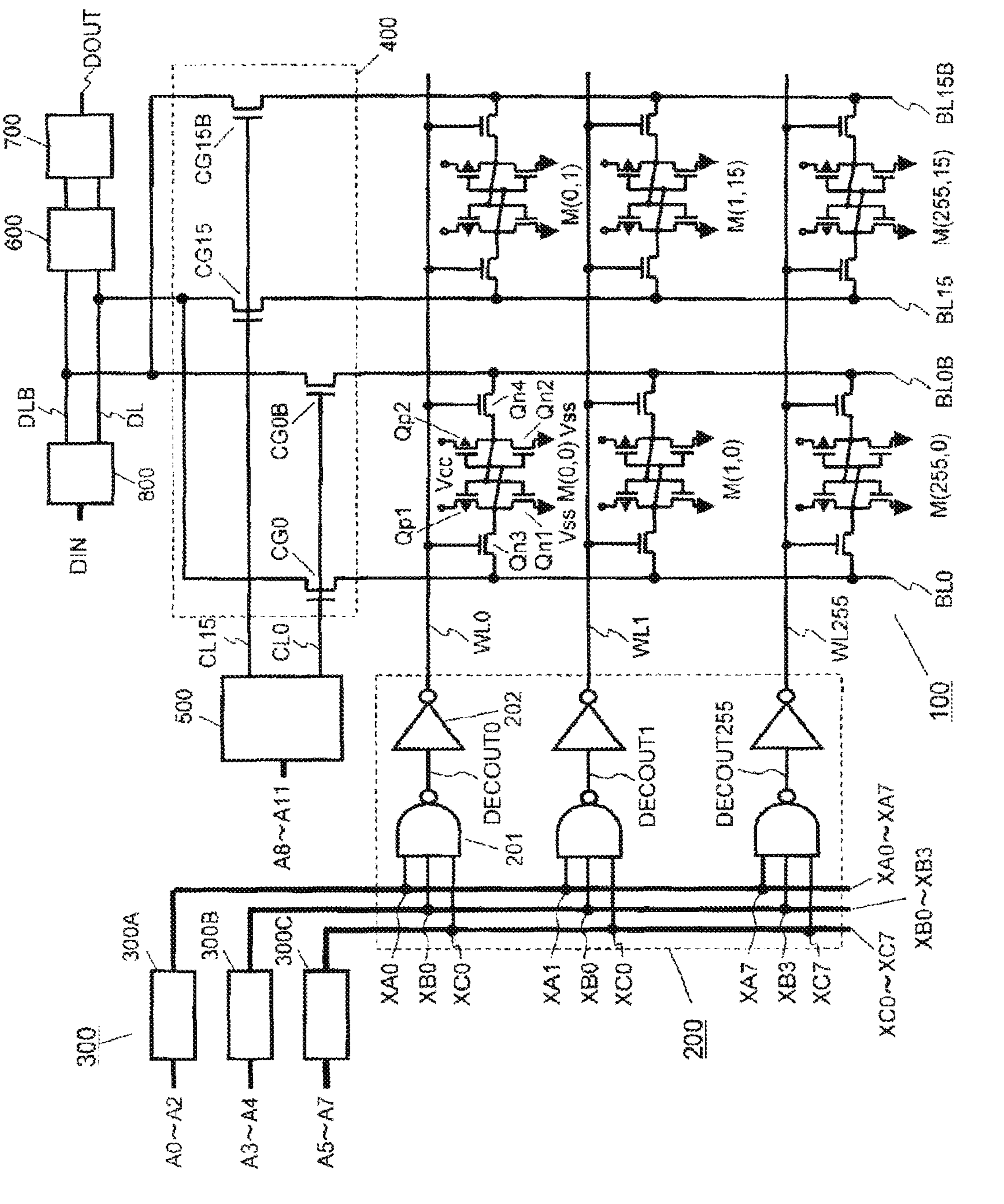
FIG. 1 is a circuit diagram of a semiconductor memory device according to embodiments of the present invention.

FIG. 1 illustrates a semiconductor memory device that includes a decoder circuit for a memory, the decoder circuit being applied to the present invention. An SRAM cell is employed as a memory cell, for example.

Figure 19:
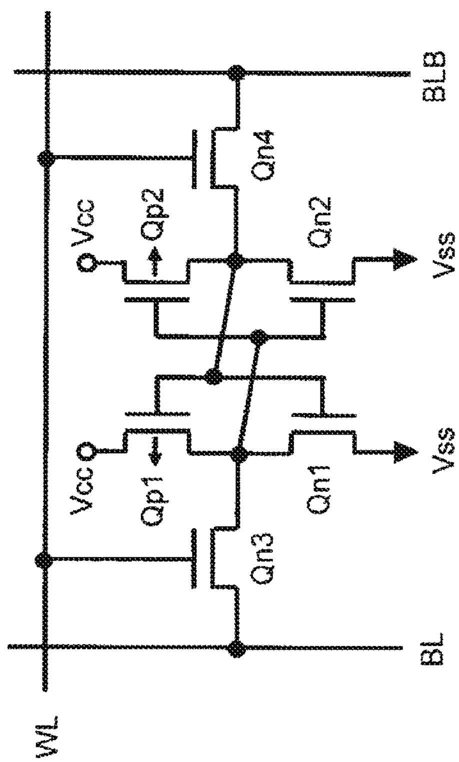
FIG. 19 is an equivalent circuit diagram illustrating an example of an SRAM cell according to the prior art.

Reference numeral 100 denotes a memory array including the SRAM cells illustrated in FIG. 19 which are arranged in a matrix. In FIG. 1, a memory array having 256 rows and 16 columns, that is, a memory array of 4096 bits is structured.

The SRAM cells are arranged in a lateral direction and are connected in common to a word line WLm (m=0 to 255) in a row direction. The SRAM cells are arranged in a longitudinal direction and are connected in common to a bit line BLn (n=0 to 15) and to an inversion bit line BLnB in a column direction.

Reference numeral 200 denotes a row selection decoder. The row selection decoder 200 is constituted by a NAND decoder 201 and an inverter 202 that receives DECOUTm (m=0 to 255) output from the NAND decoder 201 and outputs a row selection signal WLm.

The row selection decoder 200 receives any of selection address signals XA0 to XA7, XB0 to XB3, and XC0 to XC7 described below, and selects one of the row selection signals WLm (m=0 to 255) selectively in accordance with the received selection address signals.

Reference numeral 300 denotes a pre-decoder that receives address signals and outputs the selection address signals XA0 to XA7, XB0 to XB3, and XC0 to XC7.

Here, the pre-decoder 300 is constituted by a pre-decoder 300A that receives address signals A0 to A2 and outputs the selection address signals XA0 to XA7, a pre-decoder 3008 that receives address signals A3 and A4 and outputs the selection address signals XB0 to XB3, and a pre-decoder 300C that receives address signals A5 to A7 and outputs the selection address signals XC0 to XC7.

For example, the row selection decoder 200 receives the selection address signals XB0XA0, XB0, and XC0 and selects a word line WL0, receives the selection address signals XA1, XB0, and XC0 and selects a word line WL1, or receives the selection address signals XA7, XB3, and XC7 and selects a word line WL255, in a similar manner.

Reference numeral 400 denotes a column selection gate. Reference numeral 500 denotes a column selection decoder that selects the column selection gate 400. The column selection decoder 500 receives column address signals A8 to A11 and outputs column selection signals CLn (n=0 to 15). The column selection signals CLn are input to the column selection gate 400, and are connected to the gates of column selection gate transistors CGn (n=0 to 15) and to the gates of column selection gate transistors CGnB. The sources of the column selection gate transistors CGn are respectively connected to the bit lines BLn of the SRAM cells, and the sources of the column selection gate transistors CGnB are respectively connected to the inversion bit lines BLnB of the SRAM cells. The drains of the column selection gate transistors CGn are connected in common to a data line DL, and the drains of the column selection gate transistors CGnB are connected in common to an inversion data line DLB.

Reference numeral 600 denotes a sense amplifier that receives a minute read signal output to the data line DL or the inversion data line DLB from a memory cell via the bit line BLn or the inversion bit line BLBn, amplifies the minute read signal, and outputs the amplified signal. Reference numeral 700 denotes an output circuit that receives the signal from the sense amplifier 600, and generates a read signal DOUT that is externally output.

Reference numeral 800 denotes a write circuit that receives input data DIN and generates a write signal for writing the data to any of the SRAM cells.

As illustrated in FIG. 1, selection from among the SRAM cells each having an arrangement in accordance with a two-row pitch, which is a minimum unit, is made by the row selection decoder selecting any one of the row selection lines WLm (m=0 to 255) in response to receipt of address signals, and therefore, the row selection decoder also needs to be based on the minimum unit of the two-row arrangement.

FIG. 2 is a selection operation chart of the row selection decoder. When selection address signals marked with circles are input to the row selection decoder 200, output DECOUT of the NAND decoder 201 corresponding to the selection address signals is selected. For example, when the selection address signals XA2, XB1, and XC0 are input, the row selection decoder 200 selects DECOUT10. That is, as selection address signals for selection by the row selection decoder, eight selection address signals XA, four selection address signals XB, and eight selection address signals XC, that is, the total of 20 selection address signals need to be supplied to the row selection decoder 200.

Figure 3:
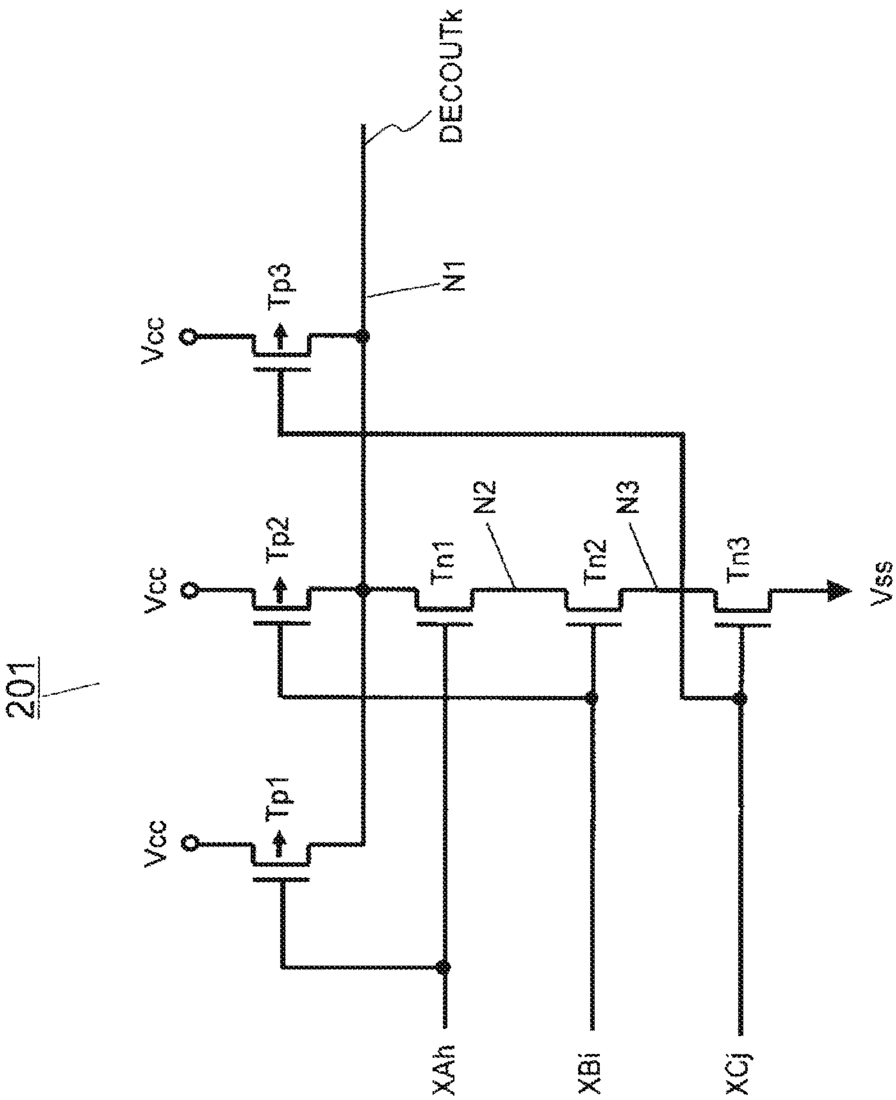
FIG. 3 is an equivalent circuit diagram of a NAND decoder according to embodiments of the present invention.

FIG. 3 illustrates the NAND decoder 201 according to embodiments of the present invention.

Reference numerals Tp1, Tp2, and Tp3 denote PMOS transistors constituted by SGTs. Reference numerals Tn1, Tn2, and Tn3 denote NMOS transistors similarly constituted by SGTs. The sources of the PMOS transistors Tp1, Tp2, and Tp3 are each connected to the supply voltage Vcc, and the drains thereof are connected in common to a node N1. The node N1 serves as output DECOUTk. The drain of the NMOS transistor Tn1 is connected to the node N1, and the source thereof is connected to the drain of the NMOS transistor Tn2 via a node N2. The source of the NMOS transistor Tn2 is connected to the drain of the NMOS transistor Tn3 via a node N3. The source of the NMOS transistor Tn3 is connected to the reference voltage Vss. To the gate of the PMOS transistor Tp1 and to the gate of the NMOS transistor Tn1, an input signal XAh (h=0 to 7) is connected. To the gate of the PMOS transistor Tp2 and to the gate of the NMOS transistor Tn2, an input signal XBi (i=0 to 3) is connected. To the gate of the PMOS transistor Tp3 and to the gate of the NMOS transistor Tn3, an input signal XCj (j=0 to 7) is connected.

Figure 4A:
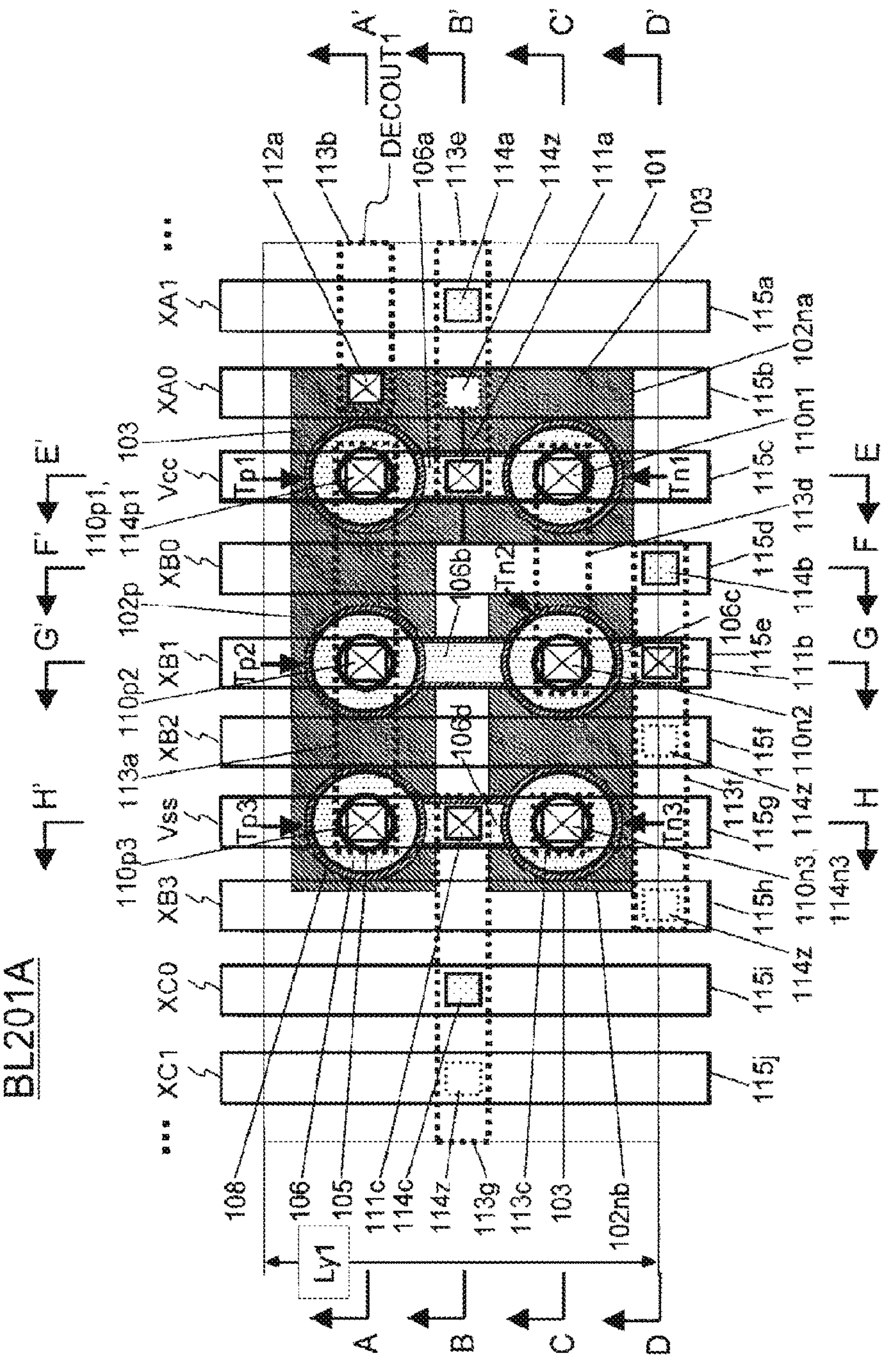
FIG. 4A is a plan view of a NAND decoder according to a first embodiment of the present invention.
Figure 4B:
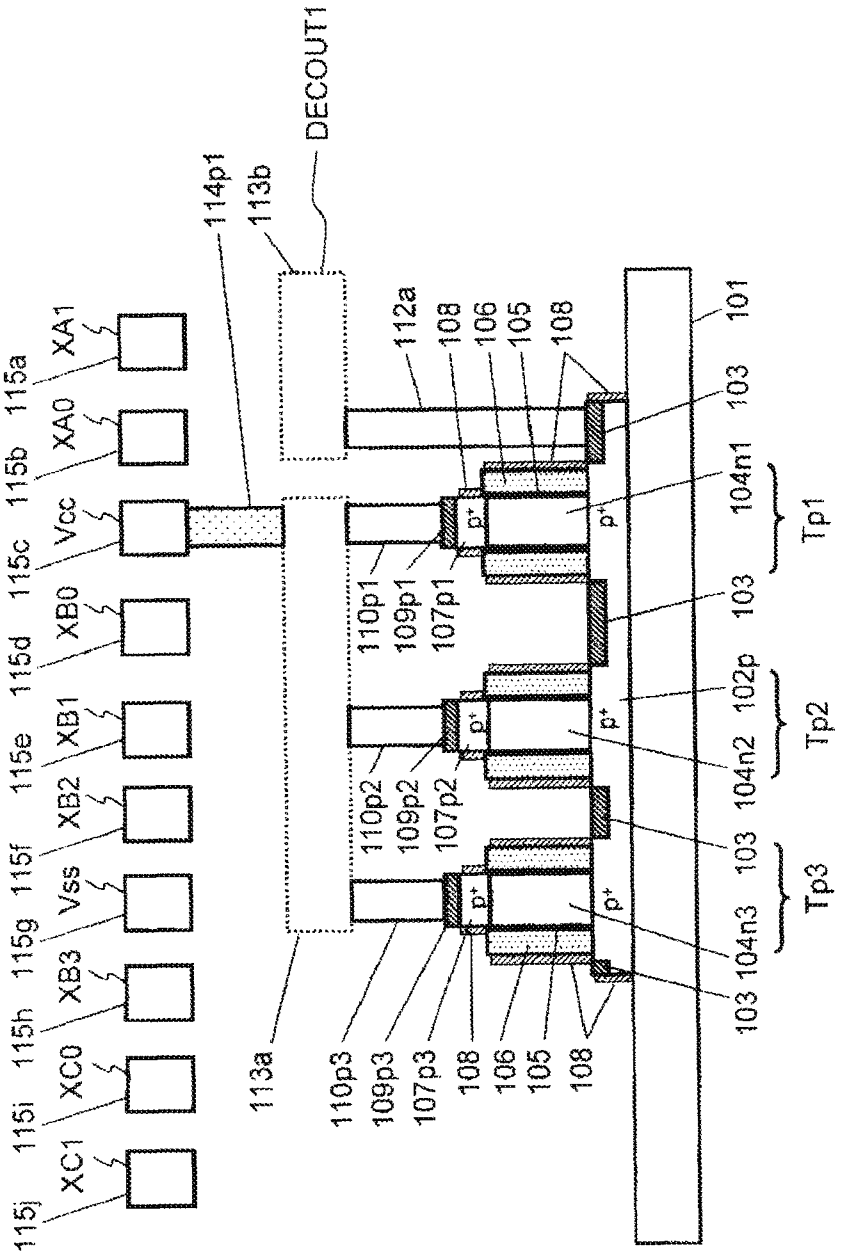
FIG. 4B is a cross-sectional view of the NAND decoder according to the first embodiment of the present invention.
Figure 4C:
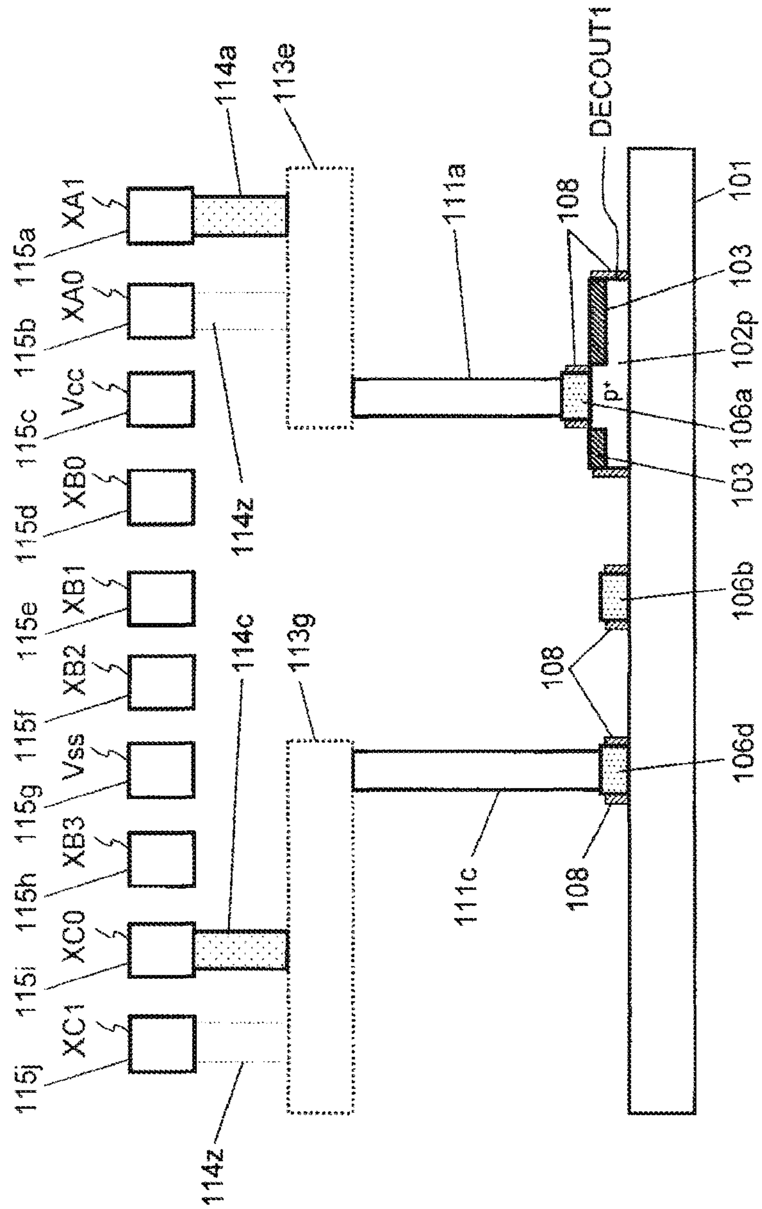
FIG. 4C is a cross-sectional view of the NAND decoder according to the first embodiment of the present invention.
Figure 4D:
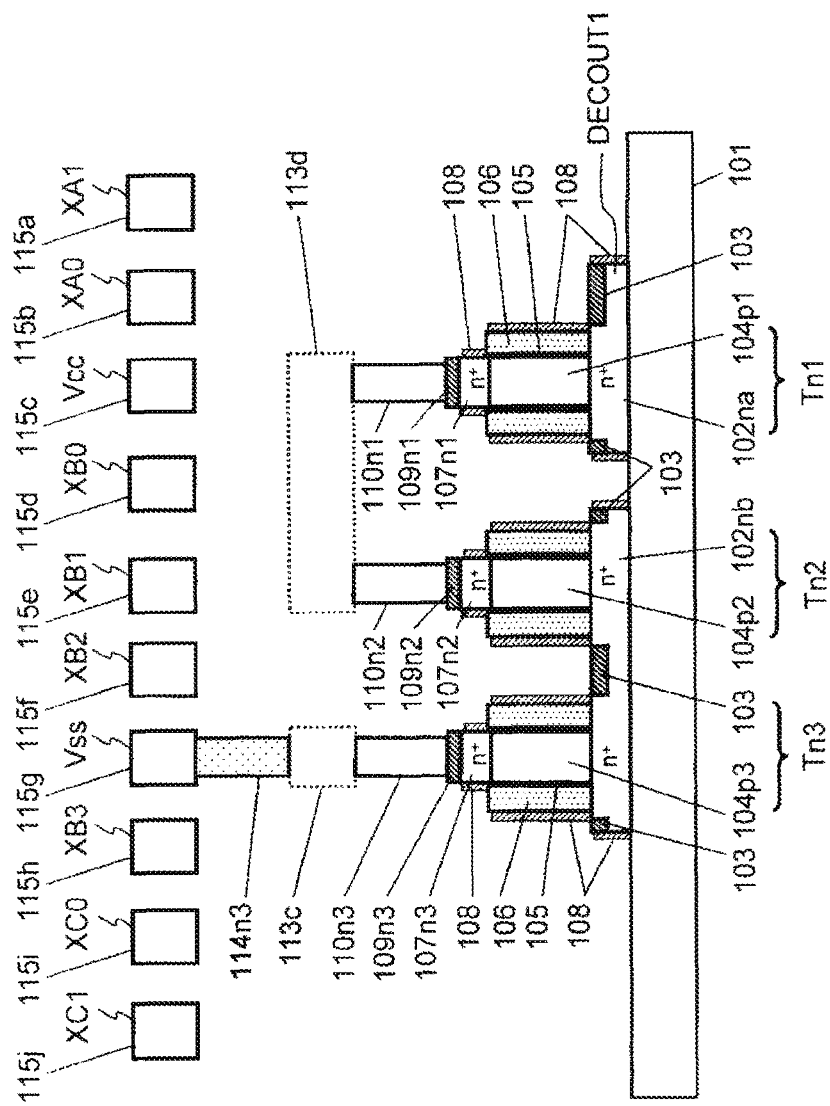
FIG. 4D is a cross-sectional view of the NAND decoder according to the first embodiment of the present invention.
Figure 4E:
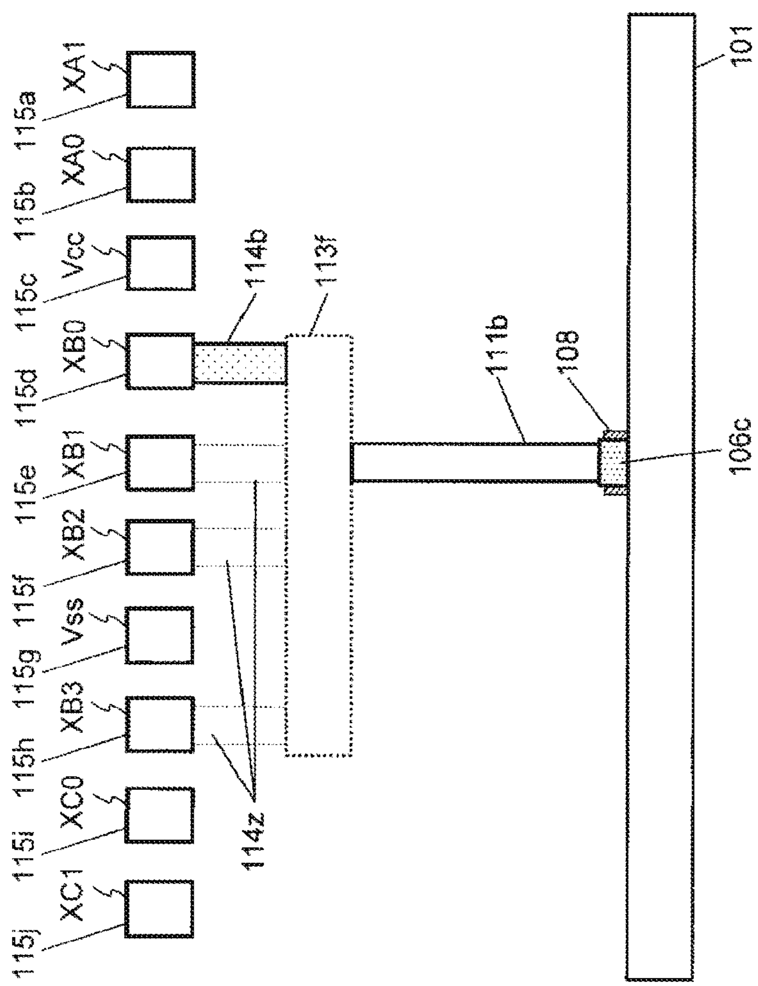
FIG. 4E is a cross-sectional view of the NAND decoder according to the first embodiment of the present invention.
Figure 4F:
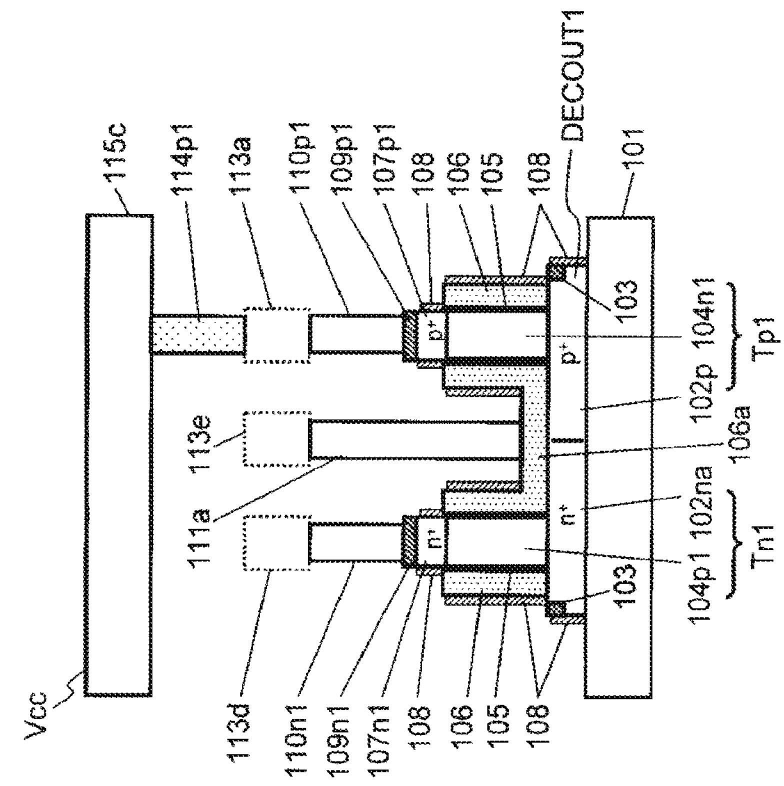
FIG. 4F is a cross-sectional view of the NAND decoder according to the first embodiment of the present invention.
Figure 4G:
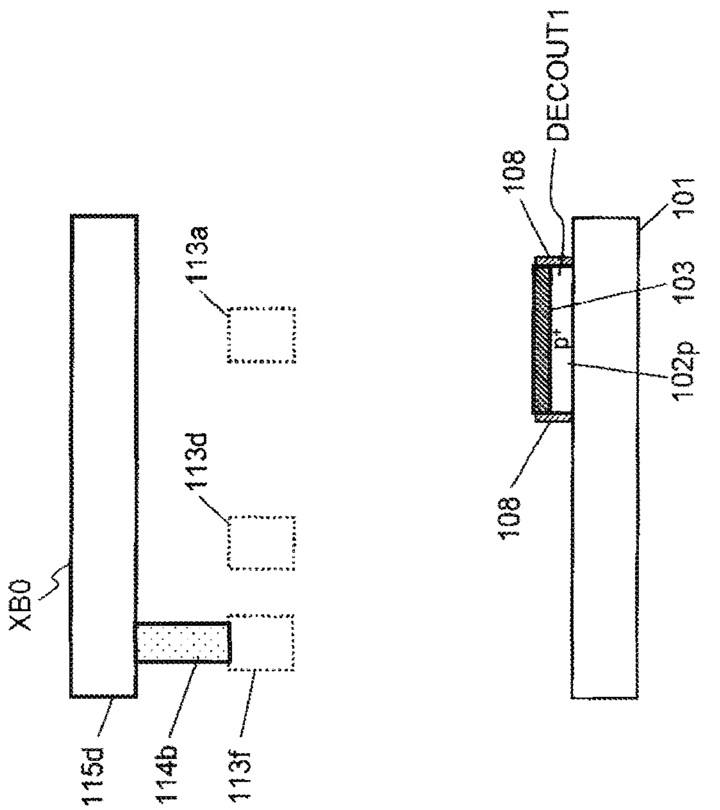
FIG. 4G is a cross-sectional view of the NAND decoder according to the first embodiment of the present invention.
Figure 4H:
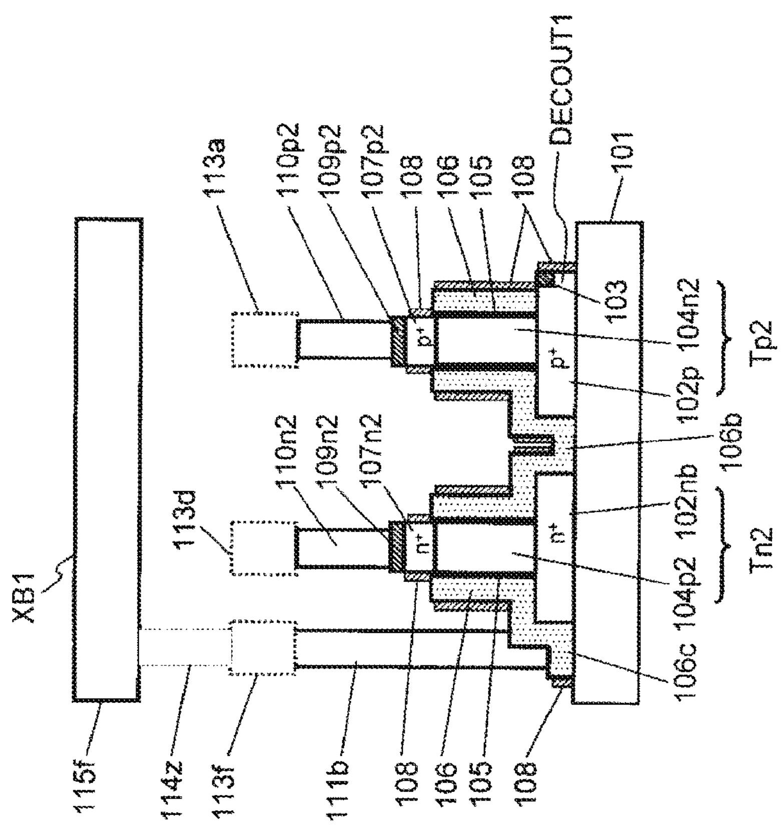
FIG. 4H is a cross-sectional view of the NAND decoder according to the first embodiment of the present invention.
Figure 4I:
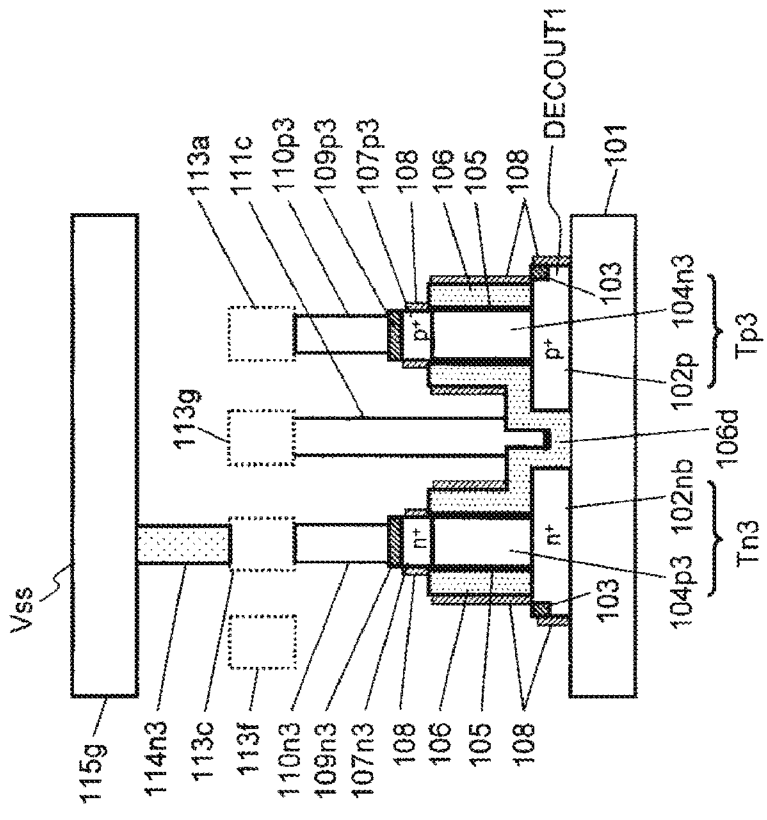
FIG. 4I is a cross-sectional view of the NAND decoder according to the first embodiment of the present invention.

FIGS. 4A, 4B, 4C, 4B, 4E, 4F, 4G, 4H, and 4I illustrate a first embodiment. FIG. 4A is a plan view of a layout (arrangement) of a NAND decoder (three-input NAND decoder) according to this embodiment. FIG. 4A is a cross-sectional view taken along cut line A-A' in FIG. 4A. FIG. 4C is a cross-sectional view taken along cut line B-B' in FIG. 4A. FIG. 4B is a cross-sectional view taken along cut line C-C' in FIG. 4A. FIG. 4E is a cross-sectional view taken along cut line 0-0' in FIG. 4A. FIG. 4F is a cross-sectional view taken along cut line E-E' in FIG. 4A. FIG. 4G is a cross-sectional view taken along cut line F-F' in FIG. 4A. FIG. 4H is a cross-sectional view taken along cut line G-G' in FIG. 4A. FIG. 4I is a cross-sectional view taken along cut line H-H' in FIG. 4A.

In FIG. 4A, the PMOS transistors Tp1, Tp2, and Tp3 of the NAND decoder illustrated in FIG. 3 are arranged in the first row (the upper row in FIG. 4A) in order from the right of FIG. 4A, and the NMOS transistors Tn1, Tn2, and Tn3 of the NAND decoder illustrated in FIG. 3 are arranged in the second row (the lower row in FIG. 4A) in order from the right of FIG. 4A.

Note that in FIGS. 4A, 48, 4C, 4D, 4E, 4F, 4G, 4H, and 4I, a portion having the same structure as the corresponding one in FIGS. 20A, 20B, 20C, and 20D is denoted by a corresponding reference numeral in the one hundreds.

On an insulating film, such as a buried oxide (BOX) film layer 101, formed on a substrate, planer silicon layers (hereinafter also referred to as lower diffusion layers) 102*p*, 102*na*, and 102*nb* are formed. The planer silicon layers 102*p*, 102*na*, and 102*nb* are respectively formed as a p+ diffusion layer, an n+ diffusion layer, and an n+ diffusion layer through impurity implantation or the like. Reference numeral 103 denotes a silicide layer formed on the surfaces of the planar silicon layers 102*p*, 102*na*, and 102*nb*, and the silicide layer 103 connects the planer silicon layers 102*p* and 102*na* to each other. Reference numerals 104*n*1, 104*n*2, and 104*n*3 denote n-type silicon pillars. Reference numerals 104*p*1, 104*p*2, and 104*p*3 denote p-type silicon pillars. Reference numeral 105 denotes a gate insulating film that surrounds the silicon pillars 104*n*1, 104*n*2, 104*n*3, 104*p*1, 104*p*2, and 104*p*3. Reference numeral 106 denotes a gate electrode. Reference numerals 106*a*, 106*b*, 106*c*, and 106*d* denote gate lines. On the top portions of the silicon pillars 104*n*1, 104*n*2, and 104*n*3, p+ diffusion layers (hereinafter also referred to as upper diffusion layers) 107*p*1, 107*p*2, and 107*p*3 are respectively formed through impurity implantation or the like. On the top portions of the silicon pillars 104*p*1, 104*p*2, and 104*p*3, n+ diffusion layers (hereinafter also referred to as upper diffusion layers) 107*n*1, 107*n*2, and 107*n*3 are respectively formed through impurity implantation or the like. Reference numeral 108 denotes a silicon nitride film for protecting the gate insulating film 105. Reference numerals 109*p*1, 109*p*2, 109*p*3, 109*n*1, 109*n*2, and 109*n*3 denote silicide layers respectively connected to the p+ diffusion layers 107*p*1, 107*p*2, and 107*p*3 and the n+ diffusion layers 107*n*1, 107*n*2, and 107*n*3. Reference numerals 110*p*1, 110*p*2, 110*p*3, 110*n*1, 110*n*2, and 110*n*3 denote contacts that respectively connect the silicide layers 109*p*1, 109*p*2, 109*p*3, 109*n*1, 109*n*2, and 109*n*3 to first metal lines 113*a*, 113*a*, 113*a*, 113*d*, 113*d*, and 113*c*. Reference numeral 111*a* denotes a contact that connects the gate line 106*a* to a first metal line 113*e*. Reference numeral 111*b* denotes a contact that connects the gate line 106*c* to a first metal line 113*f*. Reference numeral 111*c* denotes a contact that connects the gate line 106*d* to a first metal line 113*g*.

Reference numeral 112*a* denotes a contact that connects the silicide layer 103 connecting the lower diffusion layer 102*p* and the lower diffusion layer 102*na* to each other to a first metal line 113*b*.

The silicon pillar 104*n*1, the lower diffusion layer 102*p*, the upper diffusion layer 107*p*1, the gate insulating film 105, and the gate electrode 106 constitute the PMOS transistor Tp1. The silicon pillar 104*n*2, the lower diffusion layer 102*p*, the upper diffusion layer 107*p*2, the gate insulating film 105, and the gate electrode 106 constitute the PMOS transistor Tp2. The silicon pillar 104*n*3, the lower diffusion layer 102*p*, the upper diffusion layer 107*p*3, the gate insulating film 105, and the gate electrode 106 constitute the PMOS transistor Tp3. The silicon pillar 104*p*1, the lower diffusion layer 102*na*, the upper diffusion layer 107*n*1, the gate insulating film 105, and the gate electrode 106 constitute the NMOS transistor Tn1. The silicon pillar 104*p*2, the lower diffusion layer 102*nb*, the upper diffusion layer 107*n*2, the gate insulating film 105, and the gate electrode 106 constitute the NMOS transistor Tn2. The silicon pillar 104*p*3, the lower diffusion layer 102*nb*, the upper diffusion layer 107*n*3, the gate insulating film 105, and the gate electrode 106 constitute the NMOS transistor Tn3.

To the gate electrodes 106 of the PMOS transistor Tp1 and the NMOS transistor Tn1, the gate line 106*a* is connected. To the gate electrodes 106 of the PMOS transistor Tp2 and the NMOS transistor Tn2, the gate line 106*b* is connected. Further, to the gate electrode 106 of the NMOS transistor Tn2, the gate line 106*c* is connected. To the gate electrodes 106 of the PMOS transistor Tp3 and the NMOS transistor Tn3, the gate line 106*d* is connected.

The lower diffusion layers 102*p* and 102*na* serve as a common drain of the PMOS transistors Tp1, Tp2, and Tp3 and the NMOS transistor Tn1 via the silicide layer 103, and are connected to the first metal line 113*b* via the contact 112*a*. The first metal line 113*b* serves as output DECOUT1. The upper diffusion layer 107*p*1 that serves as the source of the PMOS transistor Tp1 is connected to the first metal line 113*a* via the silicide layer 109*p*1 and via the contact 110*p*1. The first metal line 113*a* is connected to a second metal line 115*c* via a contact 114*p*1. To the second metal line 115*c*, the supply voltage Vcc is supplied. Here, the second metal line 115*c* extends in a direction perpendicular to the row direction. The upper diffusion layer 107*p*2 that serves as the source of the PMOS transistor Tp2 is connected to the first metal line 113*a* that extends along the row direction, via the silicide layer 109*p*2 and via the contact 110*p*2. The upper diffusion layer 107*p*3 that serves as the source of the PMOS transistor Tp3 is connected to the first metal line 113*a* via the silicide layer 109*p*3 and via the contact 110*p*3. The upper diffusion layer 107*n*1 that serves as the source of the NMOS transistor Tn1 is connected to the first metal line 113*d* via the silicide layer 109*n*1 and via the contact 110*n*1. The upper diffusion layer 107*n*2 that serves as the drain of the NMOS transistor Tn2 is connected to the first metal line 113*d* via the silicide layer 109*n*2 and via the contact 110*n*2. Here, the source of the NMOS transistor Tn1 and the drain of the NMOS transistor Tn2 are connected to each other via the first metal line 113*d*. The source of the NMOS transistor Tn2 is connected to the drain of the NMOS transistor Tn3 via the lower diffusion layer 102*nb* and via the silicide layer 103. The source of the NMOS transistor Tn3 is connected to the first metal line 113*c* via the contact 110*n*3. The first metal line 113*c* is connected to a second metal line 115*g* via a contact 114*n*3. To the second metal line 115*g*, the reference voltage Vss is supplied. Here, the second metal line 115*g* extends in the direction perpendicular to the row direction.

The gate line 106*a* that receives any of the selection address signals XA0 to XA7 supplied through second metal lines is connected to the first metal line 113*e* via the contact 111*a*. The first metal line 113*e* extends in a direction parallel to the row (to the right of FIG. 4A). The selection address signal lines XA0 to XA7 extend in the direction perpendicular to the row direction. A contact 114*a* is arranged at one of the intersection points of the first metal line 113*e* that extends parallel to the row direction and the selection address signal lines XA0 to XA7 that extend in the direction perpendicular to the row direction, and connects a selection address signal XAh (h=0 to 7) to the gate line 106*a*. In FIG. 4A and so on, the contact 114*a* is provided at the intersection point of a second metal line 115*a* for the selection address signal XA1 and the first metal line 113*e*. That is, to the gate of the PMOS transistor Tp1 and to the gate of the NMOS transistor Tn1 of the NAND decoder of this embodiment, the selection address signal XA1 is input.

In FIG. 4A and so on, although the selection address signal lines XA2 to XA7 are not illustrated, the selection address signal lines XA2 to XA7 are arranged to the right of the selection address signal line XA1 and extend in the direction perpendicular to the row direction similarly to the selection address signal lines XA0 and XA1.

Note that at the intersection point of the selection address signal line XA0 (second metal line 115*b*) and the first metal line 113*e*, a contact 114*z* is illustrated with a dotted line in FIG. 4A and so on, which indicates that no contact is present at the intersection point. The location of the contact illustrated with a dotted line indicates the location of a possible contact that is to be provided in a case where the selection address signal XA0 (second metal line 115*b*) is to be input. Other similar locations have the same meaning.

The gate line 106*c* that receives any of the selection address signals XB0 to XB3 supplied through second metal lines is connected to the first metal line 113*f* via the contact 111*b*. The first metal line 113*f* extends in the direction parallel to the row (to the left of FIG. 4A). The selection address signal lines XB0 to XB3 extend in the direction perpendicular to the row direction. A contact 114*b* is arranged at one of the intersection points of the first metal line 113*f* and the selection address signal lines XB0 to XB3, and connects a selection address signal XBi (i=0 to 3) to the gate line 106*c*. In FIG. 4A and so on, the contact 114*b* is provided at the intersection point of a second metal line 115*d* for the selection address signal XB0 and the first metal line 113*f*. That is, to the gate of the PMOS transistor Tp2 and to the gate of the NMOS transistor Tn2 of the NAND decoder of this embodiment, the selection address signal XB0 is input.

Note that at the intersection point of the selection address signal line XB1 (second metal line 115*e*) and the first metal line 113*f*, at the intersection point of the selection address signal line XB2 (second metal line 115*f*) and the first metal line 113*f*, and at the intersection point of the selection address signal line XB3 (second metal line 115*h*) and the first metal line 113*f*, contacts 114*z* are respectively illustrated with a dotted line in FIG. 4A and so on, which indicates that no contacts are present at the respective intersection points, as described above. The location of a contact illustrated with a dotted line indicates the location of a possible contact.

The gate line 106*d* that receives any of the selection address signals XC0 to XC7 supplied through second metal lines is connected to the first metal line 113*g* via the contact 111*c*. The first metal line 113*g* extends in the direction parallel to the row (to the left of FIG. 4A). The selection address signal lines XC0 to XC7 extend in the direction perpendicular to the row direction. A contact 114*c* is arranged at one of the intersection points of the first metal line 113*g* and the selection address signal lines XC0 to XC7, and connects a selection address signal XCj (j=0 to 7) to the gate line 106*d*. In FIG. 4A and so on, the contact 114*c* is provided at the intersection point of a second metal line 115*i* for the selection address signal XC0 and the first metal line 113*g*. That is, to the gate of the PMOS transistor Tp3 and to the gate of the NMOS transistor Tn3 of the NAND decoder of this embodiment, the selection address signal XC0 is input.

Note that at the intersection point of the selection address signal line XC1 (second metal line 115*j*) and the first metal line 113*g*, a contact 114*z* is illustrated with a dotted line in FIG. 4A and so on, which indicates that no contact is present at the intersection point, as described above. The location of a contact illustrated with a dotted line indicates the location of a possible contact.

In FIG. 4A and so on, although the selection address signal lines XC2 to XC7 are not illustrated for convenience sake, the selection address signal lines XC2 to XC7 are arranged to the left of the selection address signal line XC1 and extend in the direction perpendicular to the row direction similarly to the selection address signal lines XC0 and XC1.

In FIG. 4A and so on, the selection address signals XA1, XB0XB0, and XC0 are input to the NAND decoder of this embodiment, and DECOUT1 is selected as output in accordance with FIG. 2.

Figure 20A:
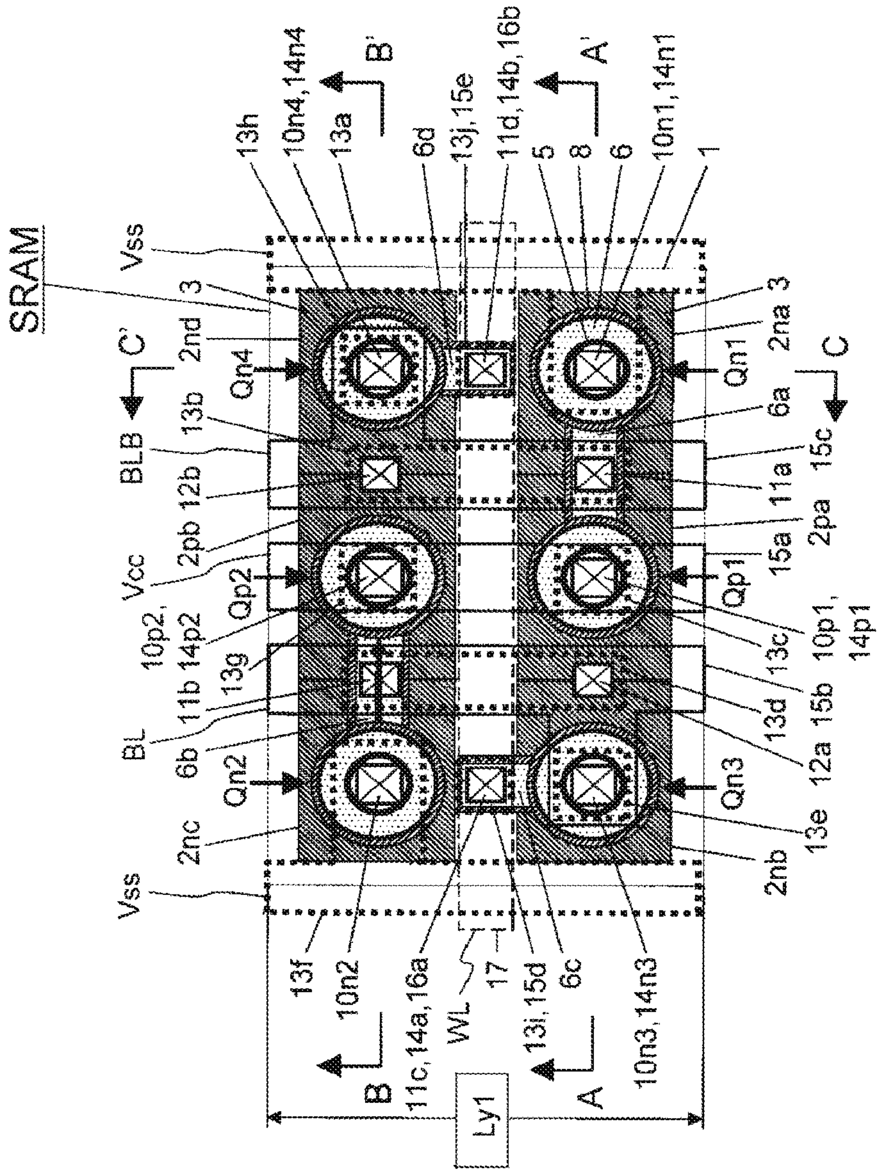
FIG. 20A is a plan view of the SRAM cell according to the prior art.
Figure 20B:
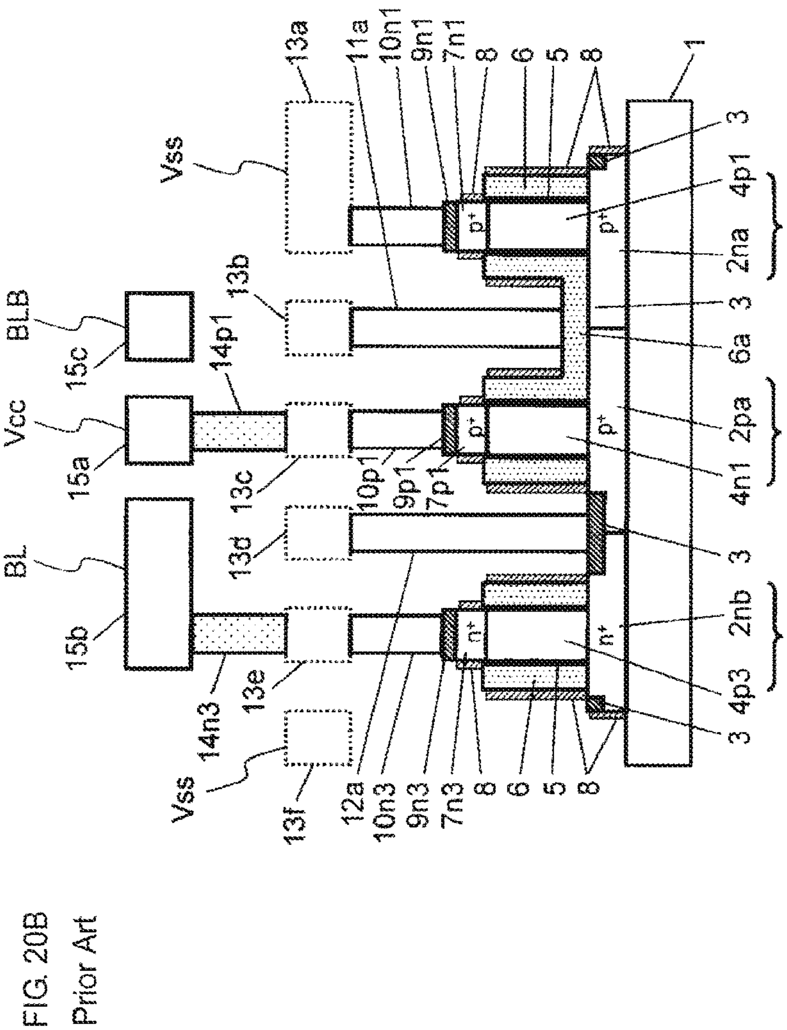
FIG. 20B is a cross-sectional view of the SRAM cell according to the prior art.
Figure 20C:
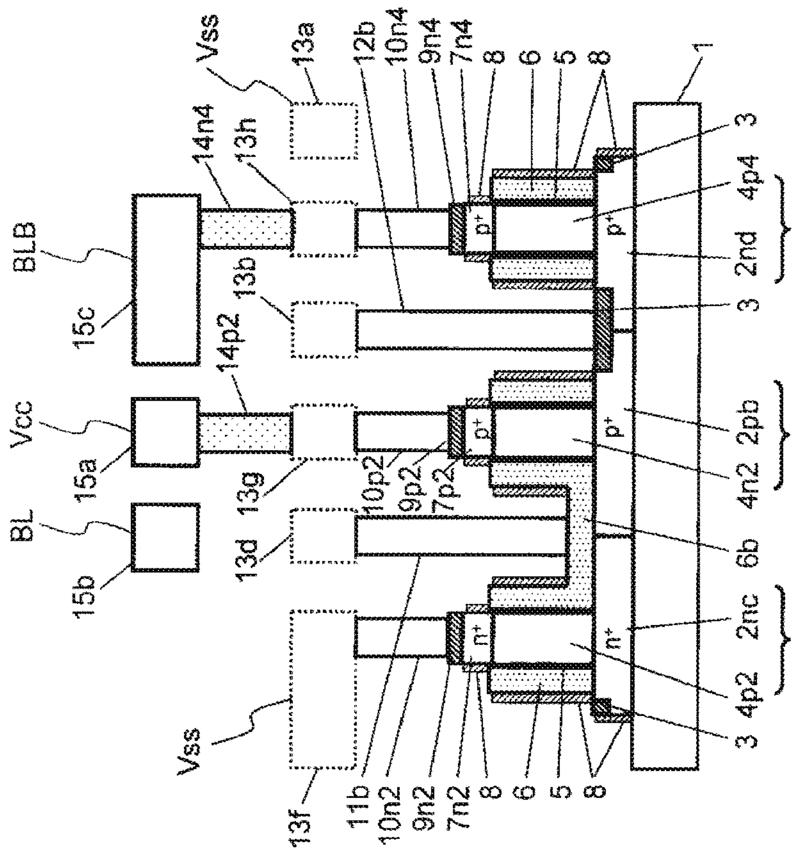
FIG. 20C is a cross-sectional view of the SRAM cell according to the prior art.
Figure 20D:
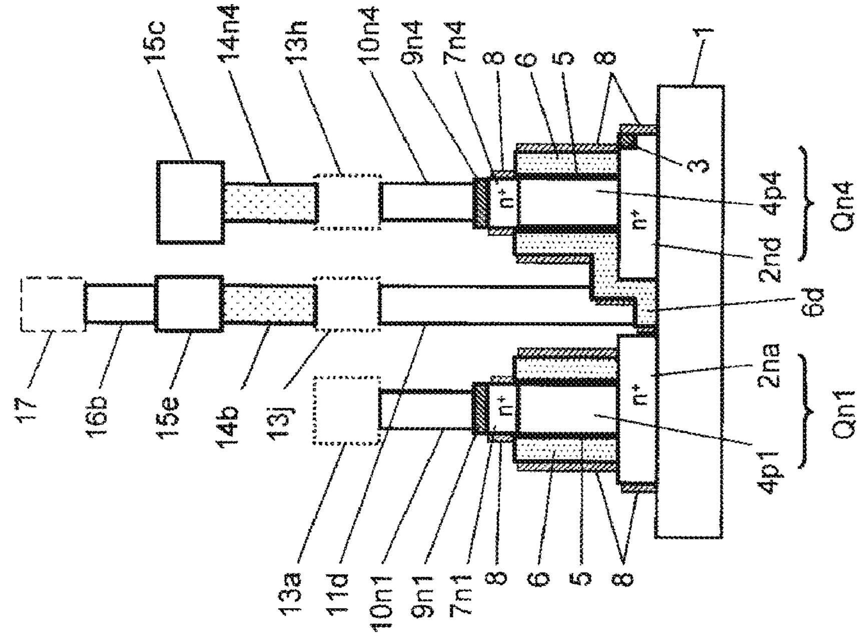
FIG. 20D is a cross-sectional view of the SRAM cell according to the prior art.
Figure 21:
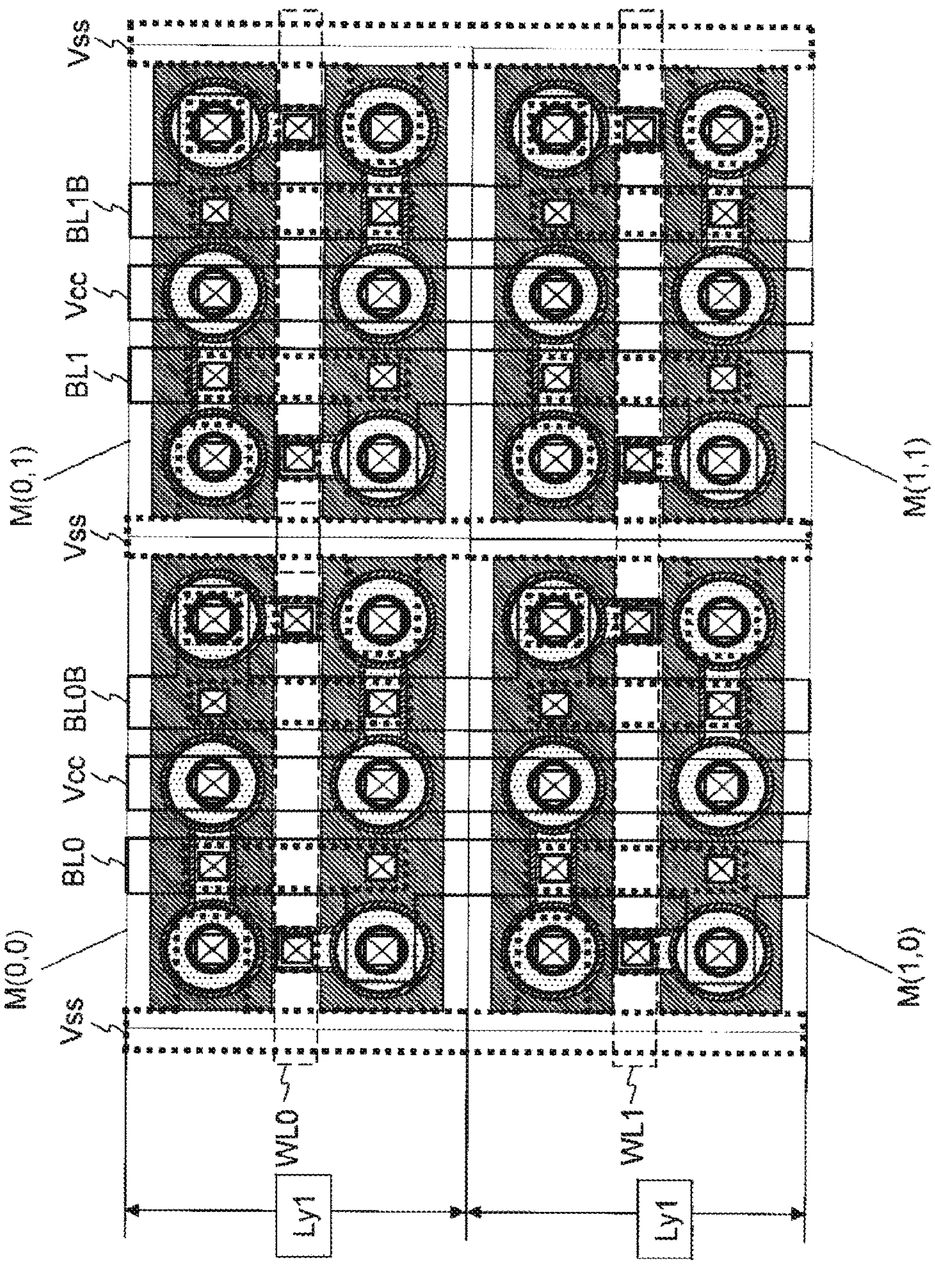
FIG. 21 illustrates a matrix array of the SRAM cells according to the prior art.

The NAND decoder of this embodiment (NAND decoder BL201A) corresponds to a region surrounded by a frame in FIG. 4A, and the dimension in the longitudinal direction is Ly1, which is the same as the SRAM cell illustrated in FIG. 20A.

According to this embodiment, the supply voltage line, reference voltage line, and selection address signal lines are implemented as the second metal lines and extend in the direction perpendicular to the row direction of the NAND decoder having a two-row three-column arrangement, and the input gates of the NAND decoder are connected to the second metal lines via the first metal lines that are arranged in parallel to the row direction to thereby enable supply of any selection address signals to the input of the NAND decoder. Consequently, a NAND decoder that allows arrangement in accordance with the minimum pitch of the second metal lines, has a smaller area, and has the same pitch as a minute SRAM can be implemented.

Second Embodiment

Figure 5:
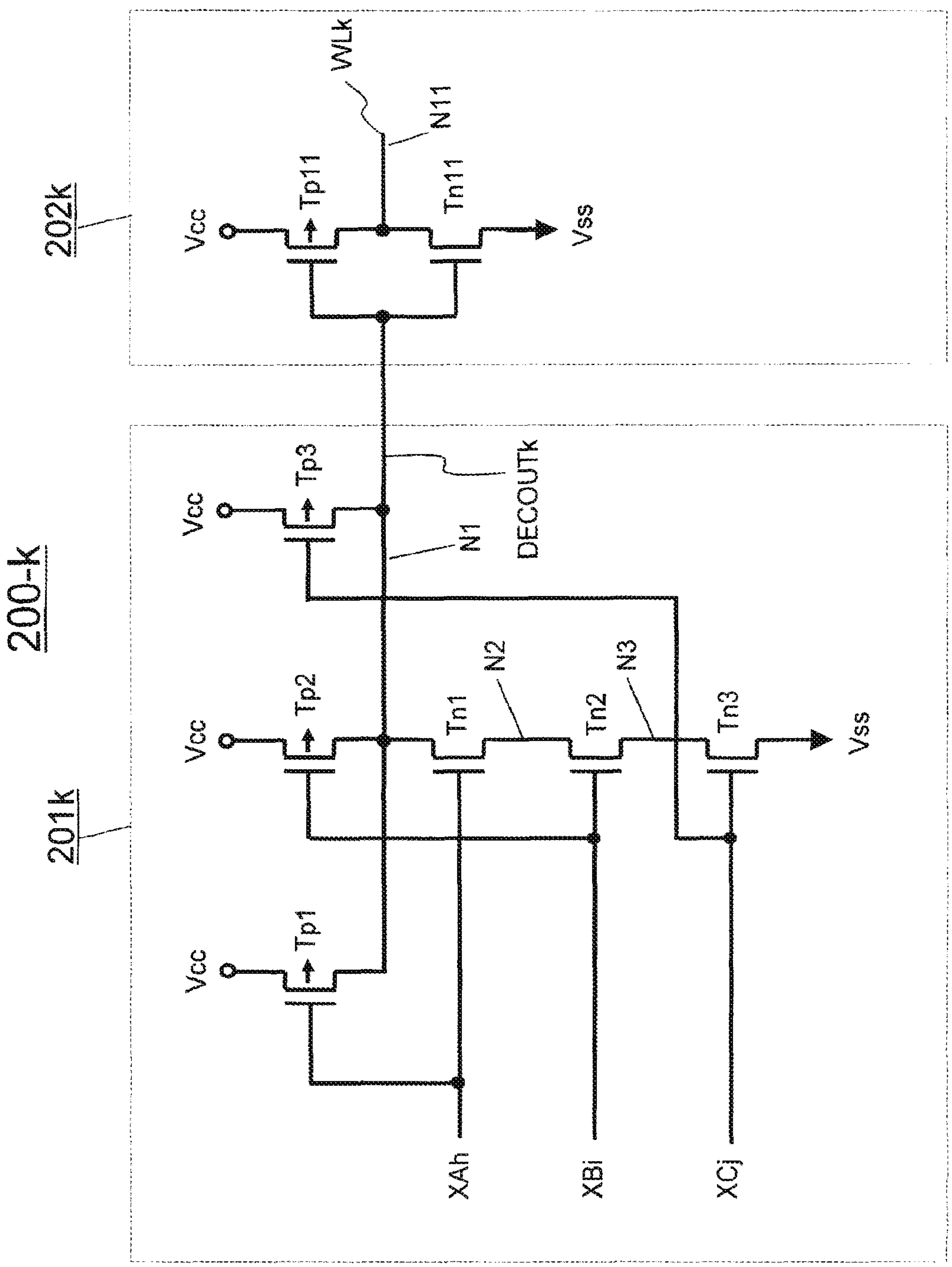
FIG. 5 is an equivalent circuit diagram of a row selection decoder according to a second embodiment of the present invention.

FIG. 5 illustrates an equivalent circuit of a row selection decoder 200-*k* (k=0 to 255).

The row selection decoder 200-*k* is constituted by a NAND decoder 201*k* and an inverter 202*k*. The NAND decoder 201*k* is the same as the NAND decoder 201 illustrated in FIG. 3. The inverter 202*k* is constituted by a PMOS transistor Tp11 and an NMOS transistor Tn11. The drains of the PMOS transistor Tp11 and the NMOS transistor Tn11 are connected in common to a node N11. The node N11 serves as output WLk. The source of the PMOS transistor Tp11 is connected to the supply voltage Vcc, and the source of the NMOS transistor Tn11 is connected to the reference voltage Vss. The gates of the PMOS transistor Tp11 and the NMOS transistor Tn11 are connected in common, and receive output DECOUTk of the NAND decoder 201*k*.

Figure 6A:
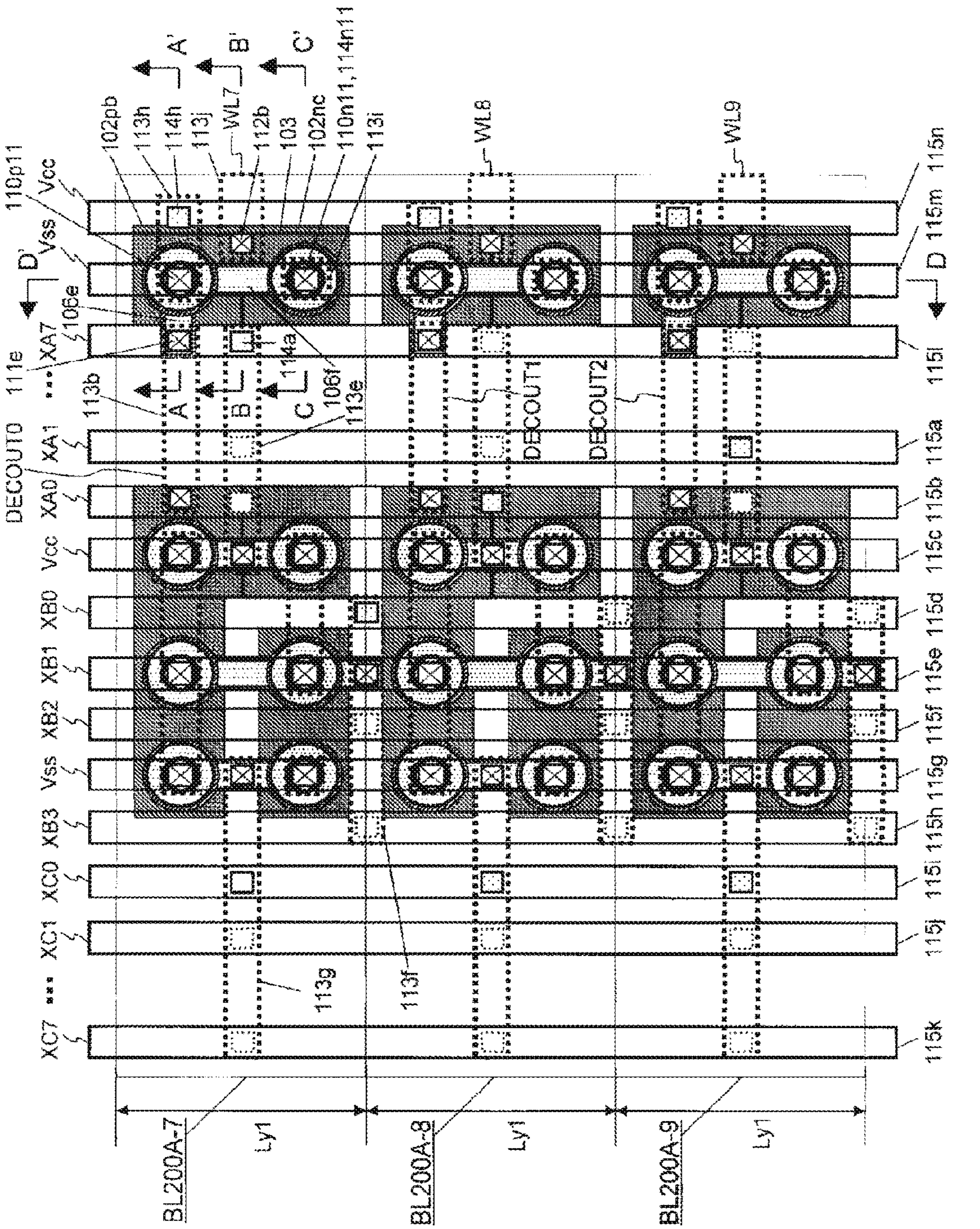
FIG. 6A is a plan view of the row selection decoder according to the second embodiment of the present invention.
Figure 6B:
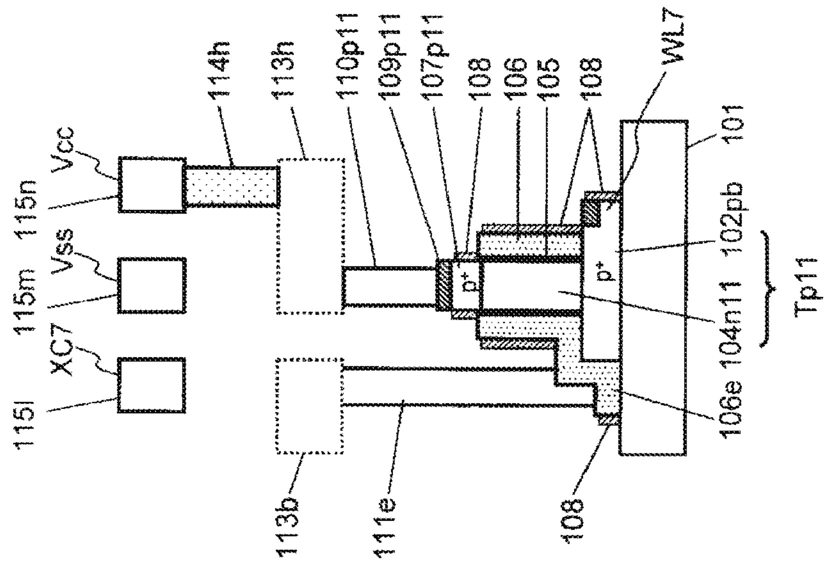
FIG. 6B is a cross-sectional view of the row selection decoder according to the second embodiment of the present invention.
Figure 6C:
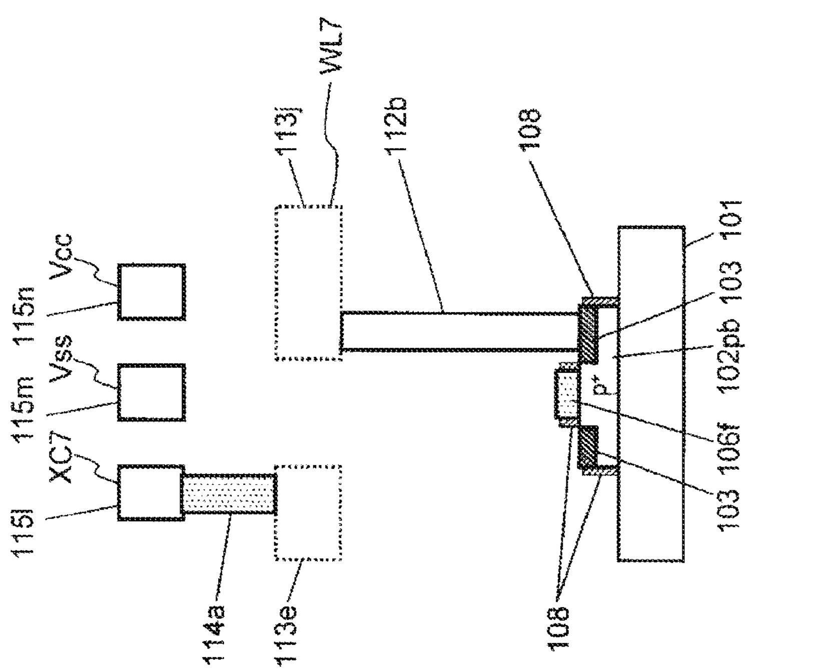
FIG. 6C is a cross-sectional view of the row selection decoder according to the second embodiment of the present invention.
Figure 6D:
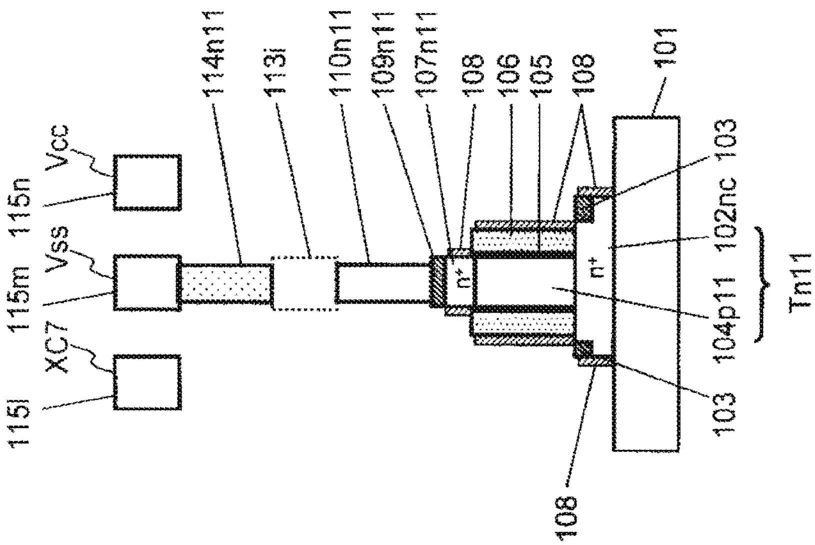
FIG. 6D is a cross-sectional view of the row selection decoder according to the second embodiment of the present invention.
Figure 6E:
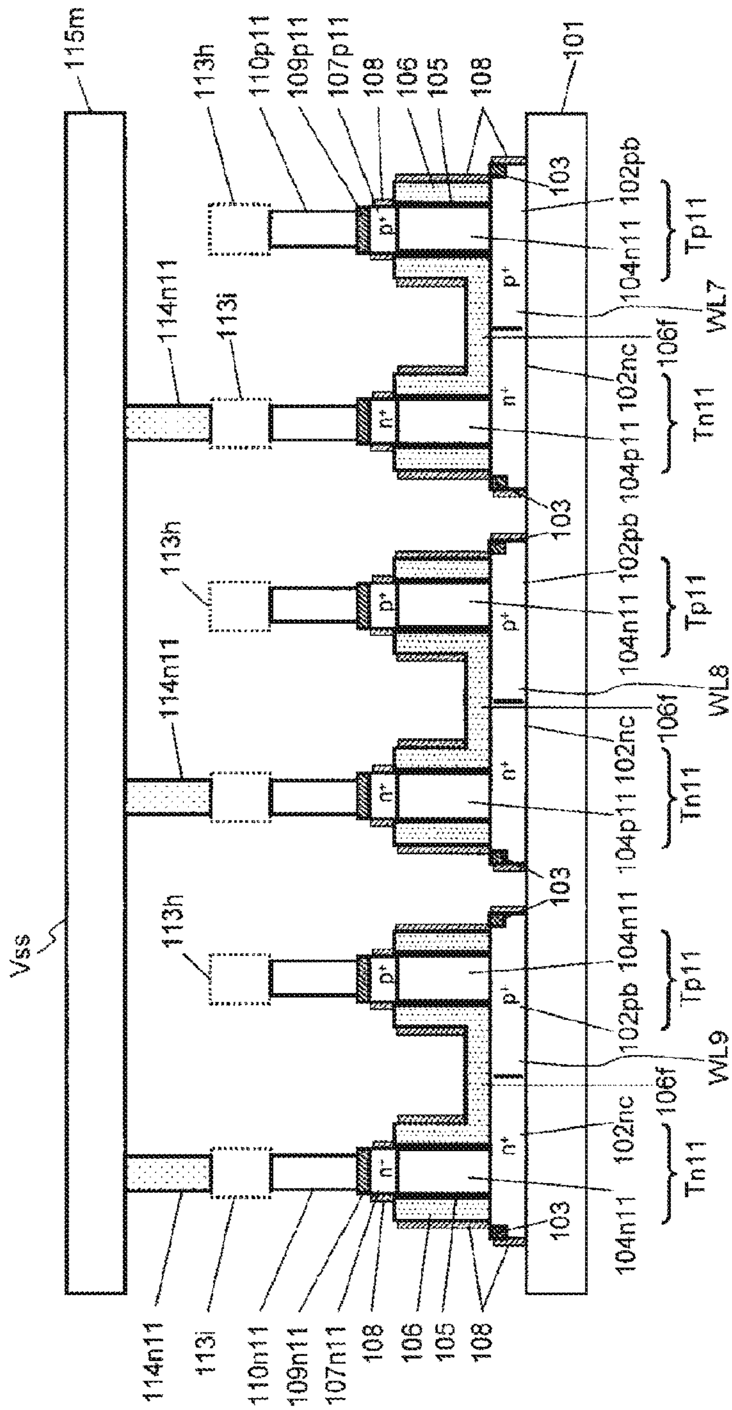
FIG. 6E is a cross-sectional view of the row selection decoder according to the second embodiment of the present invention.

FIGS. 6A, 68, 6C, 6D, and 6E illustrate a second embodiment. FIG. 6A is a plan view of a layout (arrangement) of the row selection decoder 200-*k* illustrated in FIG. 5. FIG. 6B is a cross-sectional view taken along cut line A-A' in FIG. 6A. FIG. 6C is a cross-sectional view taken along cut line B-B' in FIG. 6A. FIG. 6D is a cross-sectional view taken along cut line C-C' in FIG. 6A. FIG. 6E is a cross-sectional view taken along cut line D-D' in FIG. 6A.

In FIG. 6A, the inverter 202 is arranged to the right of the NAND decoder illustrated in FIG. 4A, and three sets of the NAND decoder and the inverter 202 are arranged in the longitudinal direction at the pitch Ly1.

The drains of the PMOS transistor Tp11 and the NMOS transistor Tn11 that constitute the inverter are respectively connected to lower diffusion layers 102*pb* and 102*nc*. The lower diffusion layers 102*pb* and 102*nc* are connected in common via a silicide layer 103, and are connected to a first metal line 113*j* via a contact 112*b*. The first metal line 113*j* serves as output WLk (k=0 to 255) of the row selection decoder of this embodiment.

An upper diffusion layer 107*p*11 that serves as the source of the PMOS transistor Tp11 is connected to a first metal line 113*h* via a silicide layer 109*p*11 and via a contact 110*p*11. The first metal line 113*h* extends laterally, and is connected to a second metal line 115*n* via a contact 114*h*. To the second metal line 115*n*, the supply voltage Vcc is supplied. Here, the second metal line 115*n* to which the supply voltage is supplied extends in a direction perpendicular to the row direction.

An upper diffusion layer 107*n*11 that serves as the source of the NMOS transistor Tn11 is connected to a first metal line 113*i* via a silicide layer 109*n*11 and via a contact 110*n*11. The first metal line 113*i* is connected to a second metal line 115*m* via a contact 114*n*11. To the second metal line 115*m*, the reference voltage Vss is supplied. Here, the second metal line 115*m* to which the reference voltage is supplied extends in the direction perpendicular to the row direction.

The gate electrodes of the PMOS transistor Tp11 and the NMOS transistor Tn11 are connected in common to a gate line 106*f*. A gate line 106*e* is connected to the gate electrode of the PMOS transistor Tp11. The gate line 106*e* is connected to a first metal line 113*b* via a contact 111*e*, that is, is connected to the output of the NAND decoder 201.

In FIG. 6A, a row decoder BL200A-7 to which row selection address signals XA7, XB0, and XC0 are input, a row decoder BL200A-8 to which row selection address signals XA0, XB1, and XC0 are input, and a row decoder BL200A-9 to which row selection address signals XA1, XB1, and XC0 are input are arranged adjacent to one another at the pitch (interval) Ly1. For the row decoders BL200A-7, BL200A-8, and BL200A-9, a second metal line 115*c* and the second metal line 115*n* for supplying the supply voltage Vcc, and a second metal line 115*g* and the second metal 115*m* for supplying the reference voltage Vss are arranged in common. The selection address signal lines XA0 to XA7, XB0 to XB3, and XC0 to XC7 are all arranged in accordance with the minimum pitch of the second metal lines. Certain selection address signals are connected to the input gates of the NAND decoder via first metal lines 113*e*, 113*f*, and 113*g*.

According to this embodiment, a row selection decoder that is constituted by a NAND decoder and an inverter, that has the same pitch as the SRAM, that includes lines arranged in accordance with the minimum pitch of the second metal lines, and that has a minimum area can be provided.

Third Embodiment

Figure 7:
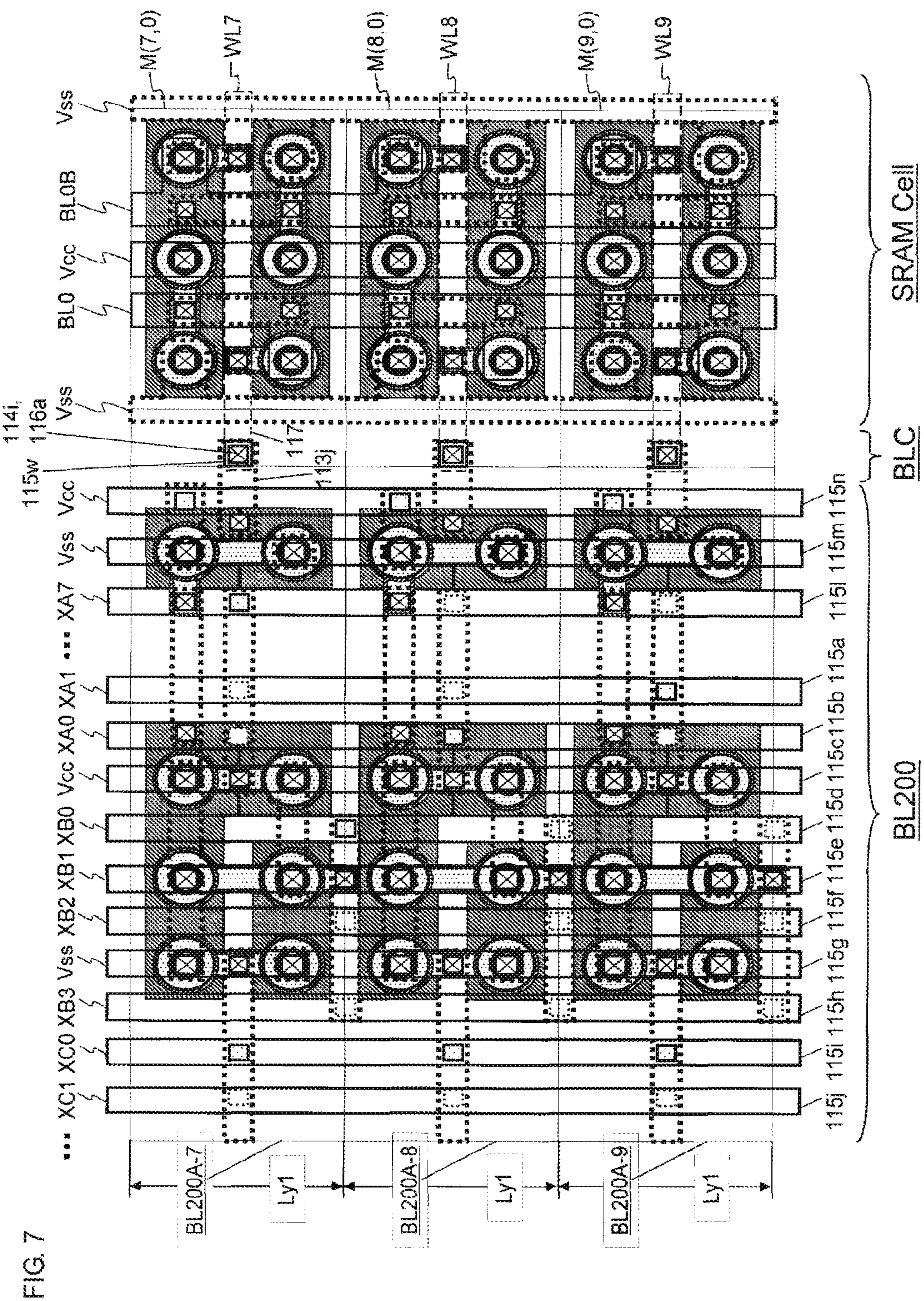
FIG. 7 is a plan view of a row selection decoder according to a third embodiment of the present invention, and memory cells.

FIG. 7 illustrates an embodiment in which a row selection decoder according to this embodiment and SRAM cells each having a two-row three-column arrangement are connected to each other. A row selection decoder BL200, a block connection region BLC that connects the row selection decoder BL200 and SRAM cells to each other, and an SRAM cell array are arranged.

In the region BLC, a first metal line 113*j* that serves as output of the row selection decoder is connected to a second metal line 115*w* via a contact 114*i*, and the second metal line 115*w* is connected to a third metal line 117 via a contact 116*a*. The third metal line 117 serves as a word line of the SRAM cell. With the row selection decoder of this embodiment, a certain SRAM cell specified by address signals can be selected.

According to this embodiment, a row selection decoder suitable to an SRAM cell having a two-row three-column arrangement can be provided.

Fourth Embodiment

Figure 8A:
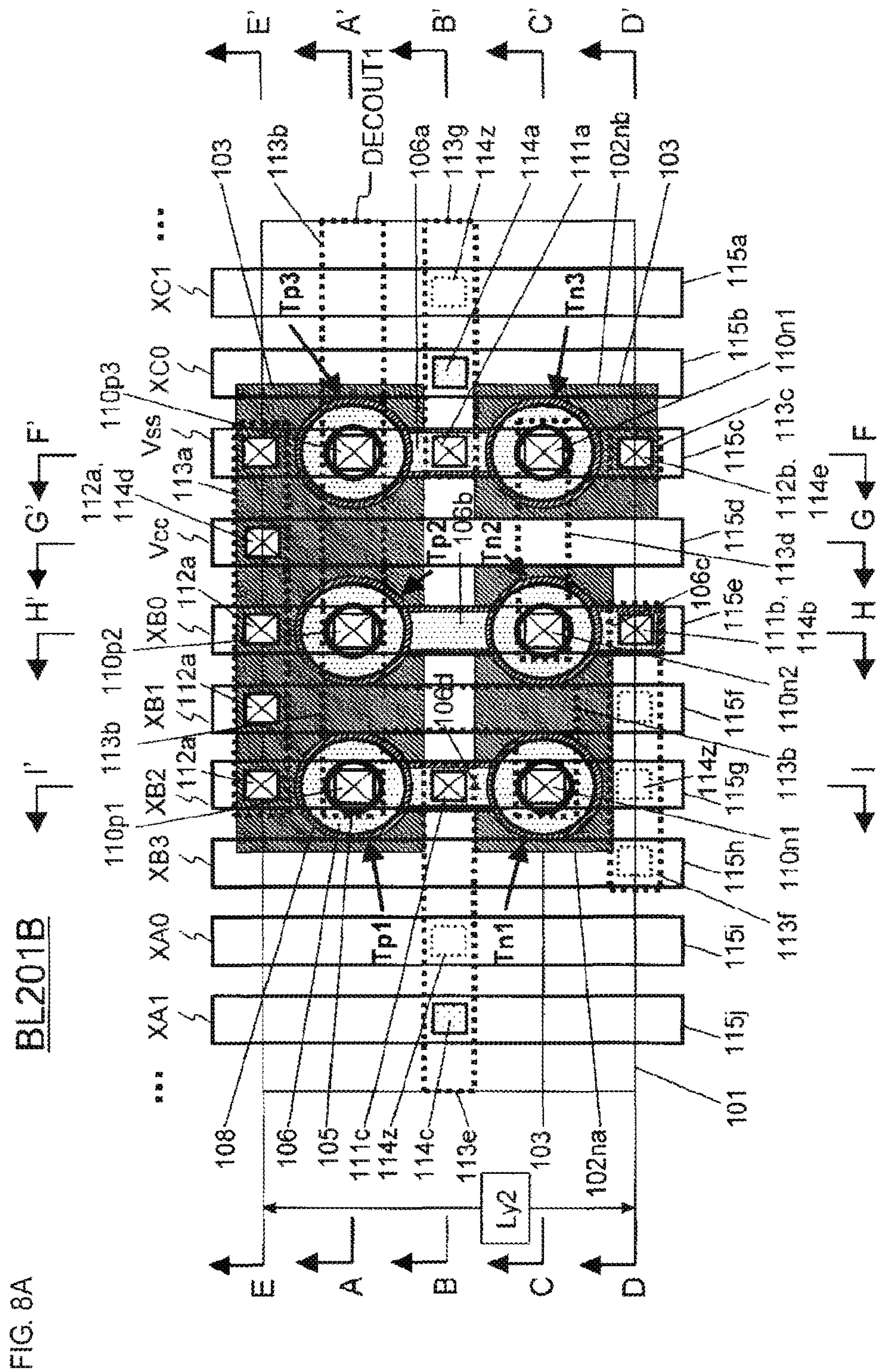
FIG. 8A is a plan view of a NAND decoder according to a fourth embodiment of the present invention.
Figure 8B:
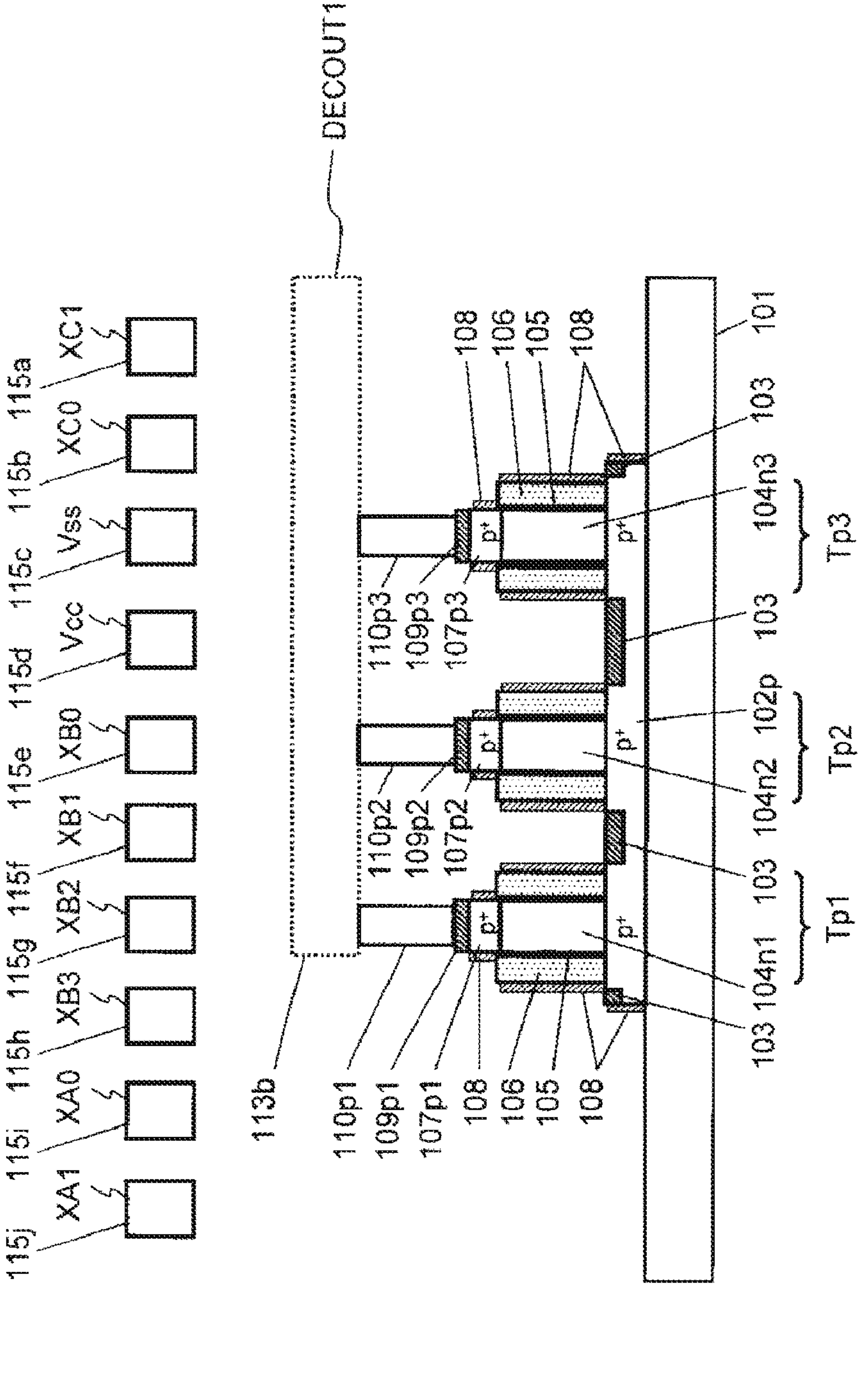
FIG. 8B is a cross-sectional view of the NAND decoder according to the fourth embodiment of the present invention.
Figure 8C:
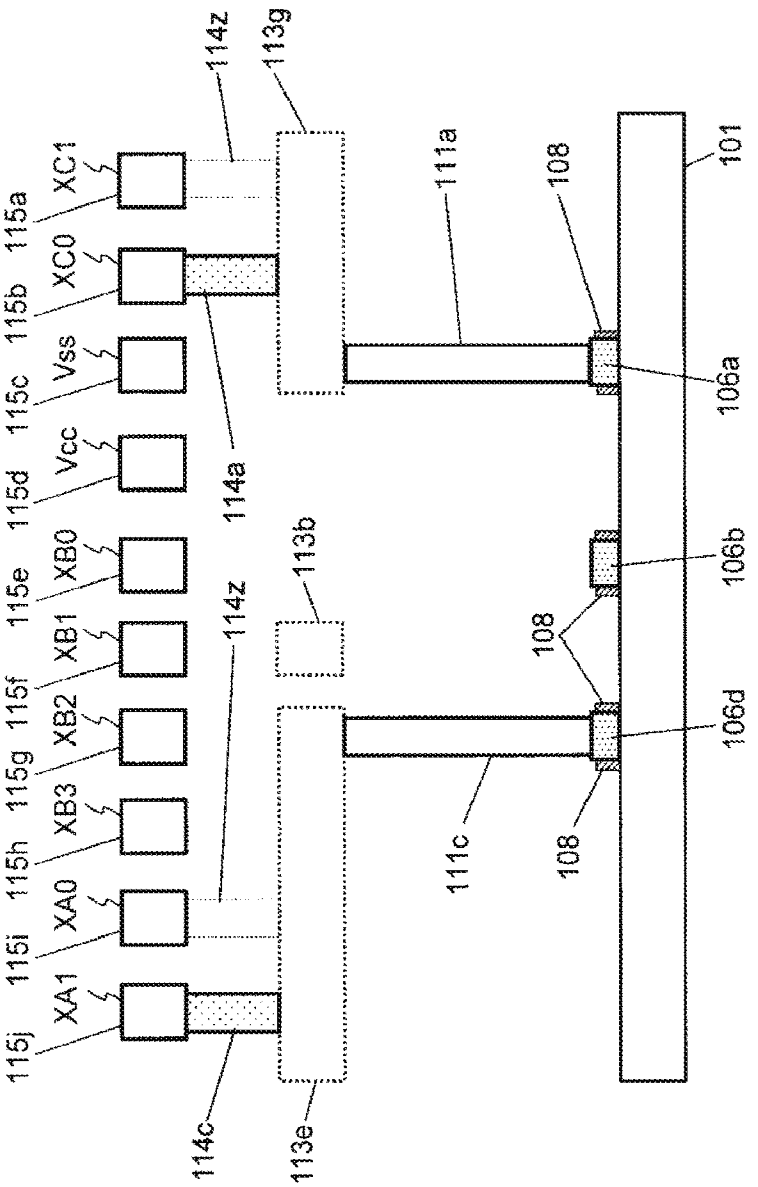
FIG. 8C is a cross-sectional view of the NAND decoder according to the fourth embodiment of the present invention.
Figure 8D:
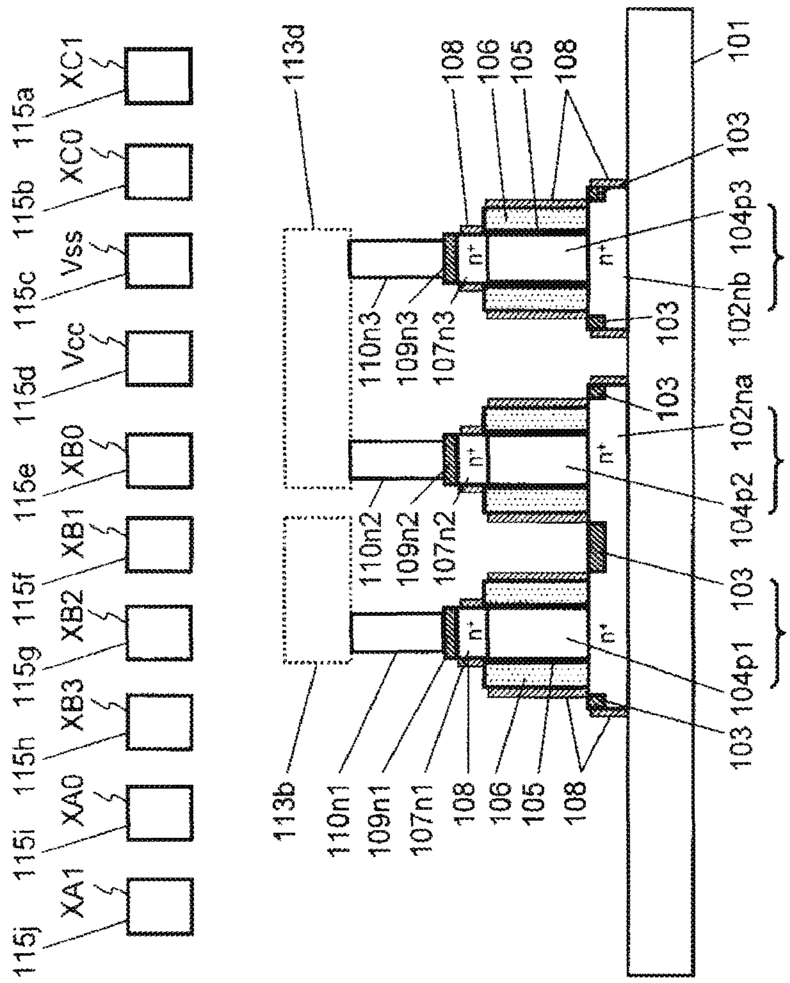
FIG. 8D is a cross-sectional view of the NAND decoder according to the fourth embodiment of the present invention.
Figure 8E:
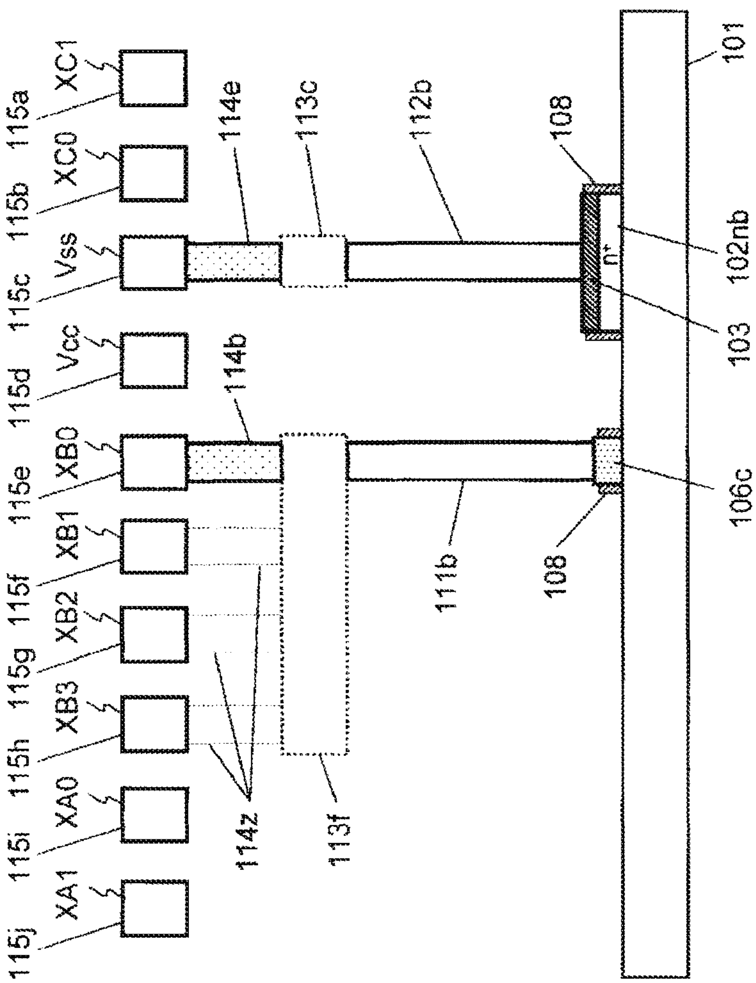
FIG. 8E is a cross-sectional view of the NAND decoder according to the fourth embodiment of the present invention.
Figure 8F:
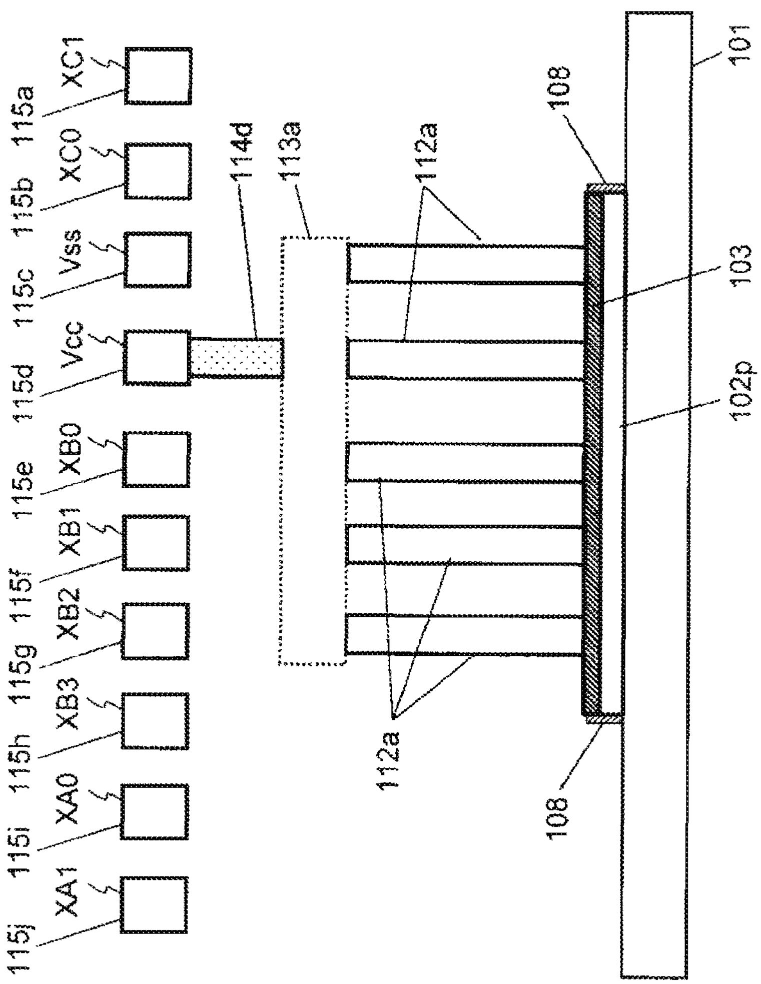
FIG. 8F is a cross-sectional view of the NAND decoder according to the fourth embodiment of the present invention.
Figure 8G:
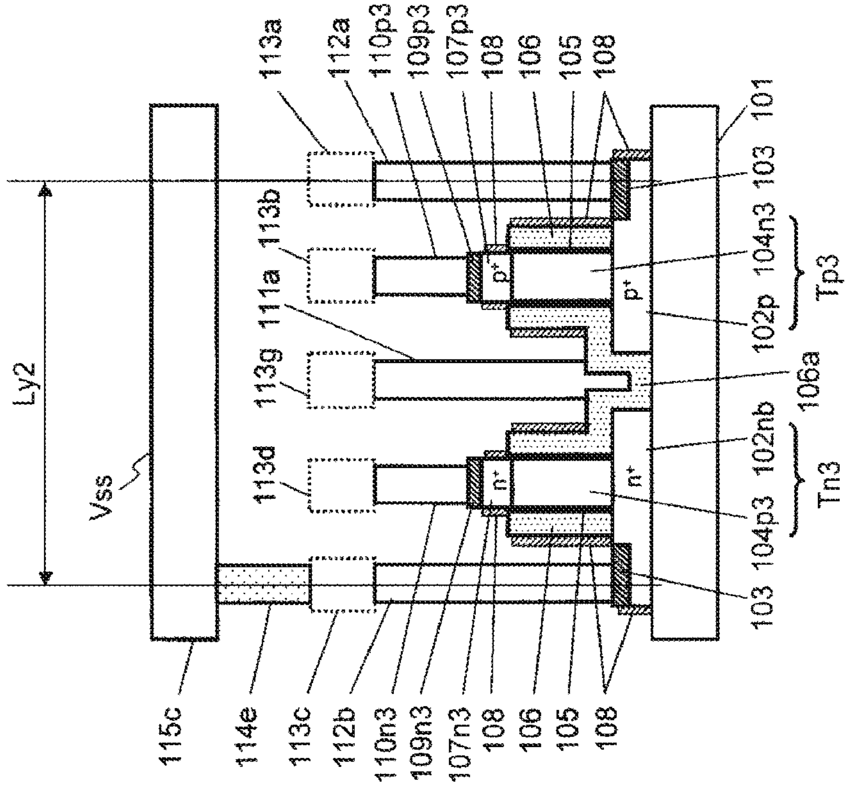
FIG. 8G is a cross-sectional view of the NAND decoder according to the fourth embodiment of the present invention.
Figure 8H:
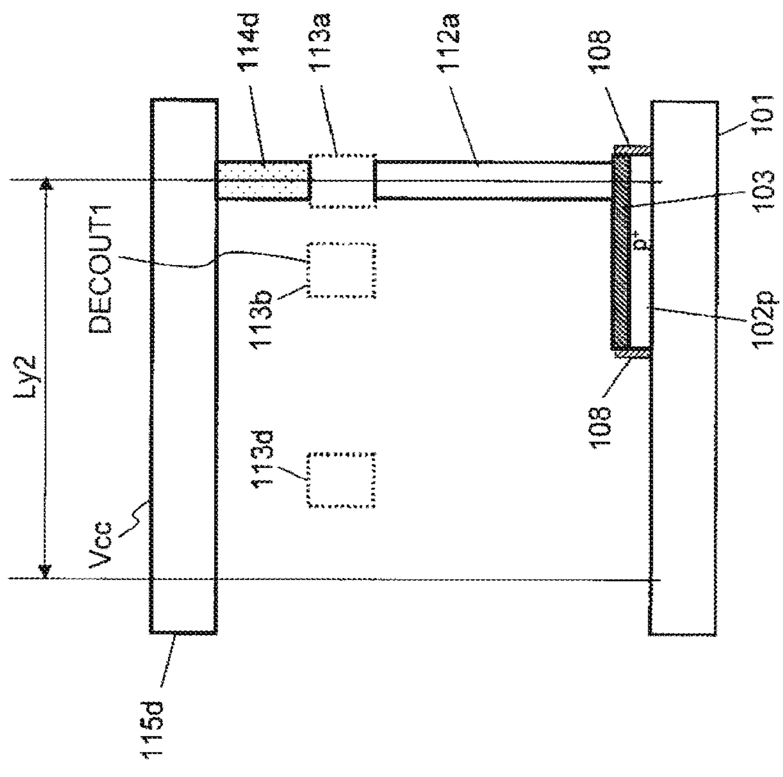
FIG. 8H is a cross-sectional view of the NAND decoder according to the fourth embodiment of the present invention.
Figure 8I:
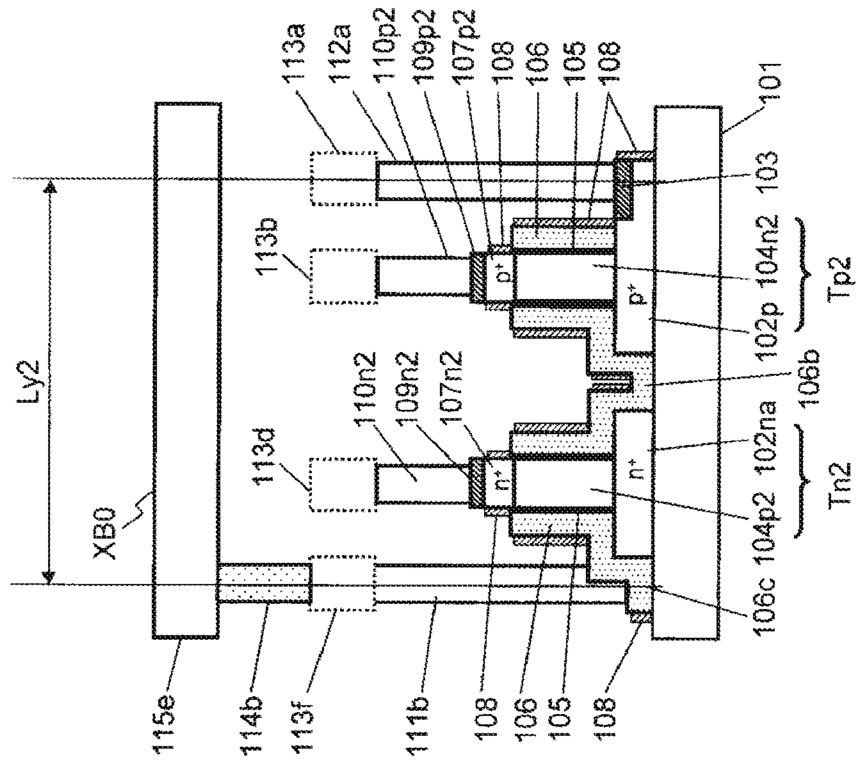
FIG. 8I is a cross-sectional view of the NAND decoder according to the fourth embodiment of the present invention.
Figure 8J:
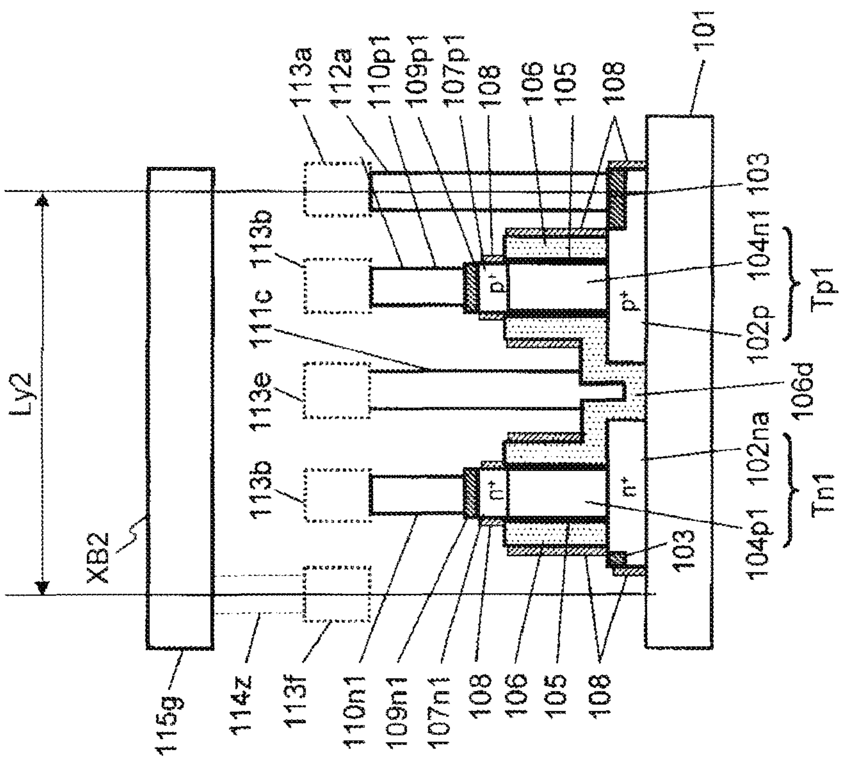
FIG. 8J is a cross-sectional view of the NAND decoder according to the fourth embodiment of the present invention.

FIGS. 8A, 8B, 8C, 8D, 8E, 8F, 8G, 8H, 8I, and 8J illustrate a fourth embodiment. FIG. 8A is a plan view of a layout (arrangement) of a NAND decoder (three-input NAND decoder) according to this embodiment. FIG. 8B is a cross-sectional view taken along cut line A-A' in FIG. 8A. FIG. 8C is a cross-sectional view taken along cut line B-B' in FIG. 8A. FIG. 8D is a cross-sectional view taken along cut line C-C' in FIG. 8A. FIG. 8E is a cross-sectional view taken along cut line D-D' in FIG. 8A. FIG. 8F is a cross-sectional view taken along cut line E-E' in FIG. 8A. FIG. 8G is a cross-sectional view taken along cut line F-F' in FIG. 8A. FIG. 8H is a cross-sectional view taken along cut line G-G' in FIG. 8A. FIG. 8I is a cross-sectional view taken along cut line H-H' in FIG. 8A. FIG. 8J is a cross-sectional view taken along cut line 1-1' in FIG. 8A.

This embodiment is different from the first embodiment illustrated in FIG. 4A and so on in that the sources of the PMOS transistors Tp1, Tp2, and Tp3 and the NMOS transistors Tn1, Tn2, and Tn3 and the drains thereof are arranged so as to be reversed in an up-down direction, and the drains of the PMOS transistors Tp1, Tp2, and Tp3 and the drain of the NMOS transistor Tn1 are connected in common via contacts.

In FIG. 8A, the PMOS transistors Tp1, Tp2, and Tp3 of the NAND decoder illustrated in FIG. 3 are arranged in the first row (the upper row in FIG. 8A) in order from the left, and the NMOS transistors Tn1, Tn2, and Tn3 of the NAND decoder illustrated in FIG. 3 are arranged in the second row (the lower row in FIG. 8A) in order from the left.

Note that in FIGS. 8A, 8B, 8C, 8D, 8E, 8F, 8G, 8H, 8I, and 8J, a portion having the same structure as the corresponding one in FIGS. 4A, 4B, 4C, 4B, 4E, 4F, 4G, 4H, and 4I is denoted by a corresponding reference numeral in the one hundreds.

On an insulating film, such as a buried oxide (BOX) film layer 101, formed on a substrate, planer silicon layers (hereinafter also referred to as lower diffusion layers) 102*p*, 102*na*, and 102*nb* are formed. The planer silicon layers 102*p*, 102*na*, and 102*nb* are respectively formed as a p+ diffusion layer, an n+ diffusion layer, and an n+ diffusion layer through impurity implantation or the like. Reference numeral 103 denotes a silicide layer formed on the surfaces of the planar silicon layers 102*p*, 102*na*, and 102*nb*. Reference numerals 104*n*1, 104*n*2, and 104*n*3 denote n-type silicon pillars. Reference numerals 104*p*1, 104*p*2, and 104*p*3 denote p-type silicon pillars. Reference numeral 105 denotes a gate insulating film that surrounds the silicon pillars 104*n*1, 104*n*2, 104*n*3, 104*p*1, 104*p*2, and 104*p*3. Reference numeral 106 denotes a gate electrode. Reference numerals 106*a*, 106*b*, 106*c*, and 106*d* denote gate lines. On the top portions of the silicon pillars 104*n*1, 104*n*2, and 104*n*3, p+ diffusion layers (hereinafter also referred to as upper diffusion layers) 107*p*1, 107*p*2, and 107*p*3 are respectively formed through impurity implantation or the like. On the top portions of the silicon pillars 104*p*1, 104*p*2, and 104*p*3, n+ diffusion layers (hereinafter also referred to as upper diffusion layers) 107*n*1, 107*n*2, and 107*n*3 are respectively formed through impurity implantation or the like. Reference numeral 108 denotes a silicon nitride film for protecting the gate insulating film 105. Reference numerals 109*p*1, 109*p*2, 109*p*3, 109*n*1, 109*n*2, and 109*n*3 denote silicide layers respectively connected to the p+ diffusion layers 107*p*1, 107*p*2, and 107*p*3 and the n+ diffusion layers 107*n*1, 107*n*2, and 107*n*3. Reference numerals 110*p*1, 110*p*2, 110*p*3, 110*n*1, 110*n*2, and 110*n*3 denote contacts that respectively connect the silicide layers 109*p*1, 109*p*2, 109*p*3, 109*n*1, 109*n*2, and 109*n*3 to first metal lines 113*b*, 113*b*, 113*b*, 113*b*, 113*d*, and 113*d*. Reference numeral 111*a* denotes a contact that connects the gate line 106*a* to a first metal line 113*g*. Reference numeral 111*b* denotes a contact that connects the gate line 106*c* to a first metal line 113*f*. Reference numeral 111*c* denotes a contact that connects the gate line 106*d* to a first metal line 113*e*.

Reference numeral 112*a* denotes a contact (five contacts 112*a* are illustrated in FIG. 8A and so on) that connects the silicide layer 103 covering the lower diffusion layer 102*p* for connection to a first metal line 113*a*. Reference numeral 112*b* denotes a contact that connects the silicide layer 103 covering the lower diffusion layer 102*nb* for connection to a first metal line 113*c*.

The silicon pillar 104*n*1, the lower diffusion layer 102*p*, the upper diffusion layer 107*p*1, the gate insulating film 105, and the gate electrode 106 constitute the PMOS transistor Tp1. The silicon pillar 104*n*2, the lower diffusion layer 102*p*, the upper diffusion layer 107*p*2, the gate insulating film 105, and the gate electrode 106 constitute the PMOS transistor Tp2. The silicon pillar 104*n*3, the lower diffusion layer 102*p*, the upper diffusion layer 107*p*3, the gate insulating film 105, and the gate electrode 106 constitute the PMOS transistor Tp3. The silicon pillar 104*p*1, the lower diffusion layer 102*na*, the upper diffusion layer 107*n*1, the gate insulating film 105, and the gate electrode 106 constitute the NMOS transistor Tn1. The silicon pillar 104*p*2, the lower diffusion layer 102*na*, the upper diffusion layer 107*n*2, the gate insulating film 105, and the gate electrode 106 constitute the NMOS transistor Tn2. The silicon pillar 104*p*3, the lower diffusion layer 102*nb*, the upper diffusion layer 107*n*3, the gate insulating film 105, and the gate electrode 106 constitute the NMOS transistor Tn3.

To the gate electrodes 106 of the PMOS transistor Tp1 and the NMOS transistor Tn1, the gate line 106*d* is connected. To the gate electrodes 106 of the PMOS transistor Tp2 and the NMOS transistor Tn2, the gate line 106*b* is connected. Further, to the gate electrode 106 of the NMOS transistor Tn2, the gate line 106*c* is connected. To the gate electrodes 106 of the PMOS transistor Tp3 and the NMOS transistor Tn3, the gate line 106*a* is connected.

The sources of the PMOS transistors Tp1, Tp2, and Tp3 are formed of the lower diffusion layer 102*p*, and the lower diffusion layer 102*p* is connected to the first metal line 113*a* via the silicide layer 103 and via the contact 112*a* (five contacts 112*a* are arranged in FIG. 8A and so on).

The first metal line 113*a* is connected to a second metal line 115*d* via a contact 114*d*. To the second metal line 115*d*, the supply voltage Vcc is supplied. Here, the second metal line 115*d* extends in a direction perpendicular to the row direction. Note that the first metal line 113*a* extends along the row direction and is used to supply the supply voltage Vcc to the lower diffusion layer 102*p* and the silicide layer 103, and the resistance of the silicide layer 103 is at a level that requires almost no attention. The upper diffusion layer 107*p*1 that serves as the drain of the PMOS transistor Tp1 is connected to the first metal line 113*b* via the silicide layer 109*p*1 and via the contact 110*p*1. The first metal line 113*b* serves as output DECOUT1. The upper diffusion layer 107*p*2 that serves as the drain of the PMOS transistor Tp2 is connected to the first metal line 113*b* via the silicide layer 109*p*2 and via the contact 110*p*2. The upper diffusion layer 107*p*3 that serves as the drain of the PMOS transistor Tp3 is connected to the first metal line 113*b* via the silicide layer 109*p*3 and via the contact 110*p*3. The upper diffusion layer 107*n*1 that serves as the drain of the NMOS transistor Tn1 is connected to the first metal line 113*b* via the silicide layer 109*n*1 and via the contact 110*n*1. Here, the drains of the PMOS transistors Tp1, Tp2, and Tp3 and the drain of the NMOS transistor Tn1 are connected in common to the first metal line 113*b* via the contacts, as described above. The lower diffusion layer 102*na* that serves as the source of the NMOS transistor Tn1 is connected to the drain of the NMOS transistor Tn2 via the silicide layer 103. The upper diffusion layer 107*n*2 that serves as the source of the NMOS transistor Tn2 is connected to the first metal line 113*d* via the silicide layer 109*n*2 and via the contact 110*n*2. The upper diffusion layer 107*n*3 that serves as the drain of the NMOS transistor Tn3 is connected to the first metal line 113*d* via the silicide layer 109*n*3 and via the contact 110*n*3. Here, the source of the NMOS transistor Tn2 and the drain of the NMOS transistor Tn3 are connected to each other via the first metal line 113*d*.

The source of the NMOS transistor Tn3 is formed of the lower diffusion layer 102*nb*, and the lower diffusion layer 102*nb* is connected to the first metal line 113*c* via the silicide layer 103 and via the contact 112*b*. The first metal line 113*c* is connected to a second metal line 115*c* via a contact 114*e*. To the second metal line 115*c*, the reference voltage Vss is supplied. Here, the second metal line 115*c* extends in the direction perpendicular to the row direction.

The gate line 106*d* that receives any of the selection address signals XA0 to XA7 supplied through second metal lines is connected to the first metal line 113*e* via the contact 111*c*. The first metal line 113*e* extends in a direction parallel to the row (to the left of FIG. 8A). The selection address signal lines XA0 to XA7 extend in the direction perpendicular to the row direction. A contact 114*c* is arranged at one of the intersection points of the first metal line 113*e* that extends parallel to the row direction and the selection address signal lines XA0 to XA7 that extend in the direction perpendicular to the row direction, and connects a selection address signal XAh (h=0 to 7) to the gate line 106*d*. In FIG. BA and so on, the contact 114*c* is provided at the intersection point of a second metal line 115*j* for the selection address signal XA1 and the first metal line 113*e*. That is, to the gate of the PMOS transistor Tp1 and to the gate of the NMOS transistor Tn1 of the NAND decoder of this embodiment, the selection address signal XA1 is input.

In FIG. 8A and so on, although the selection address signal lines XA2 to XA7 are not illustrated, the selection address signal lines XA2 to XA7 are arranged to the left of the selection address signal line XA1 and extend in the direction perpendicular to the row direction similarly to the selection address signal lines XA0 and XA1.

Note that at the intersection point of the selection address signal line XA0 (second metal line 115*i*) and the first metal line 113*e*, a contact 114*z* is illustrated with a dotted line in FIG. 8A and so on, which indicates that no contact is present at the intersection point. The location of the contact illustrated with a dotted line indicates the location of a possible contact that is to be provided in a case where the selection address signal XA0 (second metal line 115*i*) is to be input. Other similar locations have the same meaning.

The gate line 106*c* that receives any of the selection address signals XB0 to XB3 supplied through second metal lines is connected to the first metal line 113*f* via the contact 111*b*. The first metal line 113*f* extends in the direction parallel to the row (to the left of FIG. 8A). The selection address signal lines XB0 to XB3 extend in the direction perpendicular to the row direction. A contact 114*b* is arranged at one of the intersection points of the first metal line 113*f* and the selection address signal lines XB0 to XB3, and connects a selection address signal XBi (i=0 to 3) to the gate line 106*c*. In FIG. 8A and so on, the contact 114*b* is provided at the intersection point of a second metal line 115*e* for the selection address signal XB0 and the first metal line 113*f*. That is, to the gate of the PMOS transistor Tp2 and to the gate of the NMOS transistor Tn2 of the NAND decoder of this embodiment, the selection address signal XB0 is input.

Note that at the intersection point of the selection address signal line XB1 (second metal line 115*f*) and the first metal line 113*f*, at the intersection point of the selection address signal line XB2 (second metal line 115*g*) and the first metal line 113*f*, and at the intersection point of the selection address signal line XB3 (second metal line 115*h*) and the first metal line 113*f*, contacts 114*z* are respectively illustrated with a dotted line in FIG. 8A and so on, which indicates that no contacts are present at the respective intersection points, as described above. The location of a contact illustrated with a dotted line indicates the location of a possible contact.

The gate line 106*a* that receives any of the selection address signals XC0 to XC7 supplied through second metal lines is connected to the first metal line 113*g* via the contact 111*a*. The first metal line 113*g* extends in the direction parallel to the row (to the right of FIG. 8A). The selection address signal lines XC0 to XC7 extend in the direction perpendicular to the row direction. A contact 114*a* is arranged at one of the intersection points of the first metal line 113*g* and the selection address signal lines XC0 to XC7, and connects a selection address signal XCj (j=0 to 7) to the gate line 106*a*. In FIG. 8A and so on, the contact 114*a* is provided at the intersection point of a second metal line 115*b* for the selection address signal XC0 and the first metal line 113*g*. That is, to the gate of the PMOS transistor Tp3 and to the gate of the NMOS transistor Tn3 of the NAND decoder of this embodiment, the selection address signal XC0 is input.

Note that at the intersection point of the selection address signal line XC1 (second metal line 115*a*) and the first metal line 113*g*, a contact 114*z* is illustrated with a dotted line in FIG. 8A and so on, which indicates that no contact is present at the intersection point, as described above. The location of a contact illustrated with a dotted line indicates the location of a possible contact.

In FIG. 8A and so on, although the selection address signal lines XC2 to XC7 are not illustrated for convenience sake, the selection address signal lines XC2 to XC7 are arranged to the right of the selection address signal line XC1 and extend in the direction perpendicular to the row direction similarly to the selection address signal lines XC0 and XC1.

In FIG. 8A and so on, the selection address signals XA1, XB0, and XC0 are input to the NAND decoder of this embodiment, and DECOUT1 is selected as output in accordance with FIG. 2.

The NAND decoder of this embodiment (NAND decoder BL201-B) corresponds to a region surrounded by a frame in FIG. 8A, and the dimension in the longitudinal direction is Ly2, which is smaller than the dimension Ly1 of the SRAM cell illustrated in FIG. 20A. The pitch (dimension) in the fourth embodiment (FIG. 8A) is smaller than that in the first embodiment (FIG. 4A) because the pitch includes a gap between the p+ diffusion layer and the n+ diffusion layer at two locations in the first embodiment, the gap being dead space (occupying some region), while the pitch includes such a gap only at 1.5 locations in the fourth embodiment. Therefore, the dimension is reduced due to the difference in the gap.

According to this embodiment, the supply voltage line, reference voltage line, and selection address signal lines are implemented as the second metal lines and extend in the direction perpendicular to the row direction of the NAND decoder having a two-row three-column arrangement, and the input gates of the NAND decoder are connected to the second metal lines via the first metal lines that are arranged in parallel to the row direction to thereby enable supply of any selection address signals to the input of the NAND decoder. Consequently, a NAND decoder that allows arrangement in accordance with the minimum pitch of the second metal lines, has a smaller area, and has a pitch smaller than that of a minute SRAM can be implemented.

Fifth Embodiment

Figure 9A:
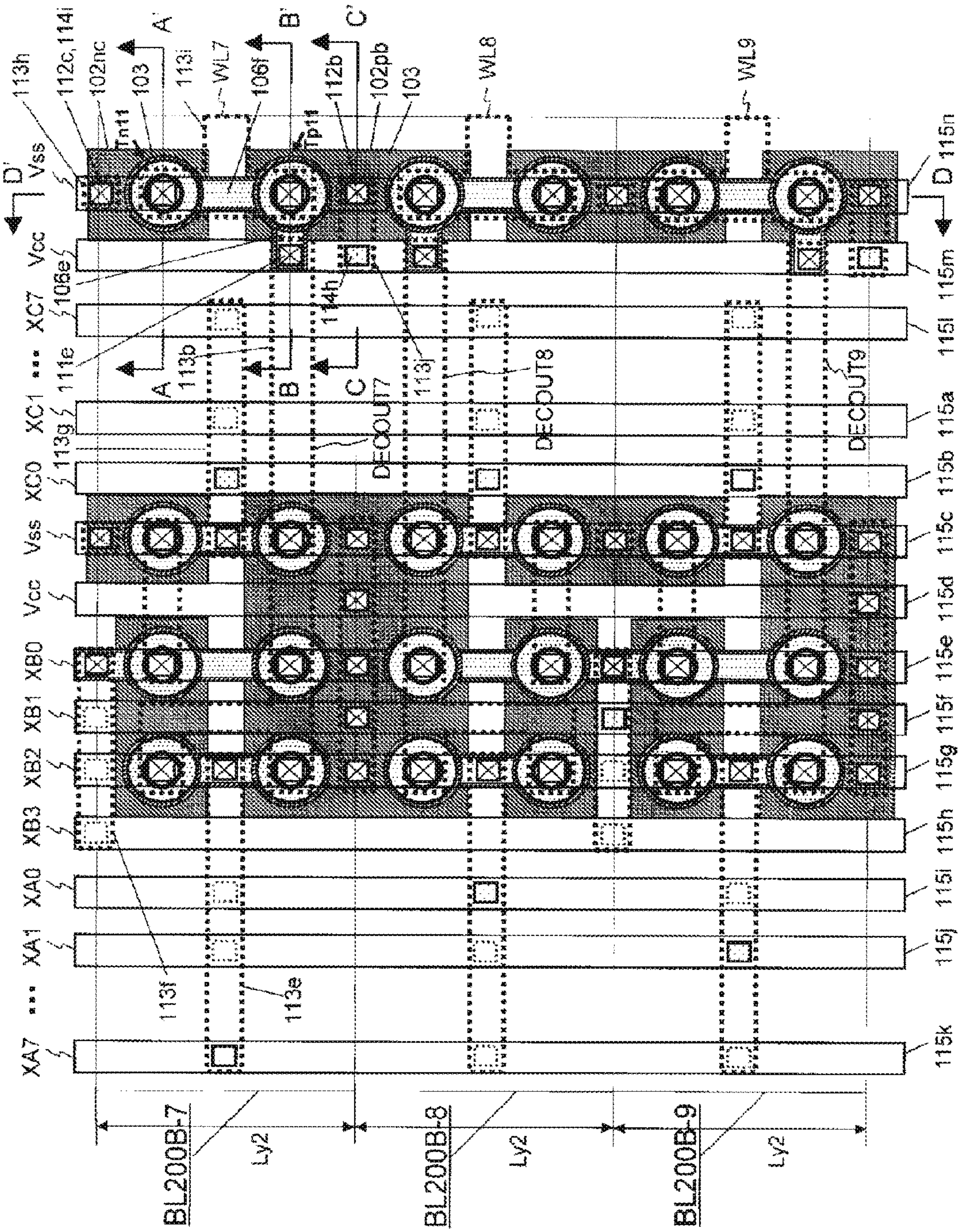
FIG. 9A is a plan view of a row selection decoder according to a fifth embodiment of the present invention.
Figure 9B:
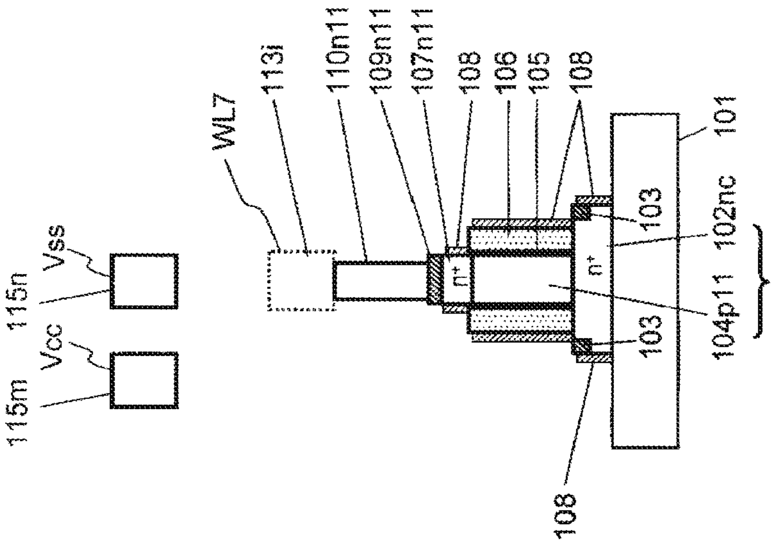
FIG. 9B is a cross-sectional view of the row selection decoder according to the fifth embodiment of the present invention.
Figure 9C:
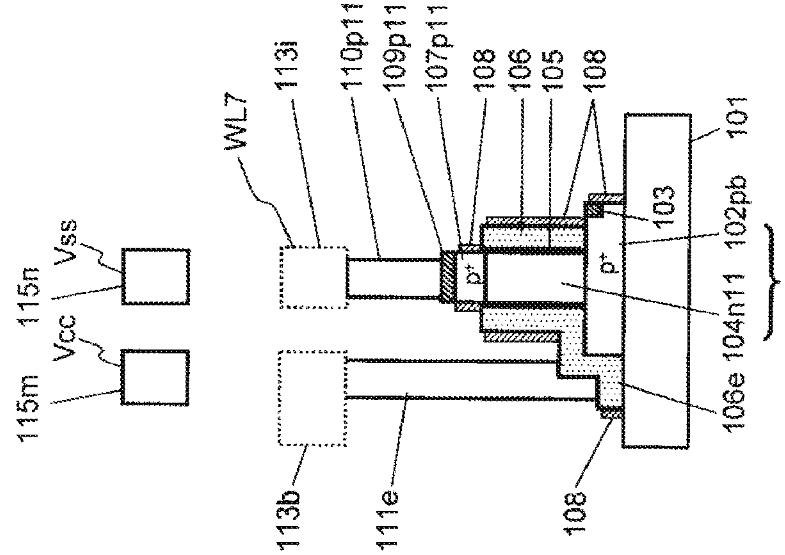
FIG. 9C is a cross-sectional view of the row selection decoder according to the fifth embodiment of the present invention.
Figure 9D:
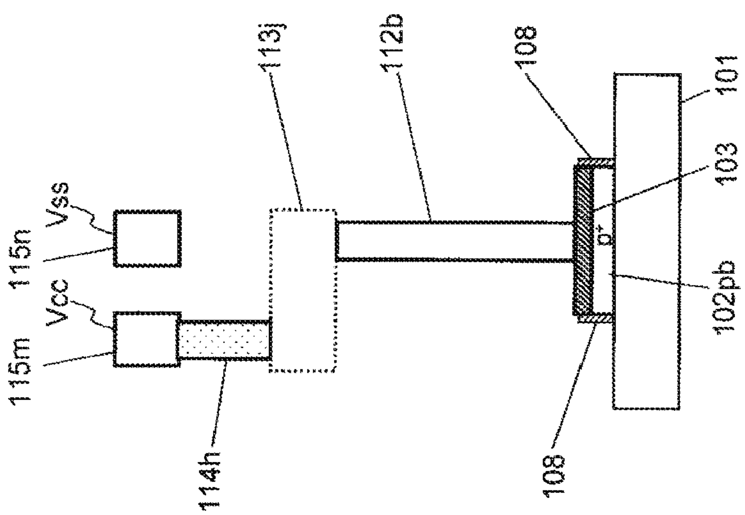
FIG. 9D is a cross-sectional view of the row selection decoder according to the fifth embodiment of the present invention.
Figure 9E:
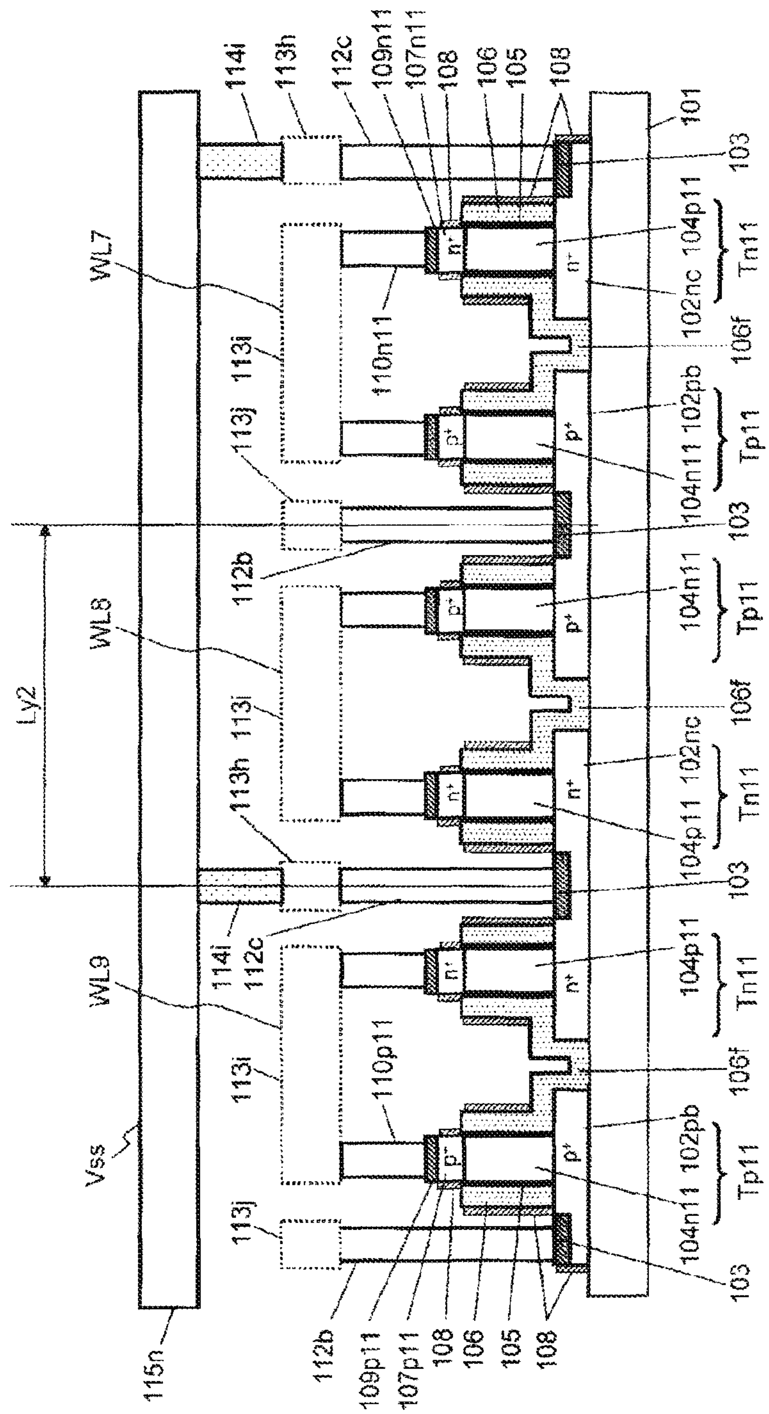
FIG. 9E is a cross-sectional view of the row selection decoder according to the fifth embodiment of the present invention.

FIGS. 9A, 9B, 9C, 9D, and 9E illustrate a fifth embodiment. This embodiment is implemented in accordance with the equivalent circuit of the row selection decoder 200-*k* illustrated in FIG. 5 by using the NAND decoder according to the embodiment illustrated in FIG. 8A and so on. FIG. 9A is a plan view of a layout (arrangement) according to this embodiment. FIG. 9B is a cross-sectional view taken along cut line A-A' in FIG. 9A. FIG. 9C is a cross-sectional view taken along cut line B-B' in FIG. 9A. FIG. 9D is a cross-sectional view taken along cut line C-C' in FIG. 9A. FIG. 9E is a cross-sectional view taken along cut line D-D' in FIG. 9A.

In FIG. 9A, the inverter 202 is arranged to the right of the NAND decoder illustrated in FIG. 8A, and three sets of the NAND decoder and the inverter 202 are arranged in the longitudinal direction at the pitch Ly2.

The drains of the PMOS transistor Tp11 and the NMOS transistor Tn11 that constitute the inverter are connected in common to the first metal line 113*i* via the upper diffusion layers 107*p*11 and 107*n*11, the silicide layers 109*p*11 and 109*n*11, and the contacts 110*p*11 and 110*n*11 respectively. The first metal line 113*i* serves as output WLk (k=0 to 255) of the row selection decoder of this embodiment.

The lower diffusion layer 102*pb* that serves as the source of the PMOS transistor Tp11 is connected to the first metal line 113*j* via the silicide layer 103 and via the contact 112*b*. The first metal line 113*j* is connected to the second metal line 115*m* via the contact 114*h*. To the second metal line 115*m*, the supply voltage Vcc is supplied. Here, the second metal line 115*m* to which the supply voltage is supplied extends in a direction perpendicular to the row direction.

The lower diffusion layer 102*nc* that serves as the source of the NMOS transistor Tn11 is connected to the first metal line 113*h* via the silicide layer 103 and via a contact 112*c*. The first metal line 113*h* is connected to the second metal line 115*n* via the contact 114*i*. To the second metal line 115*n*, the reference voltage Vss is supplied. Here, the second metal line 115*n* to which the reference voltage is supplied extends in the direction perpendicular to the row direction.

The gate electrodes of the PMOS transistor Tp11 and the NMOS transistor Tn11 are connected in common to the gate line 106*f*. The gate line 106*e* is connected to the gate electrode of the PMOS transistor Tp11. The gate line 106*e* is connected to the first metal line 113*b* via the contact 111*e*, that is, is connected to output DECOUTk of the NAND decoder 201.

In FIG. 9A, a row decoder BL200B-7 to which row selection address signals XA7, XB0, are XC0 are input, a row decoder BL200B-8 to which row selection address signals XA0, XB1, and XC0 are input, and a row decoder BL200B-9 to which row selection address signals XA1, XB1, and XC0 are input are arranged adjacent to one another at the pitch (interval) Ly2. For the row decoders BL200B-7, BL200B-8, and BL200B-9, the second metal lines 115*d* and 115*m* for supplying the supply voltage Vcc and the second metal lines 115*c* and 115*n* for supplying the reference voltage Vss are arranged in common. The selection address signal lines XA0 to XA7, XB0 to XB3, and XC0 to XC7 are all arranged in accordance with the minimum pitch of the second metal lines. Certain selection address signals are connected to the input gates of the NAND decoder via the first metal lines 113*e*, 113*f*, and 113*g*.

According to this embodiment, a row selection decoder that is constituted by a NAND decoder and an inverter can be implemented with a pitch (dimension) smaller than that of the SRAM. Further, a row selection decoder that includes lines arranged in accordance with the minimum pitch of the second metal lines without dead space (gap) and that has a minimum area can be provided.

Sixth Embodiment

FIGS. 10A, 10B, 10C, and 10D illustrate a sixth embodiment.

The equivalent circuit diagram of this embodiment is based on FIG. 5. The NAND decoder 201 and the inverter 202 are integrated into one unit to attain a further smaller area.

Figure 10A:
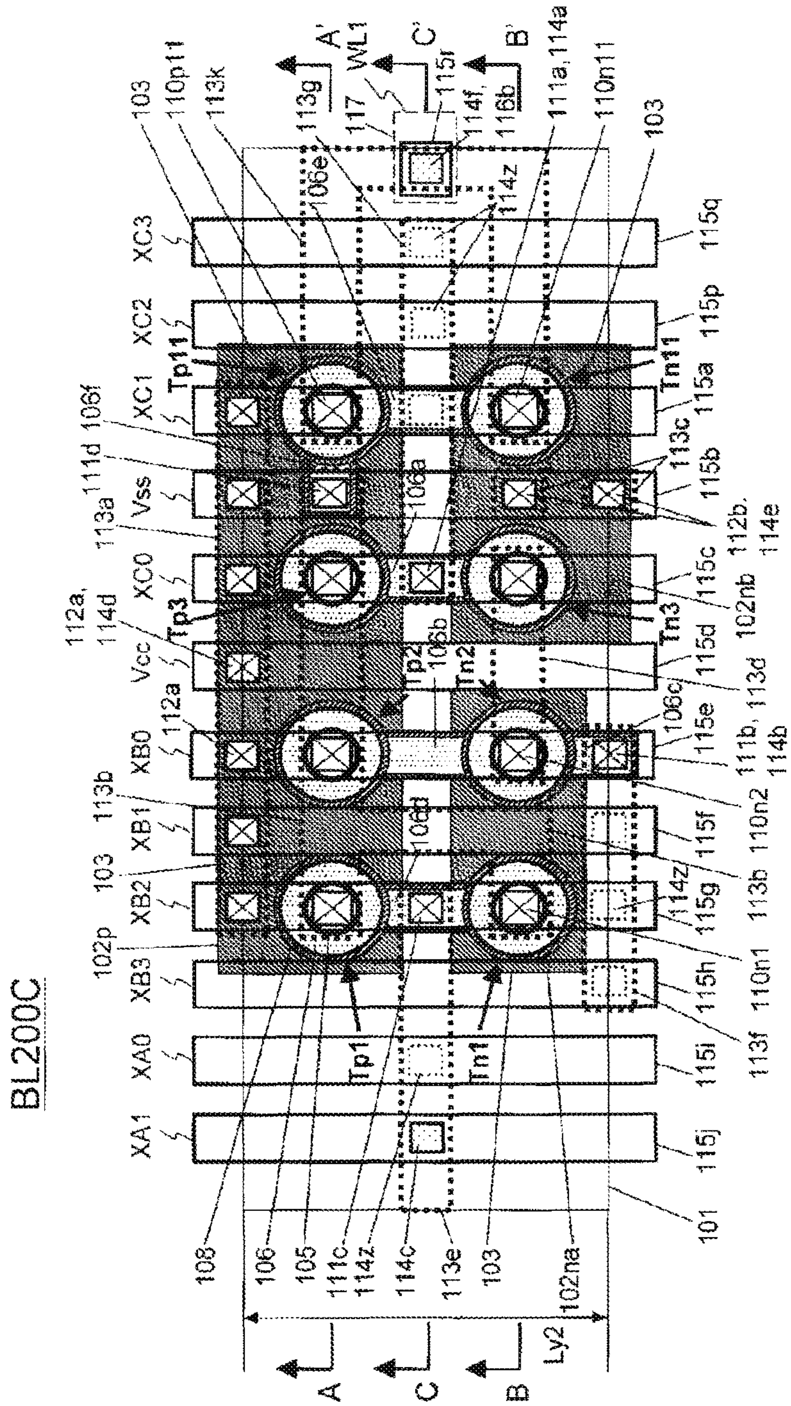
FIG. 10A is a plan view of a row selection decoder according to a sixth embodiment of the present invention.
Figure 10B:
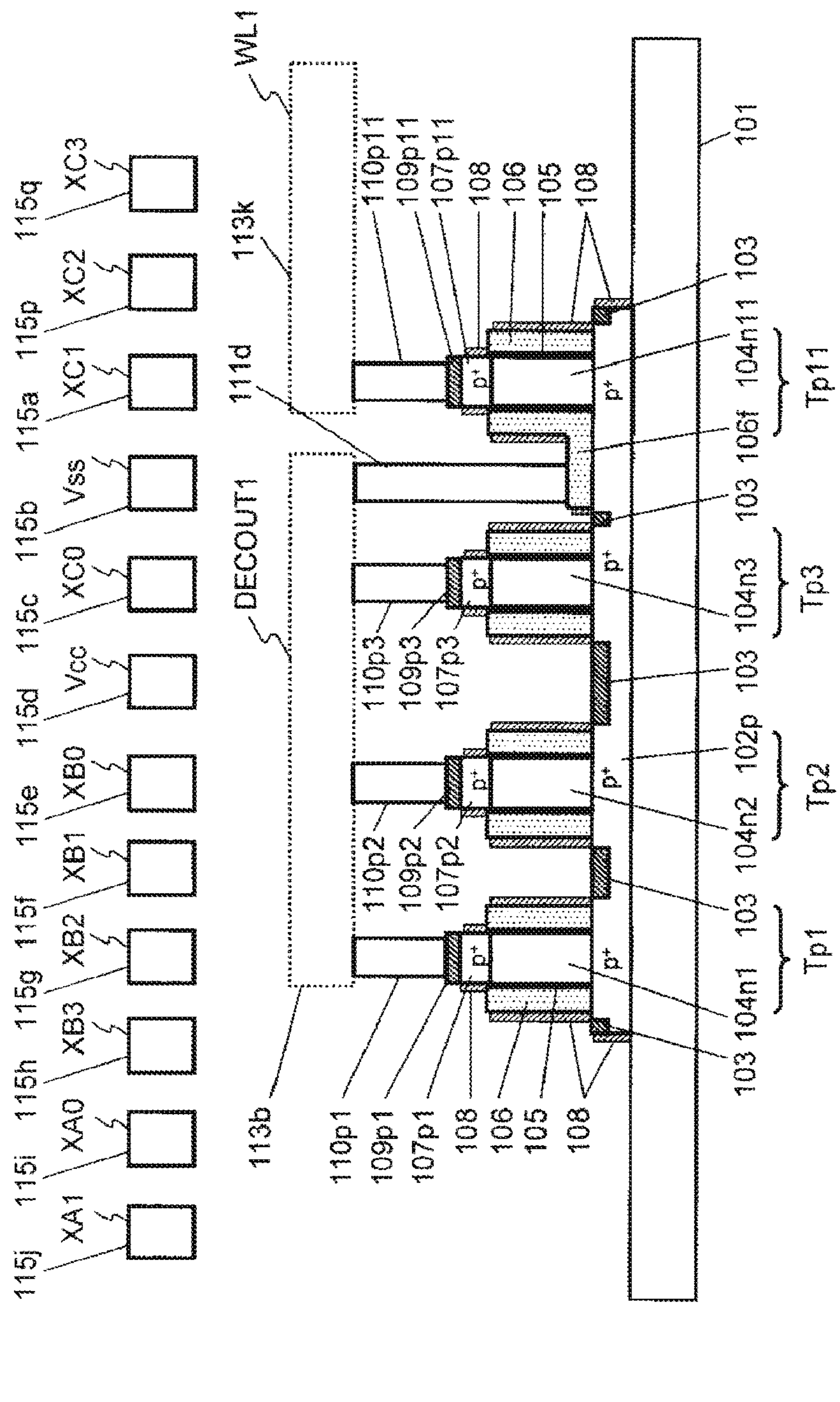
FIG. 10B is a cross-sectional view of the row selection decoder according to the sixth embodiment of the present invention.
Figure 10C:
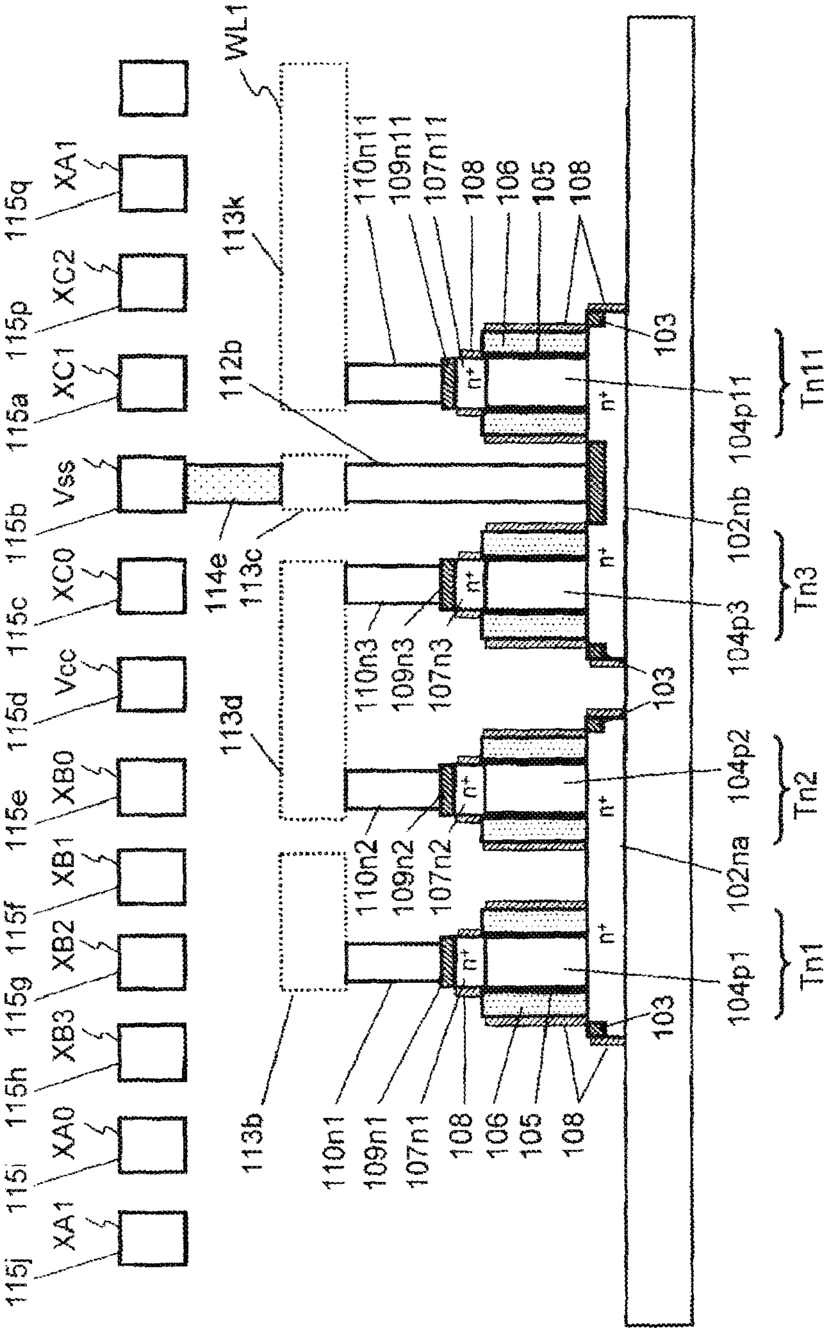
FIG. 10C is a cross-sectional view of the row selection decoder according to the sixth embodiment of the present invention.
Figure 10D:
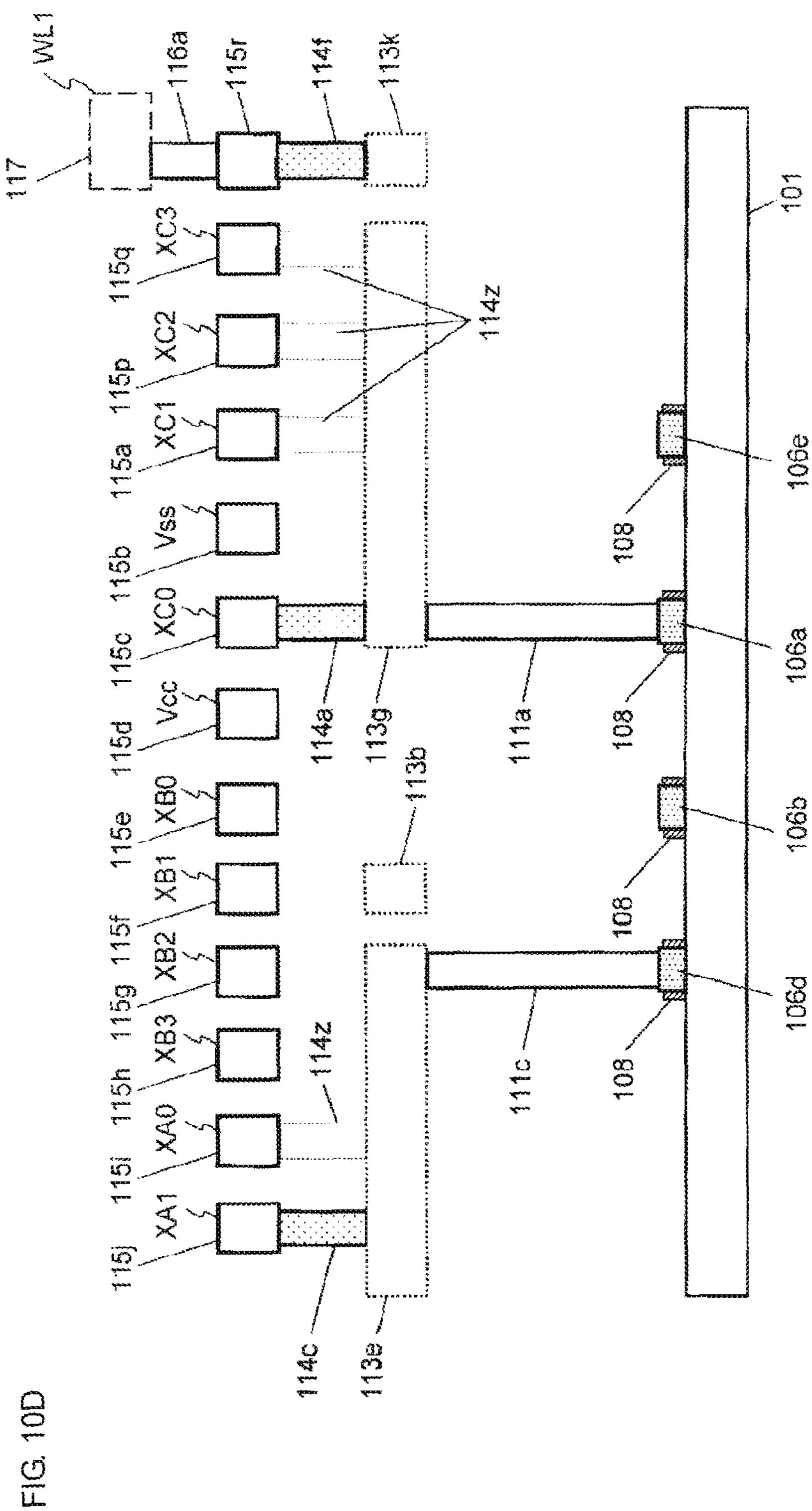
FIG. 10D is a cross-sectional view of the row selection decoder according to the sixth embodiment of the present invention.

FIG. 10A is a plan view of a layout (arrangement) of a row selection decoder according to this embodiment. FIG. 10B is a cross-sectional view taken along cut line A-A' in FIG. 10A. FIG. 10C is a cross-sectional view taken along cut line B-B' in FIG. 10A. FIG. 10D is a cross-sectional view taken along cut line C-C' in FIG. 10A.

This embodiment is different from the fourth embodiment illustrated in FIG. 8A in that a lower diffusion layer for supplying the supply voltage to the PMOS transistor Tp11, and a lower diffusion layer for supplying the reference voltage to the NMOS transistor Tn11, the PMOS transistor Tp11 and the NMOS transistor Tn11 constituting the inverter, are shared with the NAND decoder illustrated in FIG. 8A and so on to thereby reduce an unnecessary region and to further reduce the area of the row selection decoder.

In FIG. 10A, a part to the left of the second metal line 115*d* and the second metal line 115*d* in the NAND decoder has the same configuration as FIG. 8A and so on. Arrangement and connections in a part to the right of the second metal line 115*c* and the second metal line 115*c* are different from those illustrated in FIG. 8A and so on.

Note that in FIGS. 10A, 10B, 10C, and 10D, a portion having the same structure as the corresponding one in FIGS. 8A, 8B, 8C, and 8D is denoted by a corresponding reference numeral in the one hundreds.

On an insulating film, such as a buried oxide (BOX) film layer 101, formed on a substrate, planer silicon layers (hereinafter also referred to as lower diffusion layers) 102*p*, 102*na*, and 102*nb* are formed. The planer silicon layers 102*p*, 102*na*, and 102*nb* are respectively formed as a p+ diffusion layer, an n+ diffusion layer, and an n+ diffusion layer through impurity implantation or the like. Reference numeral 103 denotes a silicide layer formed on the surfaces of the planar silicon layers 102*p*, 102*na*, and 102*nb*. Reference numerals 104*n*1, 104*n*2, 104*n*3, and 104*n*11 denote n-type silicon pillars. Reference numerals 104*p*1, 104*p*2, 104*p*3, and 104*p*11 denote p-type silicon pillars. Reference numeral 105 denotes a gate insulating film that surrounds the silicon pillars 104*n*1, 104*n*2, 104*n*3, 104*n*11, 104*p*1, 104*p*2, 104*p*3, and 104*p*11. Reference numeral 106 denotes a gate electrode. Reference numerals 106*a*, 106*b*, 106*c*, 106*d*, 106*e*, and 106*f* denote gate lines. On the top portions of the silicon pillars 104*n*1, 104*n*2, 104*n*3, and 104*n*11, p+ diffusion layers (hereinafter also referred to as upper diffusion layers) 107*p*1, 107*p*2, 107*p*3, and 107*p*11 are respectively formed through impurity implantation or the like. On the top portions of the silicon pillars 104*p*1, 104*p*2, 104*p*3, and 104*p*11, n+ diffusion layers (hereinafter also referred to as upper diffusion layers) 107*n*1, 107*n*2, 107*n*3, and 107*n*11 are respectively formed through impurity implantation or the like. Reference numeral 108 denotes a silicon nitride film for protecting the gate insulating film 105. Reference numerals 109*p*1, 109*p*2, 109*p*3, 109*p*11, 109*n*1, 109*n*2, 109*n*3, and 109*n*11 denote silicide layers respectively connected to the p+ diffusion layers 107*p*1, 107*p*2, 107*p*3, and 107*p*11 and the n+ diffusion layers 107*n*1, 107*n*2, 107*n*3, and 107*n*11. Reference numerals 110*p*1, 110*p*2, 110*p*3, 110*p*11, 110*n*1, 110*n*2, 110*n*3, and 110*n*11 denote contacts that respectively connect the silicide layers 109*p*1, 109*p*2, 109*p*3, 109*p*11, 109*n*1, 109*n*2, 109*n*3, and 109*n*11 to first metal lines 113*b*, 113*b*, 113*b*, 113*k*, 113*b*, 113*d*, 113*d*, and 113*k*. Reference numeral 111*a* denotes a contact that connects the gate line 106*a* to a first metal line 113*g*. Reference numeral 111*b* denotes a contact that connects the gate line 106*c* to a first metal line 113*f*. Reference numeral 111*c* denotes a contact that connects the gate line 106*d* to a first metal line 113*e*. Reference numeral 111*d* denotes a contact that connects the gate line 106*f* to the first metal line 113*b*.

Reference numeral 112*a* denotes a contact (seven contacts 112*a* are arranged in FIG. 10A) that connects the silicide layer 103 covering the lower diffusion layer 102*p* for connection to a first metal line 113*a*. Reference numeral 112*b* denotes a contact (two contacts 112*b* are arranged in FIG. 10A) that connects the silicide layer 103 covering the lower diffusion layer 102*nb* for connection to a first metal line 113*c* (at two locations).

The silicon pillar 104*n*1, the lower diffusion layer 102*p*, the upper diffusion layer 107*p*1, the gate insulating film 105, and the gate electrode 106 constitute the PMOS transistor Tp1. The silicon pillar 104*n*2, the lower diffusion layer 102*p*, the upper diffusion layer 107*p*2, the gate insulating film 105, and the gate electrode 106 constitute the PMOS transistor Tp2. The silicon pillar 104*n*3, the lower diffusion layer 102*p*, the upper diffusion layer 107*p*3, the gate insulating film 105, and the gate electrode 106 constitute the PMOS transistor Tp3. The silicon pillar 104*n*11, the lower diffusion layer 102*p*, the upper diffusion layer 107*p*11, the gate insulating film 105, and the gate electrode 106 constitute the PMOS transistor Tp11. The silicon pillar 104*p*1, the lower diffusion layer 102*na*, the upper diffusion layer 107*n*1, the gate insulating film 105, and the gate electrode 106 constitute the NMOS transistor Tn1. The silicon pillar 104*p*2, the lower diffusion layer 102*na*, the upper diffusion layer 107*n*2, the gate insulating film 105, and the gate electrode 106 constitute the NMOS transistor Tn2. The silicon pillar 104*p*3, the lower diffusion layer 102*nb*, the upper diffusion layer 107*n*3, the gate insulating film 105, and the gate electrode 106 constitute the NMOS transistor Tn3. The silicon pillar 104*p*11, the lower diffusion layer 102*nb*, the upper diffusion layer 107*n*11, the gate insulating film 105, and the gate electrode 106 constitute the NMOS transistor Tn11.

To the gate electrodes 106 of the PMOS transistor Tp1 and the NMOS transistor Tn1, the gate line 106*d* is connected. To the gate electrodes 106 of the PMOS transistor Tp2 and the NMOS transistor Tn2, the gate line 106*b* is connected. Further, to the gate electrode 106 of the NMOS transistor Tn2, the gate line 106*c* is connected. To the gate electrodes 106 of the PMOS transistor Tp3 and the NMOS transistor Tn3, the gate line 106*a* is connected. To the gate electrodes 106 of the PMOS transistor Tp11 and the NMOS transistor Tn11, the gate line 106*e* is connected. Further, to the gate electrode 106 of the PMOS transistor Tp11, the gate line 106*f* is connected.

The sources of the PMOS transistors Tp1, Tp2, Tp3, and Tp11 are formed of the lower diffusion layer 102*p*, and the lower diffusion layer 102*p* is connected to the first metal line 113*a* via the silicide layer 103 and via the contact 112*a* (seven contacts 112*a* are arranged in FIG. 10A). The first metal line 113*a* is connected to a second metal line 115*d* via a contact 114*d*. To the second metal line 115*d*, the supply voltage Vcc is supplied. Here, the second metal line 115*d* extends in a direction perpendicular to the row direction. Note that the first metal line 113*a* extends along the row direction and is used to supply the supply voltage Vcc to the lower diffusion layer 102*p* and the silicide layer 103, and the resistance of the silicide layer 103 is at a level that requires almost no attention. The upper diffusion layer 107*p*1 that serves as the drain of the PMOS transistor Tp1 is connected to the first metal line 113*b* via the silicide layer 109*p*1 and via the contact 110*p*1. The first metal line 113*b* serves as output DECOUT1. The upper diffusion layer 107*p*2 that serves as the drain of the PMOS transistor Tp2 is connected to the first metal line 113*b* via the silicide layer 109*p*2 and via the contact 110*p*2. The upper diffusion layer 107*p*3 that serves as the drain of the PMOS transistor Tp3 is connected to the first metal line 113*b* via the silicide layer 109*p*3 and via the contact 110*p*3. The upper diffusion layer 107*n*1 that serves as the drain of the NMOS transistor Tn1 is connected to the first metal line 113*b* via the silicide layer 109*n*1 and via the contact 110*n*1. Here, the drains of the PMOS transistors Tp1, Tp2, and Tp3 and the drain of the NMOS transistor Tn1 are connected in common to the first metal line 113*b* via the contacts, as described above. The lower diffusion layer 102*na* that serves as the source of the NMOS transistor Tn1 is connected to the drain of the NMOS transistor Tn2 via the silicide layer 103. The upper diffusion layer 107*n*2 that serves as the source of the NMOS transistor Tn2 is connected to the first metal line 113*d* via the silicide layer 109*n*2 and via the contact 110*n*2.

The upper diffusion layer 107*n*3 that serves as the drain of the NMOS transistor Tn3 is connected to the first metal line 113*d* via the silicide layer 109*n*3 and via the contact 110*n*3. Here, the source of the NMOS transistor Tn2 and the drain of the NMOS transistor Tn3 are connected to each other via the first metal line 113*d*. The source of the NMOS transistor Tn3 is formed of the lower diffusion layer 102*nb*, and the lower diffusion layer 102*nb* is connected to the first metal line 113*c* via the silicide layer 103 and via the contact 112*b*. The first metal line 113*c* is connected to a second metal line 115*b* via a contact 114*e*. To the second metal line 115*b*, the reference voltage Vss is supplied. Here, the second metal line 115*b* extends in the direction perpendicular to the row direction.

The source of the PMOS transistor Tp11 is formed of the lower diffusion layer 102*p*, and the lower diffusion layer 102*p* is shared with the PMOS transistors Tp1, Tp2, and Tp3 via the silicide layer 103 and is connected to the second metal line 115*d* via the contact 112*a* and via the first metal line 113*a*. Through the second metal line 115*d*, the supply voltage Vcc is supplied. The upper diffusion layer 107*p*11 that serves as the drain of the PMOS transistor Tp11 is connected to the first metal line 113*k* via the silicide layer 109*p*11 and via the contact 110*p*11. The first metal line 113*k* is connected to a third metal line 117 that serves as a word line of the SRAM cell illustrated in FIG. 7, via a contact 114*f*, a second metal line 115*r*, and a contact 116*b*.

The source of the NMOS transistor Tn11 is formed of the lower diffusion layer 102*nb*, and the lower diffusion layer 102*nb* is shared with the NMOS transistor Tn3 via the silicide layer 103 and is connected to the second metal line 115*b* via the contact 112*b* and via the first metal line 113*c*. Through the second metal line 115*b*, the reference voltage Vss is supplied. The upper diffusion layer 107*n*11 that serves as the drain of the NMOS transistor Tn11 is connected to the first metal line 113*k* via the silicide layer 109*n*11 and via the contact 110*n*11.

The gate line 106*d* that receives any of the selection address signals XA0 to XA7 supplied through second metal lines is connected to the first metal line 113*e* via the contact 111*c*. The first metal line 113*e* extends in a direction parallel to the row (to the left of FIG. 10A). The selection address signal lines XA0 to XA7 extend in the direction perpendicular to the row direction. A contact 114*c* is arranged at one of the intersection points of the first metal line 113*e* that extends parallel to the row direction and the selection address signal lines XA0 to XA7 that extend in the direction perpendicular to the row direction, and connects a selection address signal XAh (h=0 to 7) to the gate line 106*d*. In FIG. 10A and so on, the contact 114*c* is provided at the intersection point of a second metal line 115*j* for the selection address signal XA1 and the first metal line 113*e*. That is, to the gate of the PMOS transistor Tp1 and to the gate of the NMOS transistor Tn1 of the NAND decoder of this embodiment, the selection address signal XA1 is input.

In FIG. 10A and so on, although the selection address signal lines XA2 to XA7 are not illustrated, the selection address signal lines XA2 to XA7 are arranged to the left of the selection address signal line XA1 and extend in the direction perpendicular to the row direction similarly to the selection address signal lines XA0 and XA1.

Note that at the intersection point of the selection address signal line XA0 (second metal line 115*i*) and the first metal line 113*e*, a contact 114*z* is illustrated with a dotted line in FIG. 10A and so on, which indicates that no contact is present at the intersection point. The location of the contact illustrated with a dotted line indicates the location of a possible contact that is to be provided in a case where the selection address signal XA0 (second metal line 115*i*) is to be input. Other similar locations have the same meaning.

The gate line 106*c* that receives any of the selection address signals XB0 to XB3 supplied through second metal lines is connected to the first metal line 113*f* via the contact 111*b*. The first metal line 113*f* extends in the direction parallel to the row (to the left of FIG. 10A). The selection address signal lines XB0 to XB3 extend in the direction perpendicular to the row direction. A contact 114*b* is arranged at one of the intersection points of the first metal line 113*e* and the selection address signal lines XB0 to XB3, and connects a selection address signal XBi (i=0 to 3) to the gate line 106*c*. In FIG. 10A, the contact 114*b* is provided at the intersection point of a second metal line 115*e* for the selection address signal XB0 and the first metal line 113*f*. That is, to the gate of the PMOS transistor Tp2 and to the gate of the NMOS transistor Tn2 of the NAND decoder of this embodiment, the selection address signal XB0 is input.

Note that at the intersection point of the selection address signal line XB1 (second metal line 115*f*) and the first metal line 113*f*, at the intersection point of the selection address signal line XB2 (second metal line 115*g*) and the first metal line 113*f*, and at the intersection point of the selection address signal line XB3 (second metal line 115*h*) and the first metal line 113*f*, contacts 114*z* are respectively illustrated with a dotted line in FIG. 10A, which indicates that no contacts are present at the respective intersection points, as described above. The location of a contact illustrated with a dotted line indicates the location of a possible contact.

The gate line 106*a* that receives any of the selection address signals XC0 to XC7 supplied through second metal lines is connected to the first metal line 113*g* via the contact 111*a*. The first metal line 113*g* extends in the direction parallel to the row (to the right of FIG. 10A). The selection address signal lines XC0 to XC7 extend in the direction perpendicular to the row direction. A contact 114*a* is arranged at one of the intersection points of the first metal line 113*g* and the selection address signal lines XC0 to XC7, and connects a selection address signal XCj (j=0 to 7) to the gate line 106*a*. In FIG. 10A and so on, the contact 114*a* is provided at the intersection point of a second metal line 115*c* for the selection address signal XC0 and the first metal line 113*g*. That is, to the gate of the PMOS transistor Tp3 and to the gate of the NMOS transistor Tn3 of the NAND decoder of this embodiment, the selection address signal XC0 is input.

Note that at the intersection point of the selection address signal line XC1 (second metal line 115*a*) and the first metal line 113*g*, at the intersection point of the selection address signal line XC2 (second metal line 115*p*) and the first metal line 113*g*, and at the intersection point of the selection address signal line XC3 (second metal line 115*q*) and the first metal line 113*g*, contacts 114*z* are respectively illustrated with a dotted line in FIG. 10A and so on, which indicates that no contacts are present at the respective intersection points, as described above. The location of a contact illustrated with a dotted line indicates the location of a possible contact.

In FIG. 10A and so on, although the selection address signal lines XC4 to XC7 are not illustrated for convenience sake, the selection address signal lines XC4 to XC7 are arranged to the right of the selection address signal line XC3 and extend in the direction perpendicular to the row direction.

In this embodiment, the selection address signals XA1, XB0, and XC0 are input, and a word line WL1 is selected.

The row selection decoder of this embodiment (row selection decoder BL200C) corresponds to a region surrounded by a frame in FIG. 10A, and the dimension in the longitudinal direction is Ly2, which is the same as the dimension illustrated in FIG. 8A.

According to this embodiment, the supply voltage line, reference voltage line, and selection address signal lines are implemented as the second metal lines and extend in the direction perpendicular to the row direction of the NAND decoder and the inverter that are integrated into one unit having a two-row four-column arrangement, and the input gates of the NAND decoder are connected to the second metal lines via the first metal lines that are arranged in parallel to the row direction to thereby enable supply of any selection address signals to the input of the NAND decoder. Consequently, a row selection decoder that allows arrangement in accordance with the minimum pitch of the second metal lines and has a smaller area can be provided.

Seventh Embodiment

Figure 11A:
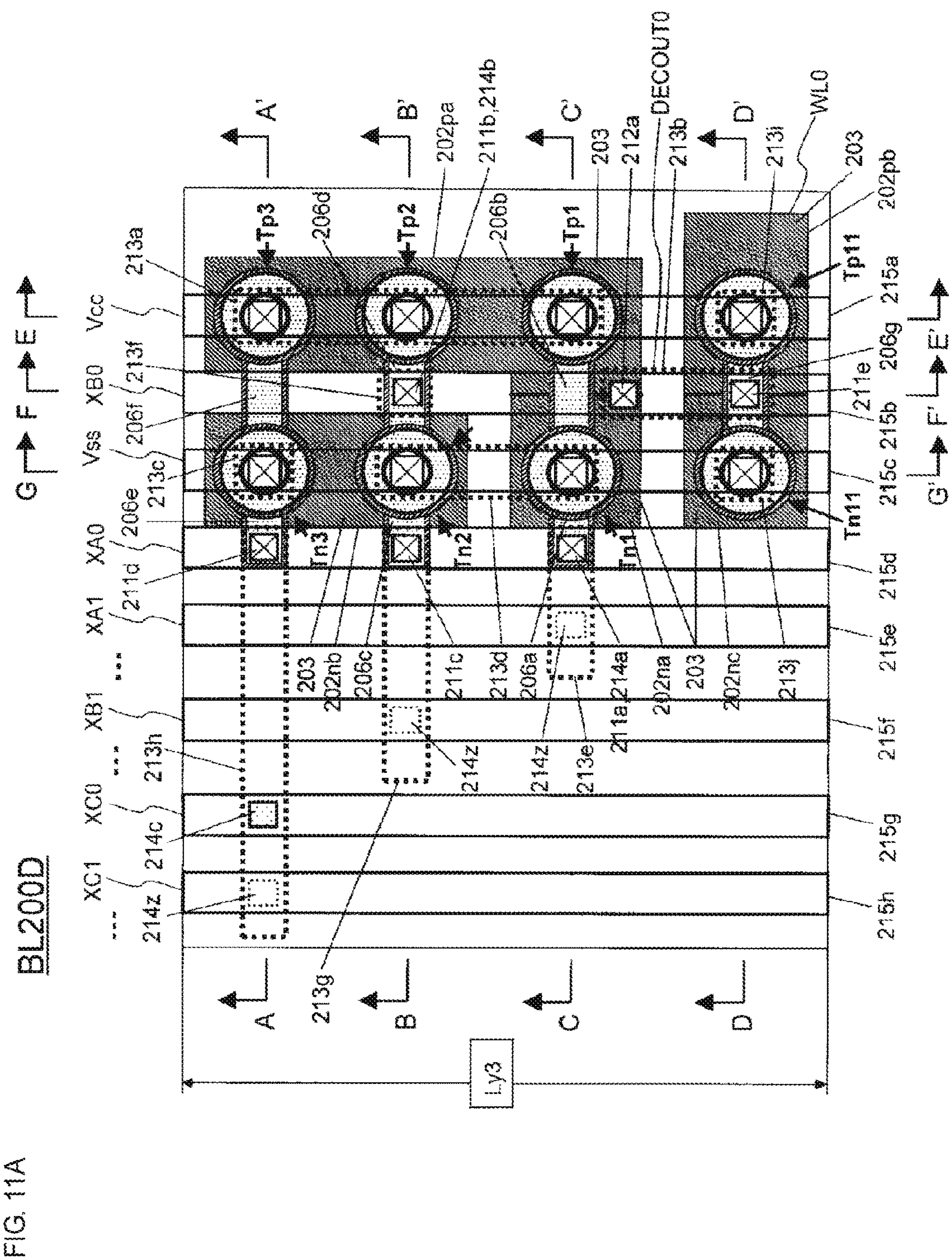
FIG. 11A is a plan view of a row selection decoder according to a seventh embodiment of the present invention.
Figure 11B:
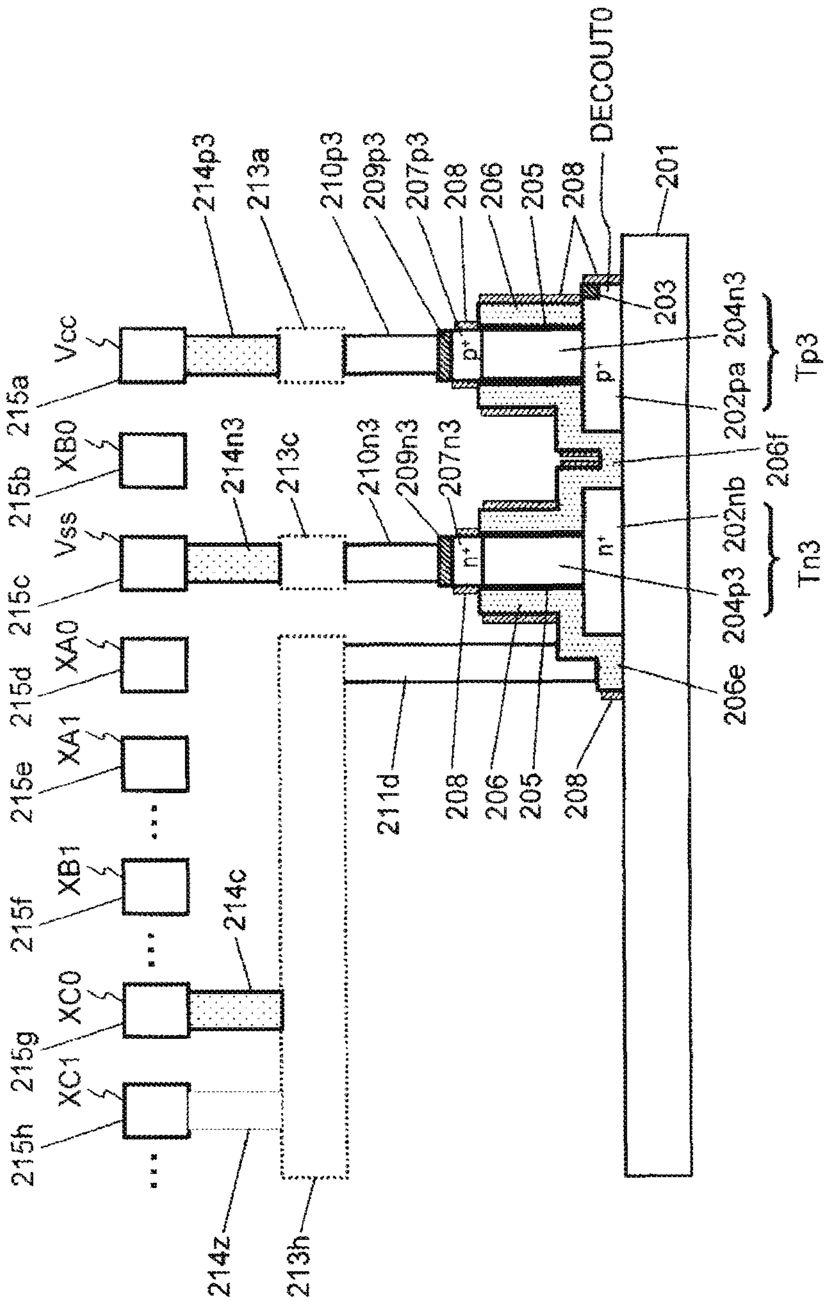
FIG. 11B is a cross-sectional view of the row selection decoder according to the seventh embodiment of the present invention.
Figure 11C:
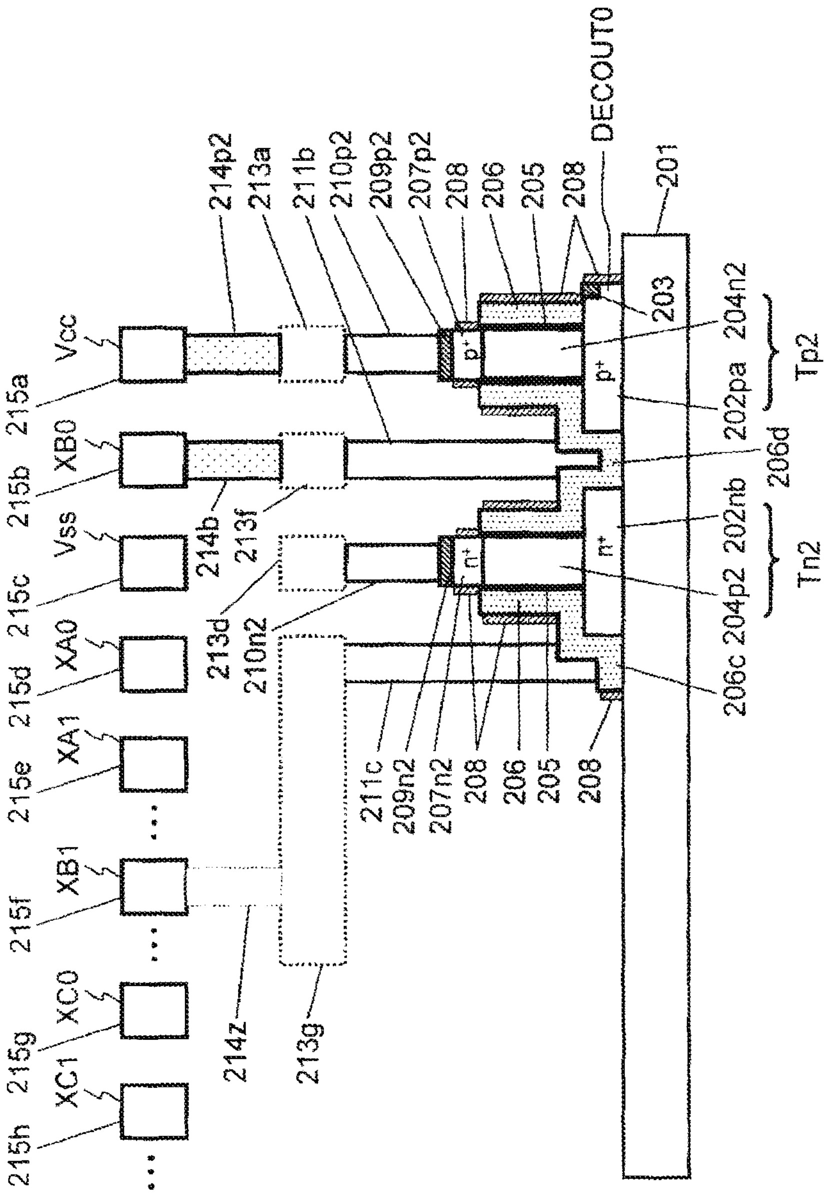
FIG. 11C is a cross-sectional view of the row selection decoder according to the seventh embodiment of the present invention.
Figure 11D:
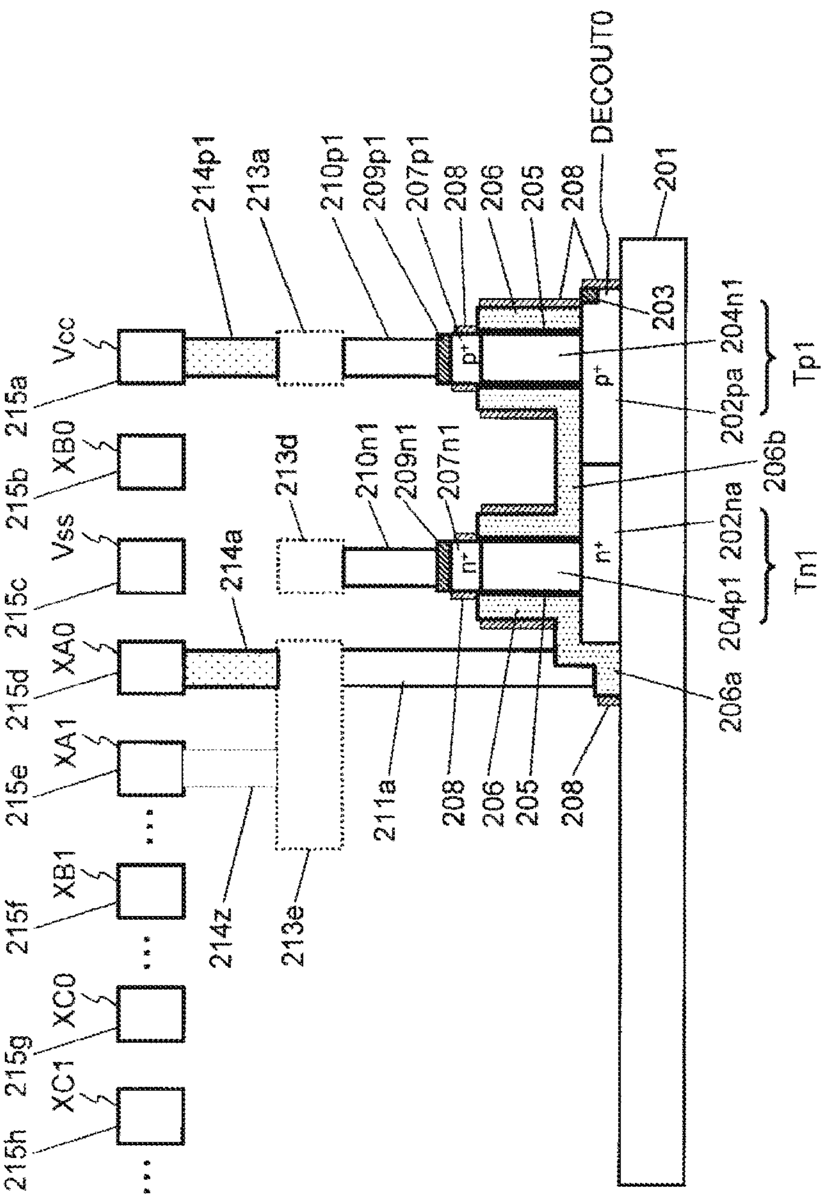
FIG. 11D is a cross-sectional view of the row selection decoder according to the seventh embodiment of the present invention.
Figure 11E:
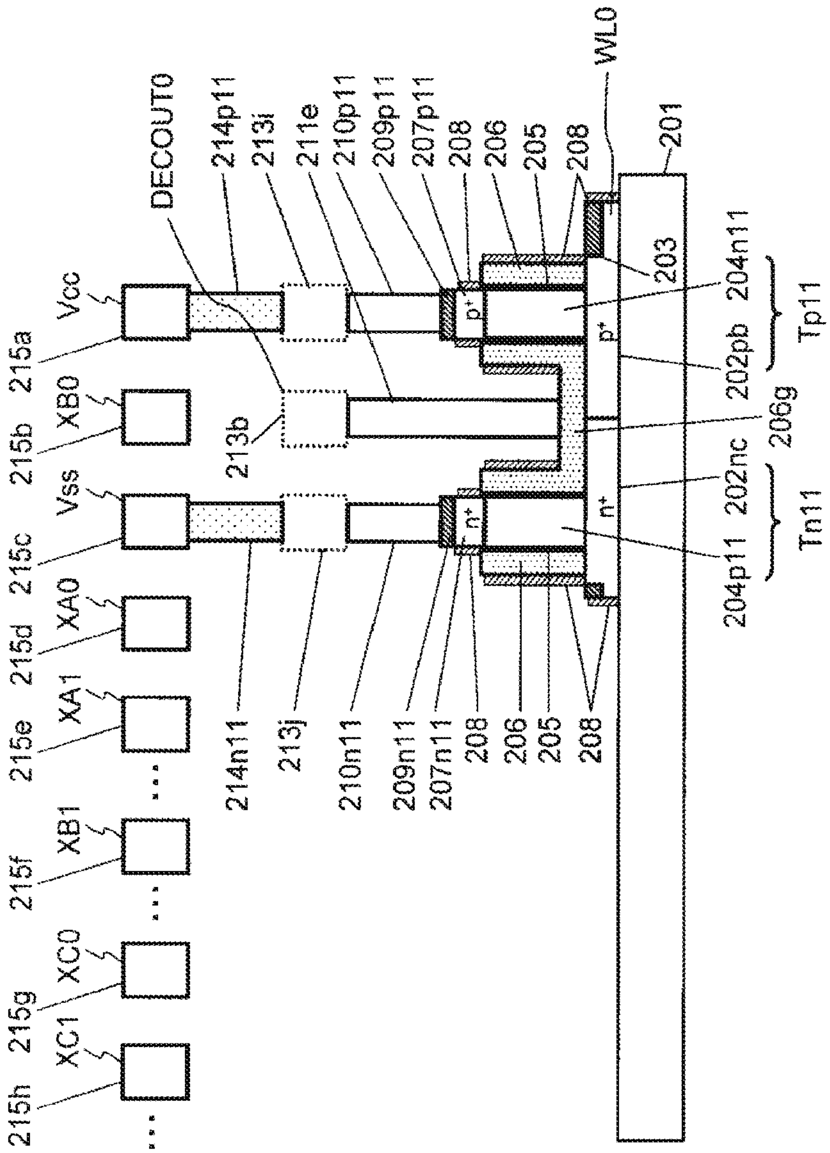
FIG. 11E is a cross-sectional view of the row selection decoder according to the seventh embodiment of the present invention.
Figure 11F:
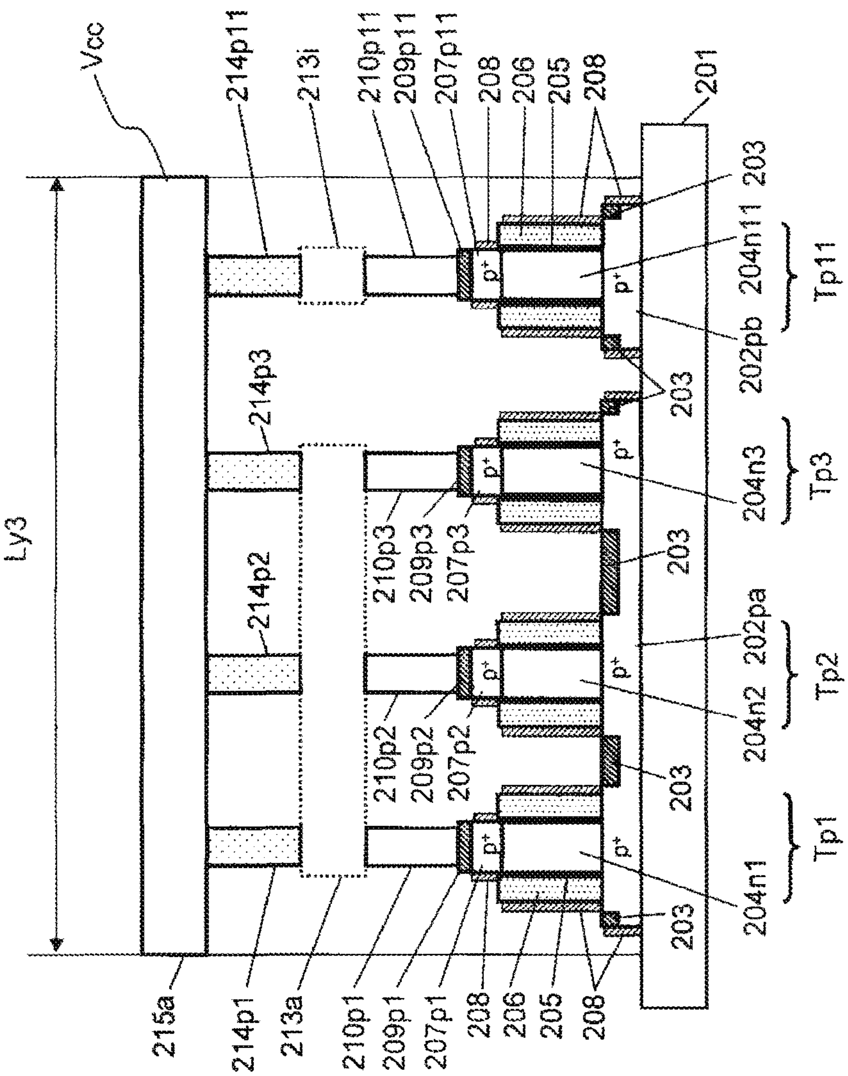
FIG. 11F is a cross-sectional view of the row selection decoder according to the seventh embodiment of the present invention.
Figure 11G:
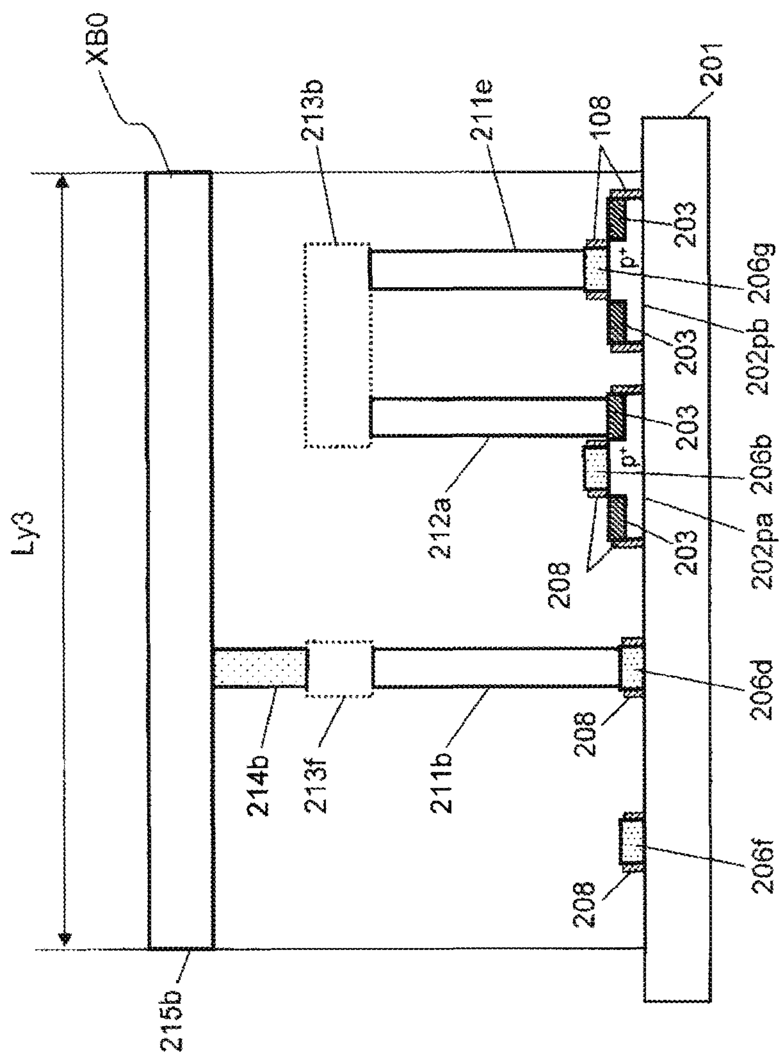
FIG. 11G is a cross-sectional view of the row selection decoder according to the seventh embodiment of the present invention.
Figure 11H:
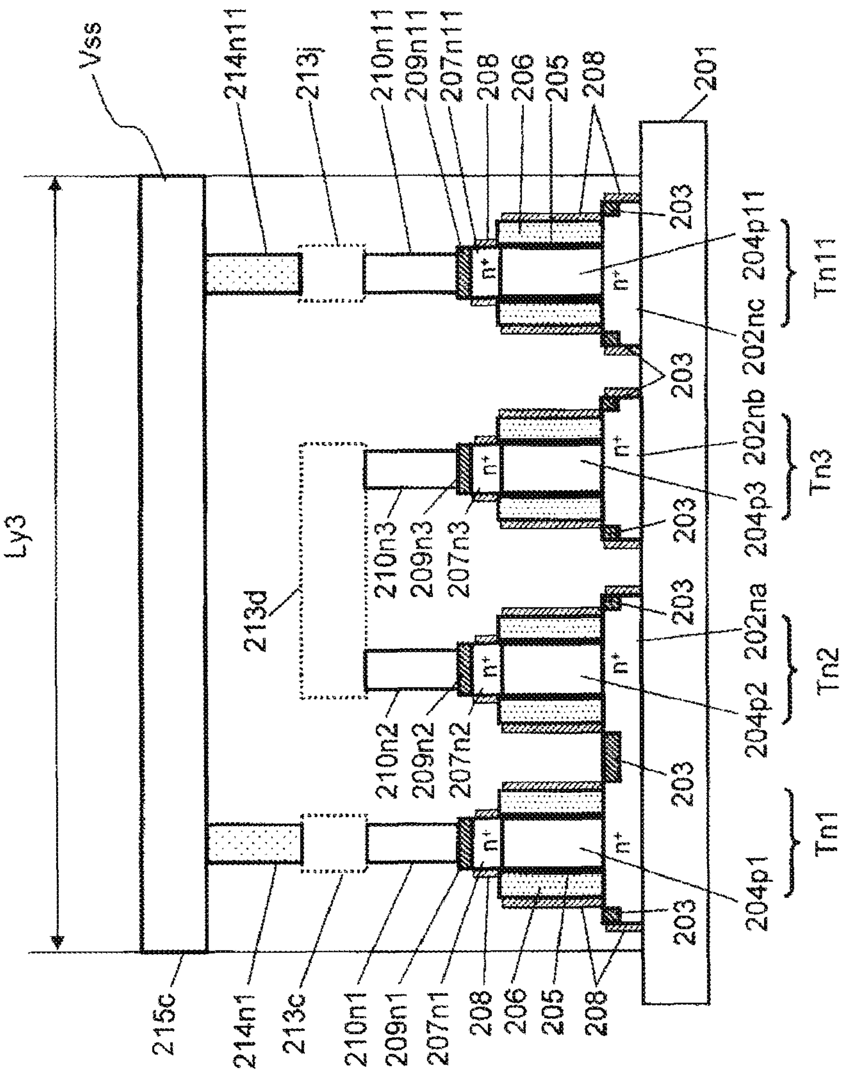
FIG. 11H is a cross-sectional view of the row selection decoder according to the seventh embodiment of the present invention.

FIGS. 11A, 11B, 11C, 11D, 11E, 11F, 11G, and 11H illustrate a seventh embodiment. This embodiment relates to a row selection decoder and implements the equivalent circuit illustrated in FIG. 5. FIG. 11A is a plan view of a layout (arrangement) of a row selection decoder according to this embodiment. FIG. 11B is a cross-sectional view taken along cut line A-A' in FIG. 11A. FIG. 11C is a cross-sectional view taken along cut line B-B' in FIG. 11A. FIG. 11D is a cross-sectional view taken along cut line C-C' in FIG. 11A. FIG. 11E is a cross-sectional view taken along cut line D-D' in FIG. 11A. FIG. 11F is a cross-sectional view taken along cut line E-E' in FIG. 11A. FIG. 11G is a cross-sectional view taken along cut line F-F' in FIG. 11A. FIG. 11H is a cross-sectional view taken along cut line G-G' in FIG. 11A.

This embodiment is significantly different from other embodiments in that the PMOS transistors Tp1, Tp2, and Tp3 that constitute the NAND decoder 201*k*, and the PMOS transistor Tp11 that constitutes the inverter 202 are arranged in a column (in the longitudinal direction on the right of FIG. 11A), and that the NMOS transistors Tn1, Tn2, Tn3, and Tn11 are similarly arranged in a column (in the longitudinal direction on the left of FIG. 11A). The row and the column are defined relatively and flipped upon rotation by 90°. However, in this embodiment, a row selection decoder that is aligned with memory cells arranged in a matrix is structured, and the lateral direction is defined as a row direction while the longitudinal direction is defined as a column direction.

That is, in this embodiment, the PMOS transistor Tp3 and the NMOS transistor Tn3 are arranged in the first row in order from the right, the PMOS transistor Tp2 and the NMOS transistor Tn2 are arranged in the second row in order from the right, the PMOS transistor Tp1 and the NMOS transistor Tn1 are arranged in the third row in order from the right, and the PMOS transistor Tp11 and the NMOS transistor Tn11 are arranged in the fourth row in order from the right.

Note that in FIGS. 11A, 11B, 110, 11D, 11E, 11F, 11G, and 11H, a portion having the same structure as the corresponding one in FIGS. 4A to 4I and FIGS. 6A to 6E is denoted by a corresponding reference numeral in the two hundreds.

On an insulating film, such as a buried oxide (BOX) film layer 201, formed on a substrate, planer silicon layers (hereinafter also referred to as lower diffusion layers) 202*pa*, 202*pb*, 202*na*, 202*nb*, and 202*nc* are formed. The planer silicon layers 202*pa*, 202*pb*, 202*na*, 202*nb*, and 202*nc* are respectively formed as a p+ diffusion layer, a p+ diffusion layer, an n+ diffusion layer, an n+ diffusion layer, and an n+ diffusion layer through impurity implantation or the like. Reference numeral 203 denotes a silicide layer formed on the surfaces of the planar silicon layers 202*pa*, 202*pb*, 202*na*, 202*nb*, and 202*nc*, and the silicide layer 203 connects the planar silicon layers 202*pa* and 202*na* to each other and connects the planar silicon layers 202*pb* and 202*nc* to each other. Reference numerals 204*n*1, 204*n*2, 204*n*3, and 204*n*11 denote n-type silicon pillars. Reference numerals 204*p*1, 204*p*2, 204*p*3, and 204*p*11 denote p-type silicon pillars. Reference numeral 205 denotes a gate insulating film that surrounds the silicon pillars 204*n*1, 204*n*2, 204*n*3, 204*n*11, 204*p*1, 204*p*2, 204*p*3, and 204*p*11. Reference numeral 206 denotes a gate electrode. Reference numerals 206*a*, 206*b*, 206*c*, 206*d*, 206*e*, 206*f*, and 206*g* denote gate lines. On the top portions of the silicon pillars 204*n*1, 204*n*2, 204*n*3, and 204*n*11, p+ diffusion layers (hereinafter also referred to as upper diffusion layers) 207*p*1, 207*p*2, 207*p*3, and 207*p*11 are respectively formed through impurity implantation or the like. On the top portions of the silicon pillars 204*p*1, 204*p*2, 204*p*3, and 204*p*11, n+ diffusion layers (hereinafter also referred to as upper diffusion layers) 207*n*1, 207*n*2, 207*n*3, and 207*n*11 are respectively formed through impurity implantation or the like. Reference numeral 208 denotes a silicon nitride film for protecting the gate insulating film 205. Reference numerals 209*p*1, 209*p*2, 209*p*3, 209*p*11, 209*n*1, 209*n*2, 209*n*3, and 209*n*11 denote silicide layers respectively connected to the p+ diffusion layers 207*p*1, 207*p*2, 207*p*3, and 207*p*11 and the n+ diffusion layers 207*n*1, 207*n*2, 207*n*3, and 207*n*11. Reference numerals 210*p*1, 210*p*2, 210*p*3, 210*p*11, 210*n*1, 210*n*2, 210*n*3, and 210*n*11 denote contacts that respectively connect the silicide layers 209*p*1, 209*p*2, 209*p*3, 209*p*11, 209*n*1, 209*n*2, 209*n*3, and 209*n*11 to first metal lines 213*a*, 213*a*, 213*a*, 213*i*, 213*d*, 213*d*, 213*c*, and 213*j*. Reference numeral 211*a* denotes a contact that connects the gate line 206*a* to a first metal line 213*e*. Reference numeral 211*b* denotes a contact that connects the gate line 206*d* to a first metal line 213*f*. Reference numeral 211*c* denotes a contact that connects the gate line 206*c* to a first metal line 213*g*. Reference numeral 211*d* denotes a contact that connects the gate line 206*e* to a first metal line 213*h*. Reference numeral 211*e* denotes a contact that connects the gate line 206*g* to a first metal line 213*b*.

Reference numeral 212*a* denotes a contact that connects the silicide layer 203 connecting the lower diffusion layer 202*pa* and the lower diffusion layer 202*na* to each other to the first metal line 213*b*.

The silicon pillar 204*n*1, the lower diffusion layer 202*pa*, the upper diffusion layer 207*p*1, the gate insulating film 205, and the gate electrode 206 constitute the PMOS transistor Tp1. The silicon pillar 204*n*2, the lower diffusion layer 202*pa*, the upper diffusion layer 207*p*2, the gate insulating film 205, and the gate electrode 206 constitute the PMOS transistor Tp2. The silicon pillar 204*n*3, the lower diffusion layer 202*pa*, the upper diffusion layer 207*p*3, the gate insulating film 205, and the gate electrode 206 constitute the PMOS transistor Tp3. The silicon pillar 204*n*11, the lower diffusion layer 202*pb*, the upper diffusion layer 207*p*11, the gate insulating film 205, and the gate electrode 206 constitute the PMOS transistor Tp11. The silicon pillar 204*p*1, the lower diffusion layer 202*na*, the upper diffusion layer 207*n*1, the gate insulating film 205, and the gate electrode 206 constitute the NMOS transistor Tn1. The silicon pillar 204*p*2, the lower diffusion layer 202*nb*, the upper diffusion layer 207*n*2, the gate insulating film 205, and the gate electrode 206 constitute the NMOS transistor Tn2. The silicon pillar 204*p*3, the lower diffusion layer 202*nb*, the upper diffusion layer 207*n*3, the gate insulating film 205, and the gate electrode 206 constitute the NMOS transistor Tn3. The silicon pillar 204*p*11, the lower diffusion layer 202*nc*, the upper diffusion layer 207*n*11, the gate insulating film 205, and the gate electrode 206 constitute the NMOS transistor Tn11.

To the gate electrodes 206 of the PMOS transistor Tp1 and the NMOS transistor Tn1, the gate line 206*b* is connected. Further, to the gate electrode 206 of the NMOS transistor Tn1, the gate line 206*a* is connected. To the gate electrodes 206 of the PMOS transistor Tp2 and the NMOS transistor Tn2, the gate line 206*d* is connected. Further, to the gate electrode 206 of the NMOS transistor Tn2, the gate line 206*c* is connected. To the gate electrodes 206 of the PMOS transistor Tp3 and the NMOS transistor Tn3, the gate line 206*f* is connected. Further, to the gate electrode 206 of the NMOS transistor Tn3, the gate line 206*e* is connected. To the gate electrodes 206 of the PMOS transistor Tp11 and the NMOS transistor Tn11, the gate line 206*g* is connected.

The lower diffusion layers 202*pa* and 202*na* serve as a common drain of the PMOS transistors Tp1, Tp2, and Tp3 and the NMOS transistor Tn1 via the silicide layer 203, and are connected to the first metal line 213*b* via the contact 212*a*. The first metal line 213*b* serves as output DECOUTO. The upper diffusion layer 207*p*1 that serves as the source of the PMOS transistor Tp1 is connected to the first metal line 213*a* via the silicide layer 209*p*1 and via the contact 210*p*1. The first metal line 213*a* is connected to a second metal line 215*a* via a contact 214*p*1. To the second metal line 215*a*, the supply voltage Vcc is supplied. Here, the second metal line 215*a* extends in a direction perpendicular to the row direction (lateral direction in FIG. 11A). The upper diffusion layer 207*p*2 that serves as the source of the PMOS transistor Tp2 is connected to the first metal line 213*a* that extends along the column direction (longitudinal direction), via the silicide layer 209*p*2 and via the contact 210*p*2. The first metal line 213*a* is connected to the second metal line 215*a* via a contact 214*p*2. The upper diffusion layer 207*p*3 that serves as the source of the PMOS transistor Tp3 is connected to the first metal line 213*a* via the silicide layer 209*p*3 and via the contact 210*p*3. The first metal line 213*a* is connected to the second metal line 215*a* via a contact 214*p*3. The upper diffusion layer 207*n*1 that serves as the source of the NMOS transistor Tn1 is connected to the first metal line 213*d* via the silicide layer 209*n*1 and via the contact 210*n*1. The upper diffusion layer 207*n*2 that serves as the drain of the NMOS transistor Tn2 is connected to the first metal line 213*d* via the silicide layer 209*n*2 and via the contact 210*n*2. Here, the source of the NMOS transistor Tn1 and the drain of the NMOS transistor Tn2 are connected to each other via the first metal line 213*d*. The source of the NMOS transistor Tn2 is connected to the drain of the NMOS transistor Tn3 via the lower diffusion layer 202*nb* and via the silicide layer 203. The source of the NMOS transistor Tn3 is connected to the first metal line 213*c* via the contact 210*n*3. The first metal line 213*c* is connected to a second metal line 215*c* via a contact 214*n*3. To the second metal line 215*c*, the reference voltage Vss is supplied. Here, the second metal line 215*c* extends in the direction perpendicular to the row direction.

The upper diffusion layer 207*p*11 that serves as the source of the PMOS transistor Tp11 is connected to the first metal line 213*i* via the silicide layer 209*p*11 and via the contact 210*p*11. The first metal line 213*i* is connected to the second metal line 215*a* via a contact 214*p*11. Through the second metal line 215*a*, the supply voltage Vcc is supplied. The upper diffusion layer 207*n*11 that serves as the source of the NMOS transistor Tn11 is connected to the first metal line 213*j* via the silicide layer 209*n*11 and via the contact 210*n*11. The first metal line 213*j* is connected to the second metal line 215*c* via a contact 214*n*11. Through the second metal line 215*c*, the reference voltage Vss is supplied. The lower diffusion layer 202*pb* that serves as the drain of the PMOS transistor Tp11, and the lower diffusion layer 202*nc* that serves as the drain of the NMOS transistor Tn11 are connected in common via the silicide layer 203, and serve as output WL0 of the row selection decoder of this embodiment.

The gate line 206*a* that receives any of the selection address signals XA0 to XA7 supplied through second metal lines is connected to the first metal line 213*e* via the contact 211*a*. The first metal line 213*e* extends in a direction parallel to the row (to the left of FIG. 11A). The selection address signal lines XA0 to XA7 extend in the direction perpendicular to the row direction. A contact 214*a* is arranged at one of the intersection points of the first metal line 213*e* that extends parallel to the row direction and the selection address signal lines XA0 to XA7 that extend in the direction perpendicular to the row direction, and connects a selection address signal XAh (h=0 to 7) to the gate line 206*a*. In FIG. 11A and so on, the contact 214*a* is provided at the intersection point of a second metal line 215*d* for the selection address signal XA0 and the first metal line 213*e*. That is, to the gate of the PMOS transistor Tp1 and to the gate of the NMOS transistor Tn1 of the NAND decoder of this embodiment, the selection address signal XA0 is input.

In FIG. 11A and so on, although the selection address signal lines XA2 to XA7 are not illustrated, the selection address signal lines XA2 to XA7 are arranged to the left of the selection address signal line XA1 and extend in the direction perpendicular to the row direction similarly to the selection address signal lines XA0 and XA1.

Note that at the intersection point of the selection address signal line XA1 (second metal line 215*e*) and the first metal line 213*e*, a contact 214*z* is illustrated with a dotted line in FIG. 11A and so on, which indicates that no contact is present at the intersection point. The location of the contact illustrated with a dotted line indicates the location of a possible contact that is to be provided in a case where the selection address signal XA1 (second metal line 215*e*) is to be input. Other similar locations have the same meaning.

The gate line 206*d* that selectively receives the selection address signal XB0 supplied through a second metal line (that is, the selection address signal XB0 is input only to a selected decoder) is connected to the first metal line 213*f* via the contact 211*b*. The gate line 206*c* that receives any of the selection address signals XB1 to XB3 is connected to the first metal line 213*g* via the contact 211*c*. The first metal line 213*g* extends in the direction parallel to the row (to the left of FIG. 11A). The selection address signal lines XB0 to XB3 extend in the direction perpendicular to the row direction. A contact 214*b* is arranged at one of the intersection points of the first metal line 213*f* or 213*g* and the selection address signal lines XB0 to XB3, and connects a selection address signal XBi (i=0 to 3) to the gate line 206*d* or 206*c*. In FIG. 11A and so on, the contact 214*b* is provided at the intersection point of a second metal line 215*b* for the selection address signal XB0 and the first metal line 213*f*. That is, to the gate of the PMOS transistor Tp2 and to the gate of the NMOS transistor Tn2 of the NAND decoder of this embodiment, the selection address signal XB0 is input.

Note that at the intersection point of the selection address signal line XB1 (second metal line 215*f*) and the first metal line 213*g*, a contact 214*z* is illustrated with a dotted line in FIG. 11A, which indicates that no contact is present at the intersection, point, as described above. The location of a contact illustrated with a dotted line indicates the location of a possible contact.

The gate line 206*e* that receives any of the selection address signals XC0 to XC7 supplied through second metal lines is connected to the first metal line 213*h* via the contact 211*d*. The first metal line 213*h* extends in the direction parallel to the row (to the left of FIG. 11A). The selection address signal lines XC0 to XC7 extend in the direction perpendicular to the row direction. A contact 214*c* is arranged at one of the intersection points of the first metal line 213*h* and the selection address signal lines XC0 to XC7, and connects a selection address signal XCj (j=0 to 7) to the gate line 206*e*. In FIG. 11A and so on, the contact 214*c* is provided at the intersection point of a second metal line 215*g* for the selection address signal XC0 and the first metal line 213*h*. That is, to the gate of the PMOS transistor Tp3 and to the gate of the NMOS transistor Tn3 of the NAND decoder of this embodiment, the selection address signal XC0 is input.

Note that at the intersection point of the selection address signal line XC1 (second metal line 215*h*) and the first metal line 213*h*, a contact 214*z* is illustrated with a dotted line in FIG. 11A, which indicates that no contact is present at the intersection point, as described above. The location of a contact illustrated with a dotted line indicates the location of a possible contact.

In FIG. 11A and so on, although the selection address signal lines XC2 to XC7 are not illustrated for convenience sake, the selection address signal lines XC2 to XC7 are arranged to the left of the selection address signal line XC1 and extend in the direction perpendicular to the row direction similarly to the selection address signal lines XC0 and XC1.

In this embodiment, the selection address signals XA0, XB0, and XC0 are input to the row selection decoder of this embodiment, and WL0 is selected as output in accordance with FIG. 2.

The row selection decoder of this embodiment (row selection decoder BL2000) corresponds to a region surrounded by a frame in FIG. 11A, and the dimension in the longitudinal direction denoted by Ly3 is twice the dimension of the SRAM cell illustrated in FIG. 20A, that is, 2 Ly1.

According to this embodiment, the supply voltage line, reference voltage line, and selection address signal lines are implemented as the second metal lines and extend in the direction perpendicular to the row direction of the row selection decoder having a four-row two-column arrangement, and the input gates of the NAND decoder are connected to the second metal lines via the first metal lines that are arranged in parallel to the row direction to thereby enable supply of any selection address signals to the input of the NAND decoder. Consequently, a row selection decoder that allows arrangement in accordance with the minimum pitch of the second metal lines and has a smaller area can be implemented. Further, eight MOS transistors are arranged in four rows and two columns to thereby reduce the dimension in the lateral direction and further reduce the area of the row selection decoder.

Note that although the row selection decoder is constituted by a NAND decoder and an inverter, a NAND decoder alone, that is, a three-row two-column arrangement, also falls within the spirit of the present invention.

Eighth Embodiment

Figure 12A:
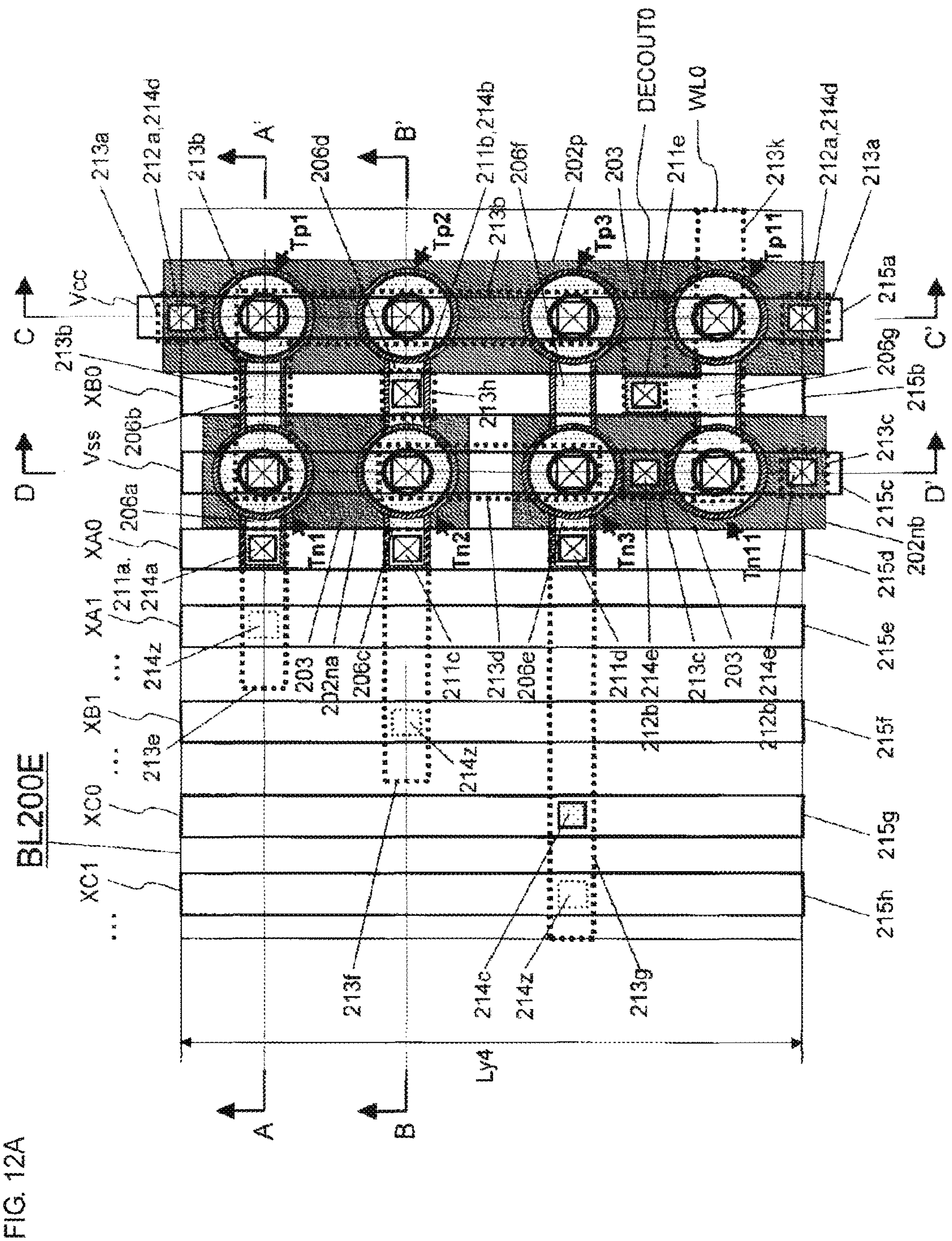
FIG. 12A is a plan view of a row selection decoder according to an eighth embodiment of the present invention.
Figure 12B:
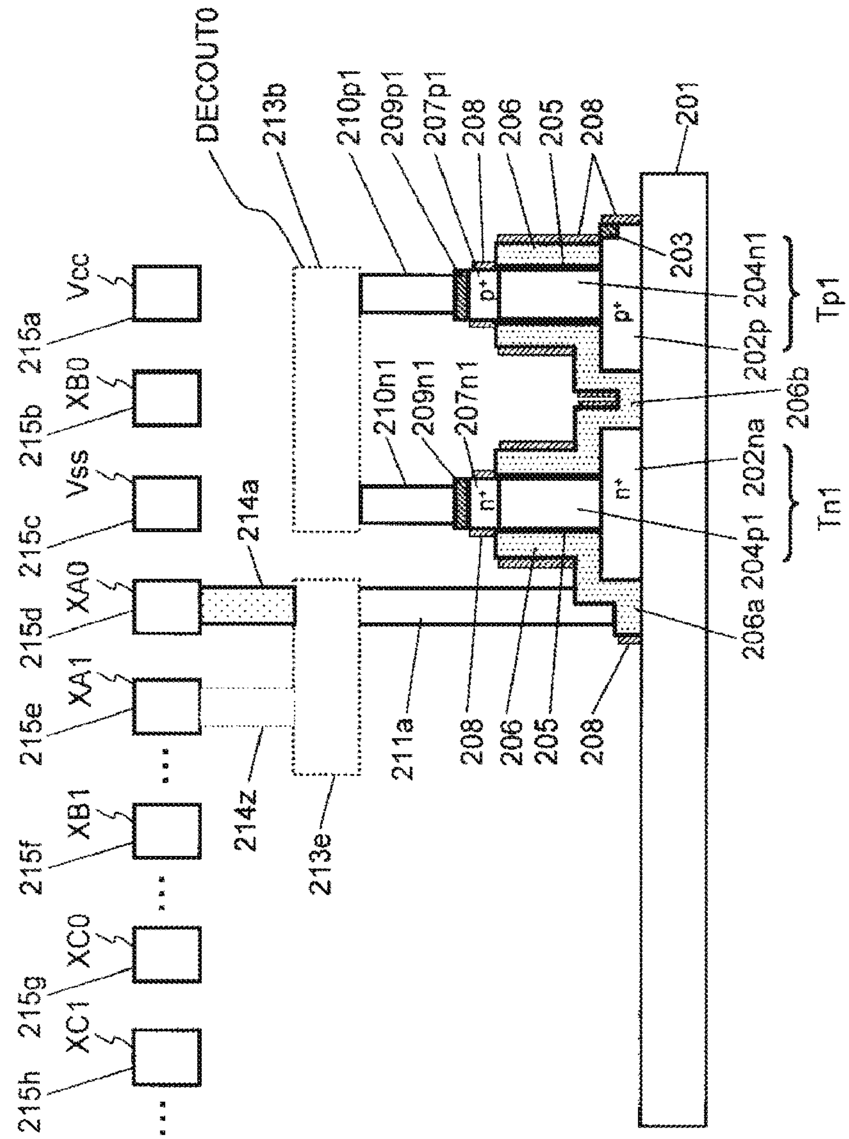
FIG. 12B is a cross-sectional view of the row selection decoder according to the eighth embodiment of the present invention.
Figure 12C:
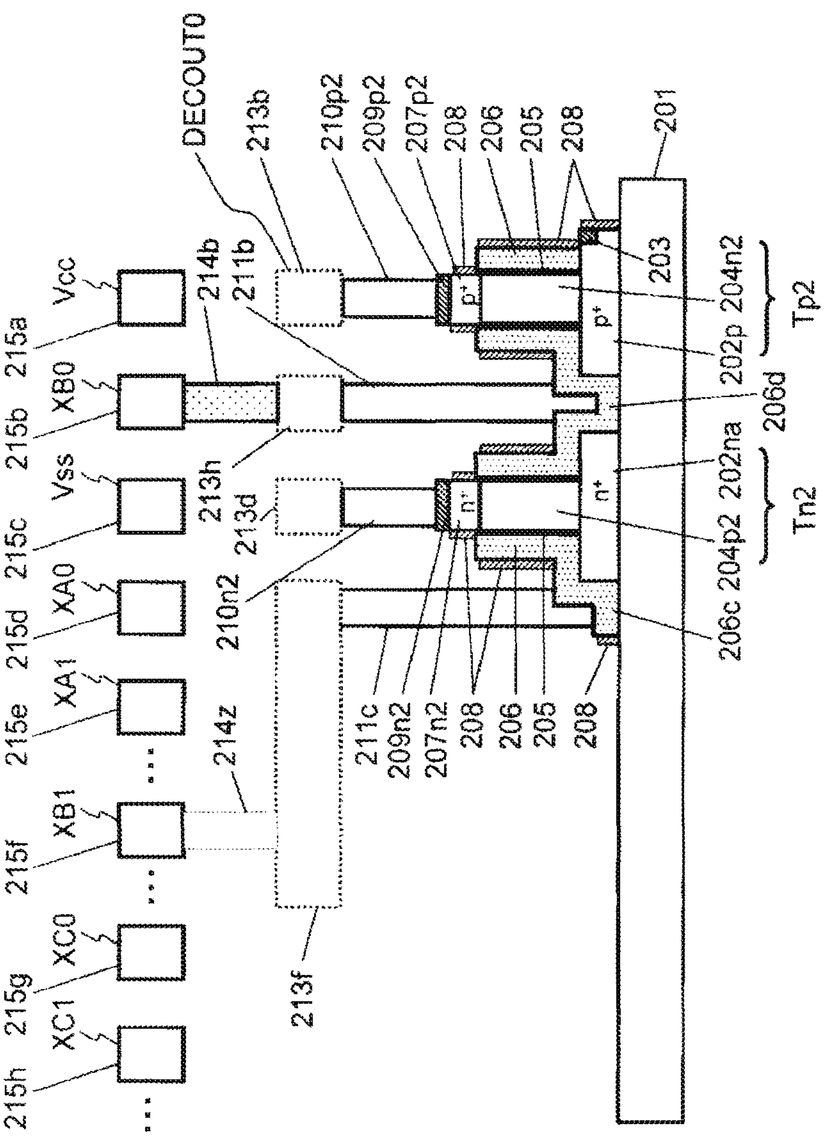
FIG. 12C is a cross-sectional view of the row selection decoder according to the eighth embodiment of the present invention.
Figure 12D:
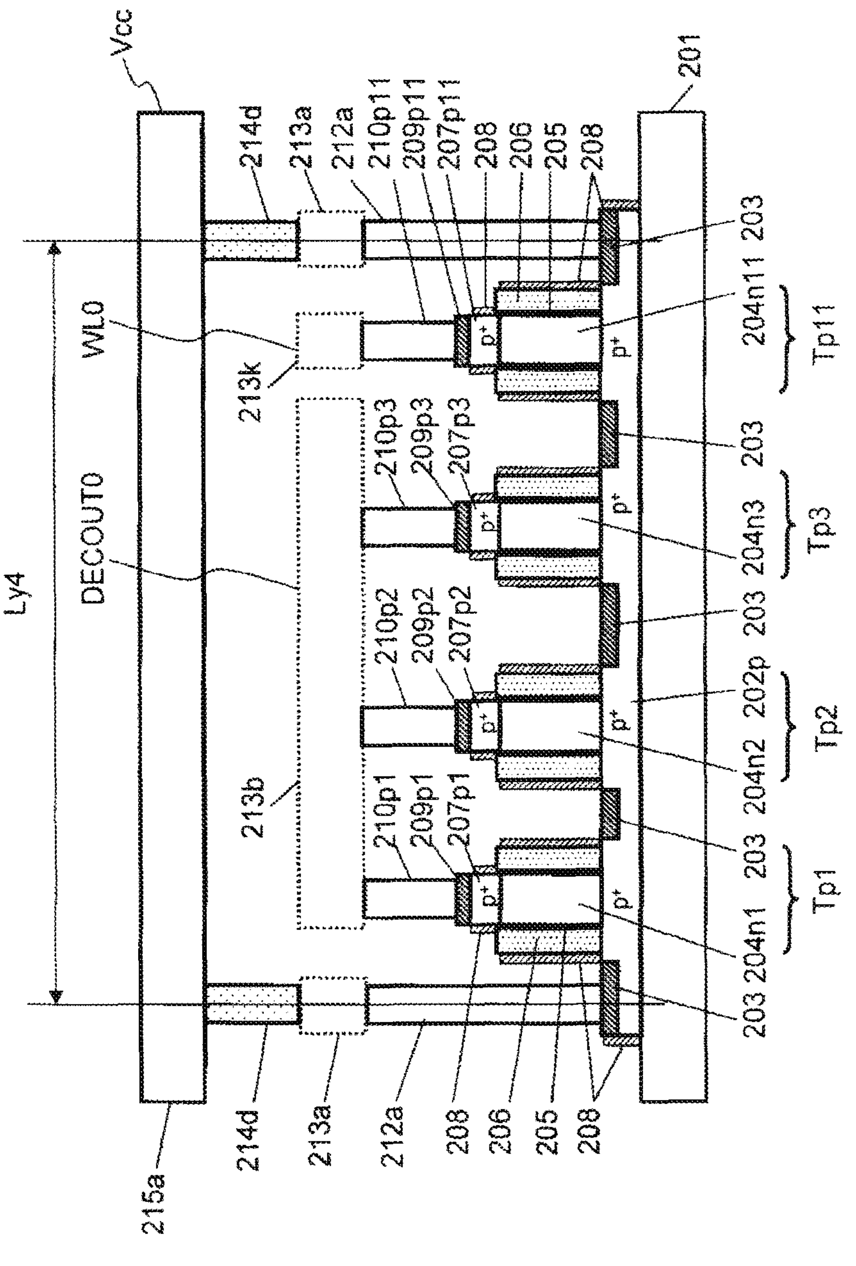
FIG. 12D is a cross-sectional view of the row selection decoder according to the eighth embodiment of the present invention.
Figure 12E:
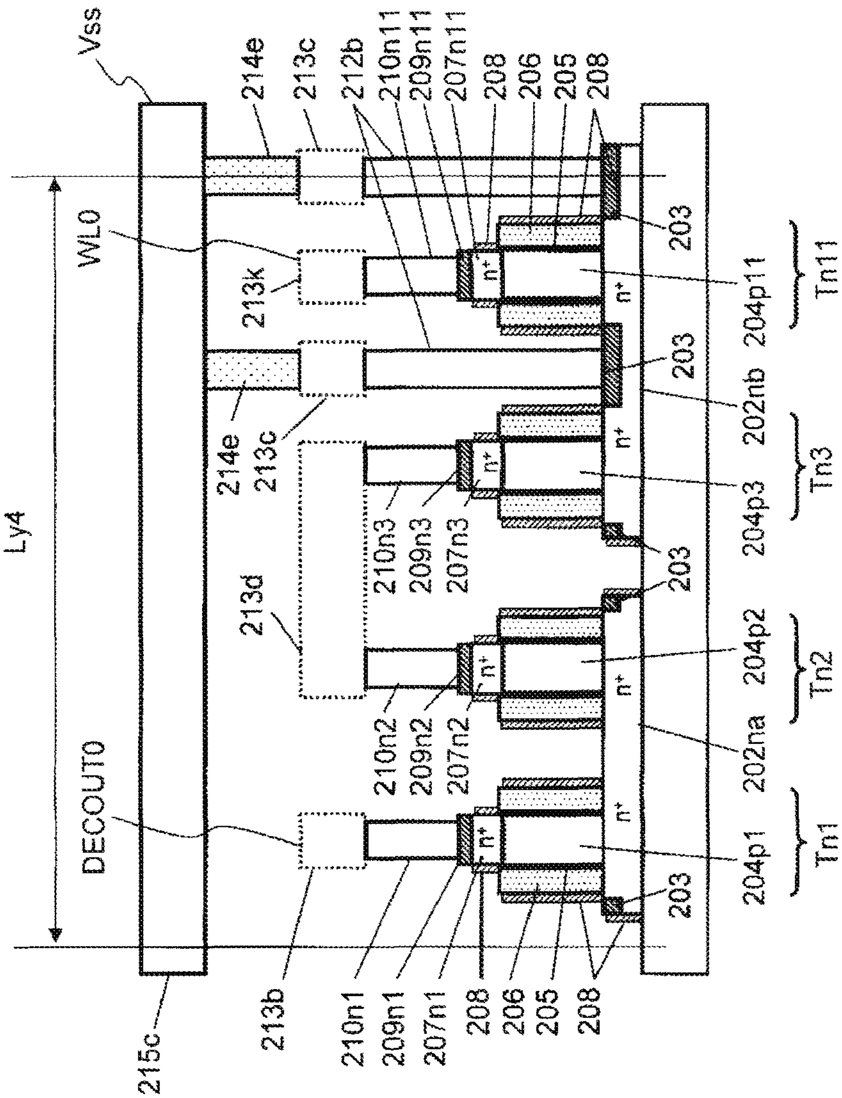
FIG. 12E is a cross-sectional view of the row selection decoder according to the eighth embodiment of the present invention.

FIGS. 12A, 128, 12C, 12D, and 12E illustrate an eighth embodiment. This embodiment relates to a row selection decoder and implements the equivalent circuit illustrated in FIG. 5. FIG. 12A is a plan view of a layout (arrangement) of a row selection decoder according to this embodiment. FIG. 128 is a cross-sectional view taken along cut line A-A' in FIG. 12A. FIG. 12C is a cross-sectional view taken along cut line 8-8' in FIG. 12A. FIG. 12D is a cross-sectional view taken along cut line C-C' in FIG. 12A. FIG. 12E is a cross-sectional view taken along cut line D-D' in FIG. 12A.

Also in this embodiment, the PMOS transistors Tp1, Tp2, and Tp3 that constitute the NAND NAND decoder 201*k* and the PMOS transistor Tp11 that constitutes the inverter 202 are arranged in a column (in the longitudinal direction on the right of FIG. 12A), and the NMOS transistors Tn1, Tn2, Tn3, and Tn11 are similarly arranged in a column (in the longitudinal direction on the left of FIG. 12A), as in the seventh embodiment (FIG. 11A).

That is, in this embodiment, the PMOS transistor Tp1 and the NMOS transistor Tn1 are arranged in the first row in order from the right, the PMOS transistor Tp2 and the NMOS transistor Tn2 are arranged in the second row in order from the right, the PMOS transistor Tp3 and the NMOS transistor Tn3 are arranged in the third row in order from the right, and the PMOS transistor Tp11 and the NMOS transistor Tn11 are arranged in the fourth row in order from the right.

Further, in this embodiment, the sources of the PMOS transistors Tp1, Tp2, and Tp3 and the NMOS transistors Tn1, Tn2, and Tn3 and the drains thereof are arranged so as to be reversed in an up-down direction, and the drains of the PMOS transistors Tp1, Tp2, and Tp3 and the drain of the NMOS transistor Tn1 are connected in common via contacts, as in the fourth embodiment (FIG. 8A and so on).

Note that in FIGS. 12A, 12B, 12C, 12D, and 12E, a portion having the same structure as the corresponding one in FIGS. 11A to 11H is denoted by a corresponding reference numeral in the two hundreds.

On an insulating film, such as a buried oxide (BOX) film layer 201, formed on a substrate, planer silicon layers (hereinafter also referred to as lower diffusion layers) 202*p*, 202*na*, and 202*nb* are formed. The planer silicon layers 202*p*, 202*na*, and 202*nb* are respectively formed as a p+ diffusion layer, an n+ diffusion layer, and an n+ diffusion layer through impurity implantation or the like. Reference numeral 203 denotes a silicide layer formed on the surfaces of the planar silicon layers 202*p*, 202*na*, and 202*nb*. Reference numerals 204*n*1, 204*n*2, 204*n*3, and 204*n*11 denote n-type silicon pillars. Reference numerals 204*p*1, 204*p*2, 204*p*3, and 204*p*11 denote p-type silicon pillars. Reference numeral 205 denotes a gate insulating film that surrounds the silicon pillars 204*n*1, 204*n*2, 204*n*3, 204*n*11, 204*p*1, 204*p*2, 204*p*3, and 204*p*11. Reference numeral 206 denotes a gate electrode. Reference numerals 206*a*, 206*b*, 206*c*, 206*d*, 206*e*, 206*f*, and 206*g* denote gate lines. On the top portions of the silicon pillars 204*n*1, 204*n*2, 204*n*3, and 204*n*11, p+ diffusion layers (hereinafter also referred to as upper diffusion layers) 207*p*1, 207*p*2, 207*p*3, and 207*p*11 are respectively formed through impurity implantation or the like. On the top portions of the silicon pillars 204*p*1, 204*p*2, 204*p*3, and 204*p*11, n+ diffusion layers (hereinafter also referred to as upper diffusion layers) 207*n*1, 207*n*2, 207*n*3, and 207*n*11 are respectively formed through impurity implantation or the like. Reference numeral 208 denotes a silicon nitride film for protecting the gate insulating film 205. Reference numerals 209*p*1, 209*p*2, 209*p*3, 209*p*11, 209*n*1, 209*n*2, 209*n*3, and 209*n*11 denote silicide layers respectively connected to the p+ diffusion layers 207*p*1, 207*p*2, 207*p*3, and 207*p*11 and the n+ diffusion layers 207*n*1, 207*n*2, 207*n*3, and 207*n*11. Reference numerals 210*p*1, 210*p*2, 210*p*3, 210*p*11, 210*n*1, 210*n*2, 210*n*3, and 210*n*11 denote contacts that respectively connect the silicide layers 209*p*1, 209*p*2, 209*p*3, 209*p*11, 209*n*1, 209*n*2, 209*n*3, and 209*n*11 to first metal lines 213*b*, 213*b*, 213*b*, 213*k*, 213*b*, 213*d*, 213*d*, and 213*k*. Reference numeral 211*a* denotes a contact that connects the gate line 206*a* to a first metal line 213*e*. Reference numeral 211*b* denotes a contact that connects the gate line 206*d* to a first metal line 213*h*. Reference numeral 211*c* denotes a contact that connects the gate line 206*c* to a first metal line 213*f*. Reference numeral 211*d* denotes a contact that connects the gate line 206*e* to a first metal line 213*g*.

Reference numeral 212*a* denotes a contact (two contacts 212*a* are arranged, one in an upper portion and the other in a lower portion, in FIG. 12A) that connects the silicide layer 203 covering the lower diffusion layer 202*p* for connection to a first metal line 213*a*. Reference numeral 212*b* denotes a contact (two contacts 212*b* are arranged in FIG. 12A) that connects the silicide layer 203 covering the lower diffusion layer 202*nb* for connection to a first metal line 213*c* (two locations).

The silicon pillar 204*n*1, the lower diffusion layer 202*p*, the upper diffusion layer 207*p*1, the gate insulating film 205, and the gate electrode 206 constitute the PMOS transistor Tp1. The silicon pillar 204*n*2, the lower diffusion layer 202*p*, the upper diffusion layer 207*p*2, the gate insulating film 205, and the gate electrode 206 constitute the PMOS transistor Tp2. The silicon pillar 204*n*3, the lower diffusion layer 202*p*, the upper diffusion layer 207*p*3, the gate insulating film 205, and the gate electrode 206 constitute the PMOS transistor Tp3. The silicon pillar 204*n*11, the lower diffusion layer 202*p*, the upper diffusion layer 207*p*11, the gate insulating film 205, and the gate electrode 206 constitute the PMOS transistor Tp11. The silicon pillar 204*p*1, the lower diffusion layer 202*na*, the upper diffusion layer 207*n*1, the gate insulating film 205, and the gate electrode 206 constitute the NMOS transistor Tn1. The silicon pillar 204*p*2, the lower diffusion layer 202*na*, the upper diffusion layer 207*n*2, the gate insulating film 205, and the gate electrode 206 constitute the NMOS transistor Tn2. The silicon pillar 204*p*3, the lower diffusion layer 202*nb*, the upper diffusion layer 207*n*3, the gate insulating film 205, and the gate electrode 206 constitute the NMOS transistor Tn3. The silicon pillar 204*p*11, the lower diffusion layer 202*nb*, the upper diffusion layer 207*n*11, the gate insulating film 205, and the gate electrode 206 constitute the NMOS transistor Tn11.

To the gate electrodes 206 of the PMOS transistor Tp1 and the NMOS transistor Tn1, the gate line 206*b* is connected. Further, to the gate electrode 206 of the NMOS transistor Tn1, the gate line 206*a* is connected. To the gate electrodes 206 of the PMOS transistor Tp2 and the NMOS transistor Tn2, the gate line 206*d* is connected. Further, to the gate electrode 206 of the NMOS transistor Tn2, the gate line 206*c* is connected. To the gate electrodes 206 of the PMOS transistor Tp3 and the NMOS transistor Tn3, the gate line 206*f* is connected. Further, to the gate electrode 206 of the NMOS transistor Tn3, the gate line 206*e* is connected. To the gate electrodes 206 of the PMOS transistor Tp11 and the NMOS transistor Tn11, the gate line 206*g* is connected.

The sources of the PMOS transistors Tp1, Tp2, Tp3, and Tp11 are formed of the lower diffusion layer 202*p*, and the lower diffusion layer 202*p* is connected to the first metal line 213*a* via the silicide layer 203 and via the contact 212*a* (two contacts 212*a* are arranged, one in an upper portion and the other in a lower portion, in FIG. 12A). The first metal line 213*a* is connected to a second metal line 215*a* via a contact 214*d*. To the second metal line 215*a*, the supply voltage Vcc is supplied. Here, the second metal line 215*a* extends in a direction perpendicular to the row direction. The upper diffusion layer 207*p*1 that serves as the drain of the PMOS transistor Tp1 is connected to the first metal line 213*b* via the silicide layer 209*p*1 and via the contact 210*p*1. The first metal line 213*b* serves as output DECOUTO. The upper diffusion layer 207*p*2 that serves as the drain of the PMOS transistor Tp2 is connected to the first metal line 213*b* via the silicide layer 209*p*2 and via the contact 210*p*2. The upper diffusion layer 207*p*3 that serves as the drain of the PMOS transistor Tp3 is connected to the first metal line 213*b* via the silicide layer 209*p*3 and via the contact 210*p*3. The upper diffusion layer 207*n*1 that serves as the drain of the NMOS transistor Tn1 is connected to the first metal line 213*b* via the silicide layer 209*n*1 and via the contact 210*n*1. Here, the drains of the PMOS transistors Tp1, Tp2, and Tp3 and the drain of the NMOS transistor Tn1 are connected in common to the first metal line 213*b* via the contacts, as described above. The lower diffusion layer 202*na* that serves as the source of the NMOS transistor Tn1 is connected to the drain of the NMOS transistor Tn2 via the silicide layer 203. The upper diffusion layer 207*n*2 that serves as the source of the NMOS transistor Tn2 is connected to the first metal line 213*d* via the silicide layer 209*n*2 and via the contact 210*n*2. The upper diffusion layer 207*n*3 that serves as the drain of the NMOS transistor Tn3 is connected to the first metal line 213*d* via the silicide layer 209*n*3 and via the contact 210*n*3. Here, the source of the NMOS transistor Tn2 and the drain of the NMOS transistor Tn3 are connected to each other via the first metal line 213*d*. The source of the NMOS transistor Tn3 is formed of the lower diffusion layer 202*nb*, and the lower diffusion layer 202*nb* is connected to the first metal line 213*c* via the silicide layer 203 and via the contact 212*b* (at two locations in FIG. 12E). The first metal line 213*c* is connected to a second metal line 215*c* via a contact 214*e*. To the second metal line 215*c*, the reference voltage Vss is supplied. Here, the second metal line 215*c* extends in the direction perpendicular to the row direction.

The source of the PMOS transistor Tp11 is formed of the lower diffusion layer 202*p*, and the lower diffusion layer 202*p* is shared with the PMOS transistors Tp1, Tp2, and Tp3 via the silicide layer 203 and is connected to the second metal line 215*a* via the contact 212*a* and via the first metal line 213*a*. To the second metal line 215*a*, the supply voltage Vcc is supplied. The upper diffusion layer 207*p*11 that serves as the drain of the PMOS transistor Tp11 is connected to the first metal line 213*k* via the silicide layer 209*p*11 and via the contact 210*p*11. The first metal line 213*k* serves as output WL0. The upper diffusion layer 207*n*11 that serves as the drain of the NMOS transistor Tn11 is connected to the first metal line 213*k* via the silicide layer 209*n*11 and via the contact 210*n*11.

The gate line 206*a* that receives any of the selection address signals XA0 to XA7 supplied through second metal lines is connected to the first metal line 213*e* via the contact 211*a*. The first metal line 213*e* extends in a direction parallel to the row (to the left of FIG. 12A). The selection address signal lines XA0 to XA7 extend in the direction perpendicular to the row direction. A contact 214*a* is arranged at one of the intersection points of the first metal line 213*e* that extends parallel to the row direction and the selection address signal lines XA0 to XA7 that extend in the direction perpendicular to the row direction, and connects a selection address signal XAh (h=0 to 7) to the gate line 206*a*. In FIG. 12A and so on, the contact 214*a* is provided at the intersection point of a second metal line 215*d* for the selection address signal XA0 and the first metal line 213*e*. That is, to the gate of the PMOS transistor Tp1 and to the gate of the NMOS transistor Tn1 of the NAND decoder of this embodiment, the selection address signal XA0 is input.

In FIG. 12A and so on, although the selection address signal lines XA2 to XA7 are not illustrated, the selection address signal lines XA2 to XA7 are arranged to the left of the selection address signal line XA1 and extend in the direction perpendicular to the row direction similarly to the selection address signal lines XA0 and XA1.

Note that at the intersection point of the selection address signal line XA1 (second metal line 215*e*) and the first metal line 213*e*, a contact 214*z* is illustrated with a dotted line in FIG. 12A and so on, which indicates that no contact is present at the intersection point. The location of the contact illustrated with a dotted line indicates the location of a possible contact that is to be provided in a case where the selection address signal XA1 (second metal line 215*e*) is to be input.

The gate line 206*d* that selectively receives the selection address signal XB0 supplied through a second metal line is connected to the first metal line 213*h* via the contact 211*b*. The gate line 206*c* that receives any of the selection address signals XB1 to XB3 is connected to the first metal line 213*f* via the contact 211*c*. The first metal line 213*f* extends in the direction parallel to the row (to the left of FIG. 12A). The selection address signal lines XB0 to XB3 extend in the direction perpendicular to the row direction. A contact 214*b* is arranged at one of the intersection points of the first metal line 213*f* or 213*h* and the selection address signal lines XB0 to XB3, and connects a selection address signal XBi (I=0 to 3) to the gate line 206*d* or 206*c*. In FIG. 12A and so on, the contact 214*b* is provided at the intersection point of a second metal line 215*b* for the selection address signal XB0 and the first metal line 213*h*. That is, to the gate of the PMOS transistor Tp2 and to the gate of the NMOS transistor Tn2 of the NAND decoder of this embodiment, the selection address signal XB0 is input.

Note that at the intersection point of the selection address signal line XB1 (second metal line 215*f*) and the first metal line 213*f*, a contact 214*z* is illustrated with a dotted line in FIG. 12A and so on, which indicates that no contact is present at the intersection point, as described above. The location of a contact illustrated with a dotted line indicates the location of a possible contact.

The gate line 206*e* that receives any of the selection address signals XC0 to XC7 supplied through second metal lines is connected to the first metal line 213*g* via the contact 211*d*. The first metal line 213*g* extends in the direction parallel to the row (to the left of FIG. 12A). The selection address signal lines XC0 to XC7 extend in the direction perpendicular to the row direction. A contact 214*c* is arranged at one of the intersection points of the first metal line 213*g* and the selection address signal lines XC0 to XC7, and connects a selection address signal XCj (j=0 to 7) to the gate line 206*e*. In FIG. 12A, the contact 214*c* is provided at the intersection point of a second metal line 215*g* for the selection address signal XC0 and the first metal line 213*g*. That is, to the gate of the PMOS transistor Tp3 and to the gate of the NMOS transistor Tn3 of the NAND decoder of this embodiment, the selection address signal XC0 is input.

Note that at the intersection point of the selection address signal line XC1 (second metal line 215*h*) and the first metal line 213*g*, a contact 214*z* is illustrated with a dotted line in FIG. 12A, which indicates that no contact is present at the intersection point, as described above. The location of a contact illustrated with a dotted line indicates the location of a possible contact.

In FIG. 12A and so on, although the selection address signal lines XC2 to XC7 are not illustrated for convenience sake, the selection address signal lines XC2 to XC7 are arranged to the left of the selection address signal line XC1 and extend in the direction perpendicular to the row direction similarly to the selection address signal lines XC0 and XC1.

In this embodiment, the selection address signals XA0, XB0, and XC0 are input to the row selection decoder of this embodiment, and WL0 is selected as output in accordance with FIG. 2.

The row selection decoder of this embodiment (row selection decoder BL200E) corresponds to a region surrounded by a frame in FIG. 12A, and the dimension in the longitudinal direction denoted by Ly4 can be made smaller than the dimension Ly3 illustrated in FIG. 11 because there are only 1.5 diffusion intervals, which are dead space, in the longitudinal direction for four rows.

According to this embodiment, the supply voltage line, reference voltage line, and selection address signal lines are implemented as the second metal lines and extend in the direction perpendicular to the row direction of the row selection decoder having a four-row two-column arrangement, and the input gates of the NAND decoder are connected to the second metal lines via the first metal lines that are arranged in parallel to the row direction to thereby enable supply of any selection address signals to the input of the NAND decoder. Consequently, a row selection decoder that allows arrangement in accordance with the minimum pitch of the second metal lines and has a smaller area can be implemented. Further, eight MOS transistors are arranged in four rows and two columns, and the number of locations of the diffusion intervals are reduced to thereby reduce the dimension in the lateral direction and further reduce the area of the row selection decoder.

Ninth Embodiment

Figure 13:
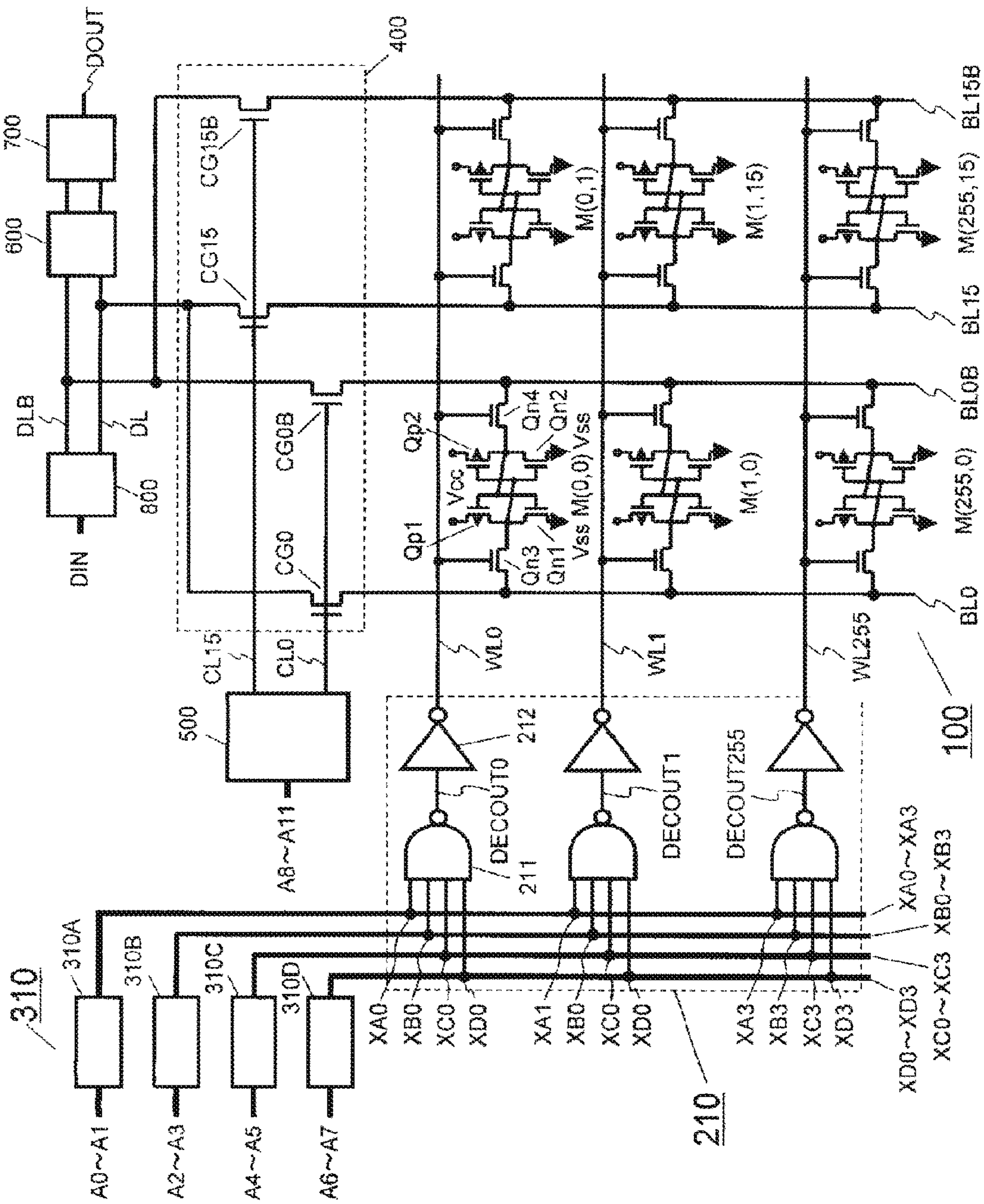
FIG. 13 is a circuit diagram of a semiconductor memory device according to other embodiments of the present invention.

FIG. 13 illustrates another semiconductor memory device that includes SRAM cells. FIG. 13 is different from FIG. 1 in that the row selection decoder is constituted by a four-input NAND decoder. FIG. 13 illustrates a row selection decoder 210 and a pre-decoder 310 that generates selection address signals, which are differences from FIG. 1.

Row address signals A0 to A7 are assigned, which remain unchanged from FIG. 1, and the number of word lines is 256. Therefore, four types of pre-decoders 310A, 310B, 310C, and 310D are provided so as to correspond to the four-input NAND decoder. The pre-decoder 310A receives address signals A0 and A1 and outputs selection address signals XA0 to XA3. The pre-decoder 310B receives address signals A2 and A3 and outputs selection address signals XB0 to XB3. The pre-decoder 310C receives address signals A4 and A5 and outputs selection address signals XC0 to XC3. The pre-decoder 3100 receives address signals A6 and A7 and outputs selection address signals XD0 to XD3. To a four-input NAND decoder 211, any one of the selection address signals XA0 to XA3, any one of the selection address signals XB0 to XB3, any one of the selection address signals XC0 to XC3, and any one of the selection address signals XD0 to XD3 are input. For example, to the NAND decoder 211 that outputs DECOUT1, the selection address signals XA1, XB0, XC0, and XD0 are connected. In FIG. 1, there are eight selection address signals XA, four selection address signals XB, and eight selection address signals XC, and therefore, the total of 20 lines are needed. However, in the embodiment illustrated in FIG. 13, there are four selection address signals XA, four selection address signals XB, four selection address signals XC, and four selection address signals XD. Therefore, the total of 16 lines are only needed to implement the semiconductor memory device.

FIG. 14 is similar to FIG. 2 and is a selection operation chart of the row selection decoder. When selection address signals marked with circles are input to the row selection decoder 210, output DECOUT of the NAND decoder 211 corresponding to the selection address signals is selected.

Figure 15:
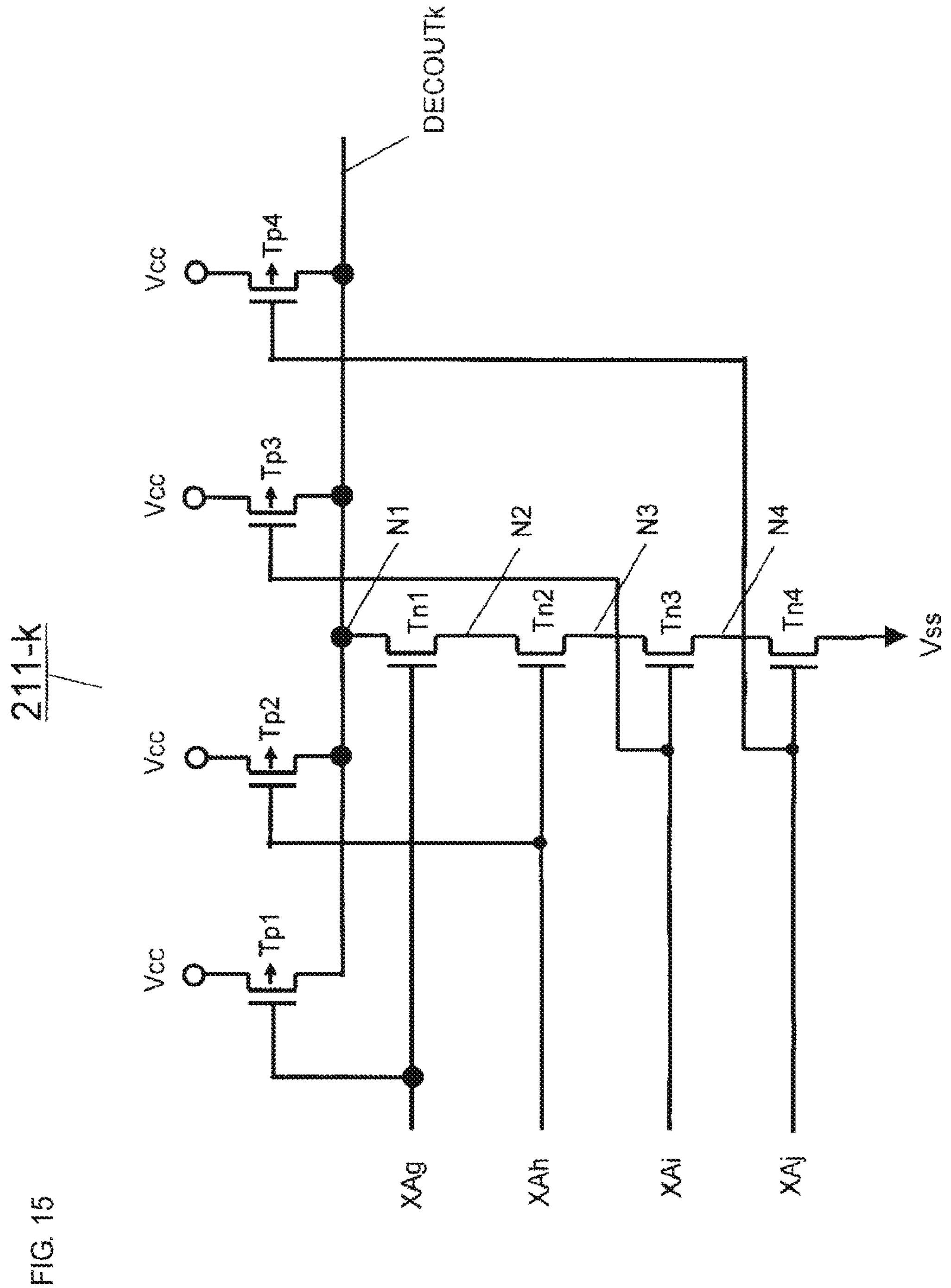
FIG. 15 is an equivalent circuit diagram of a NAND decoder according to other embodiments of the present invention.

FIG. 15 illustrates a NAND decoder 211-*k* according to embodiments of the present invention.

Reference numerals Tp1, Tp2, Tp3, and Tp4 denote PMOS transistors constituted by SGTs. Reference numerals Tn1, Tn2, Tn3, and Tn4 denote NMOS transistors similarly constituted by SGTs. The sources of the PMOS transistors Tp1, Tp2, Tp3, and Tp4 are each connected to the supply voltage Vcc, and the drains thereof are connected in common to a node N1. The node N1 serves as output DECOUTk. The drain of the NMOS transistor Tn1 is connected to the node N1, and the source thereof is connected to the drain of the NMOS transistor Tn2 via a node N2. The source of the NMOS transistor Tn2 is connected to the drain of the NMOS transistor Tn3 via a node N3. The source of the NMOS transistor Tn3 is connected to the drain of the NMOS transistor Tn4 via a node N4. The source of the NMOS transistor Tn4 is connected to the reference voltage Vss. To the gate of the PMOS transistor Tp1 and to the gate of the NMOS transistor Tn1, an input signal XAg (g=0 to 3) is connected. To the gate of the NMOS transistor Tn2 and to the gate of the NMOS transistor Tn2, an input signal XBh (h=0 to 3) is connected. To the gate of the PMOS transistor Tp3 and to the gate of the NMOS transistor Tn3, an input signal XCi (i=0 to 3) is connected. To the gate of the PMOS transistor Tp4 and to the gate of the NMOS transistor Tn4, an input signal XDj (j=0 to 3) is connected.

Figure 16A:
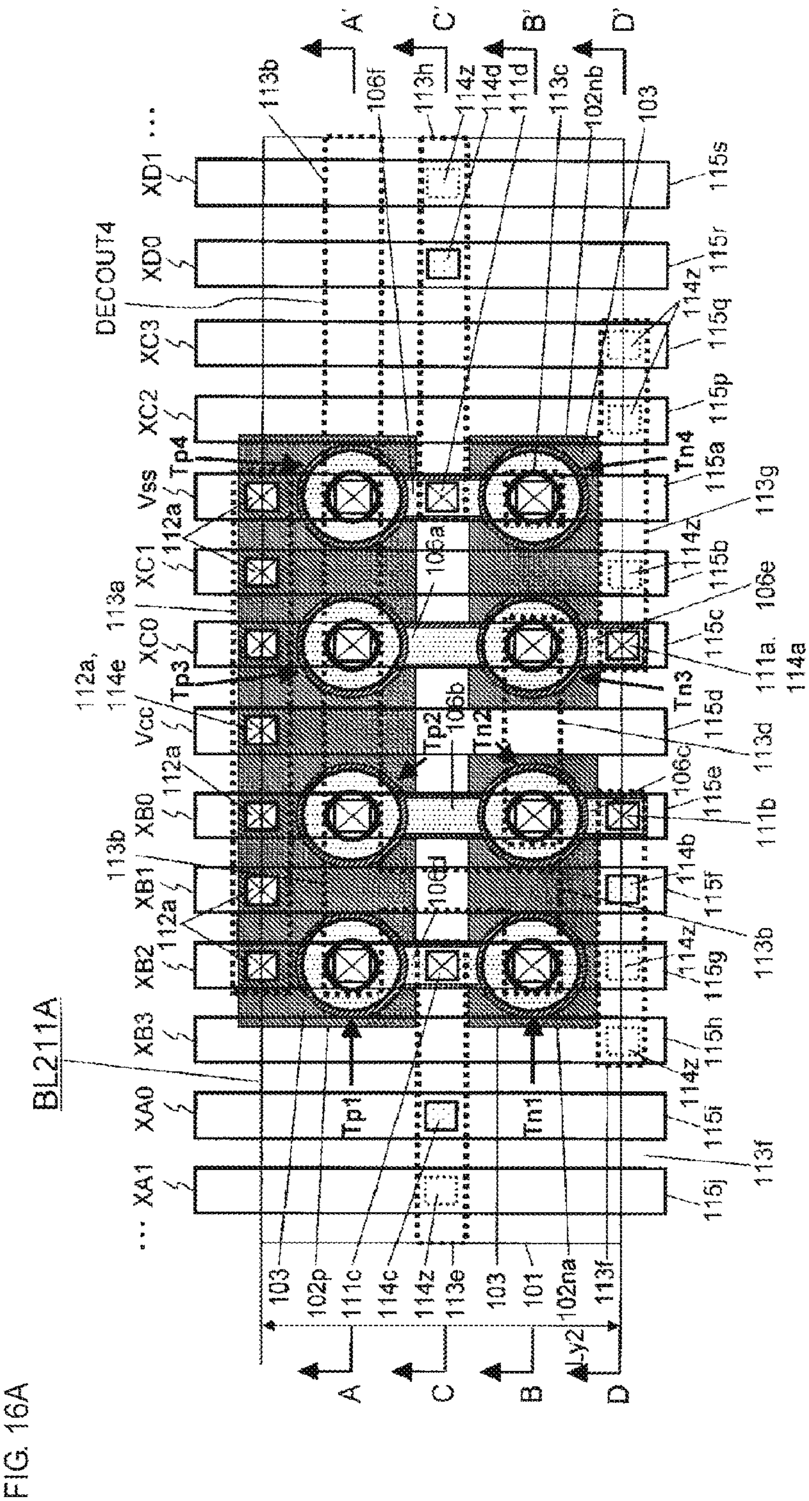
FIG. 16A is a plan view of a NAND decoder according to a ninth embodiment of the present invention.
Figure 16B:
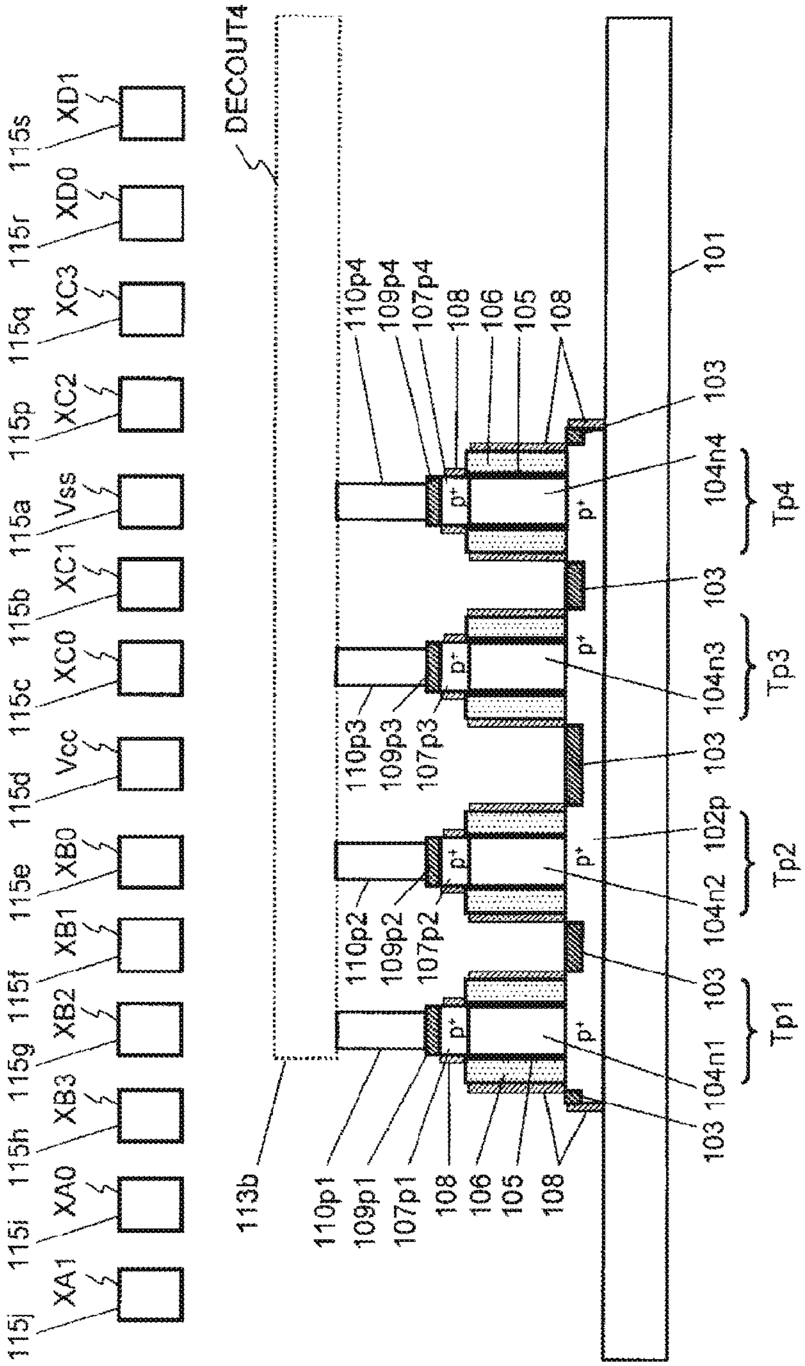
FIG. 16B is a cross-sectional view of the NAND decoder according to the ninth embodiment of the present invention.
Figure 16C:
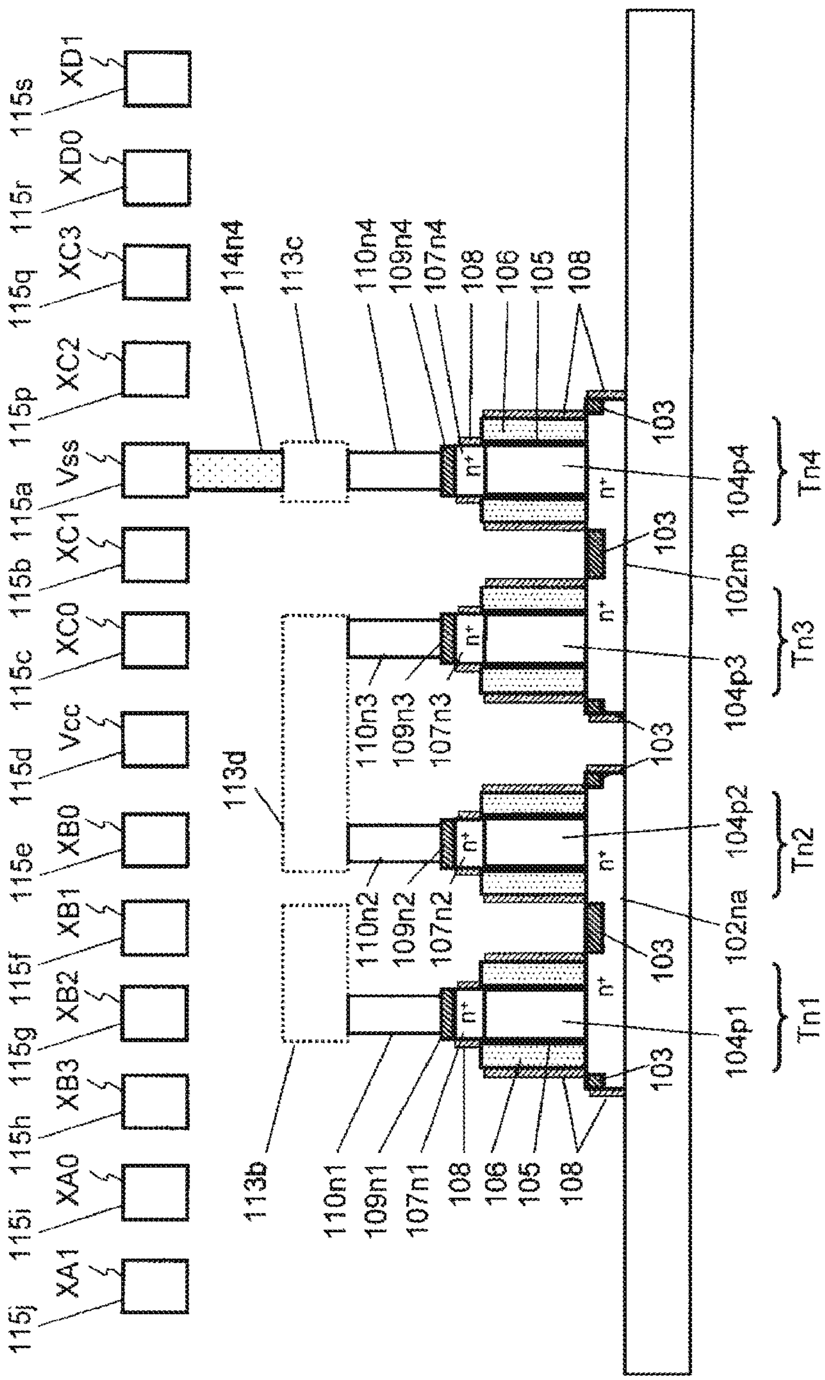
FIG. 16C is a cross-sectional view of the NAND decoder according to the ninth embodiment of the present invention.
Figure 16D:
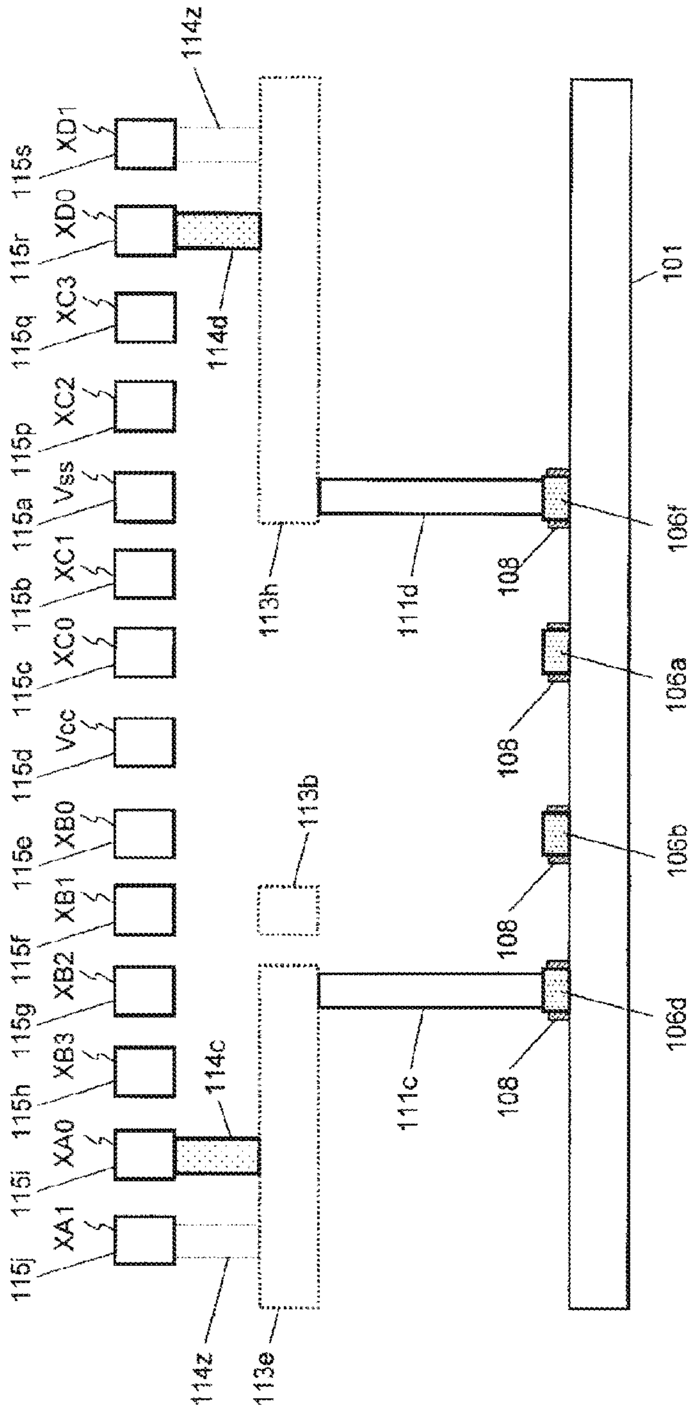
FIG. 16D is a cross-sectional view of the NAND decoder according to the ninth embodiment of the present invention.
Figure 16E:
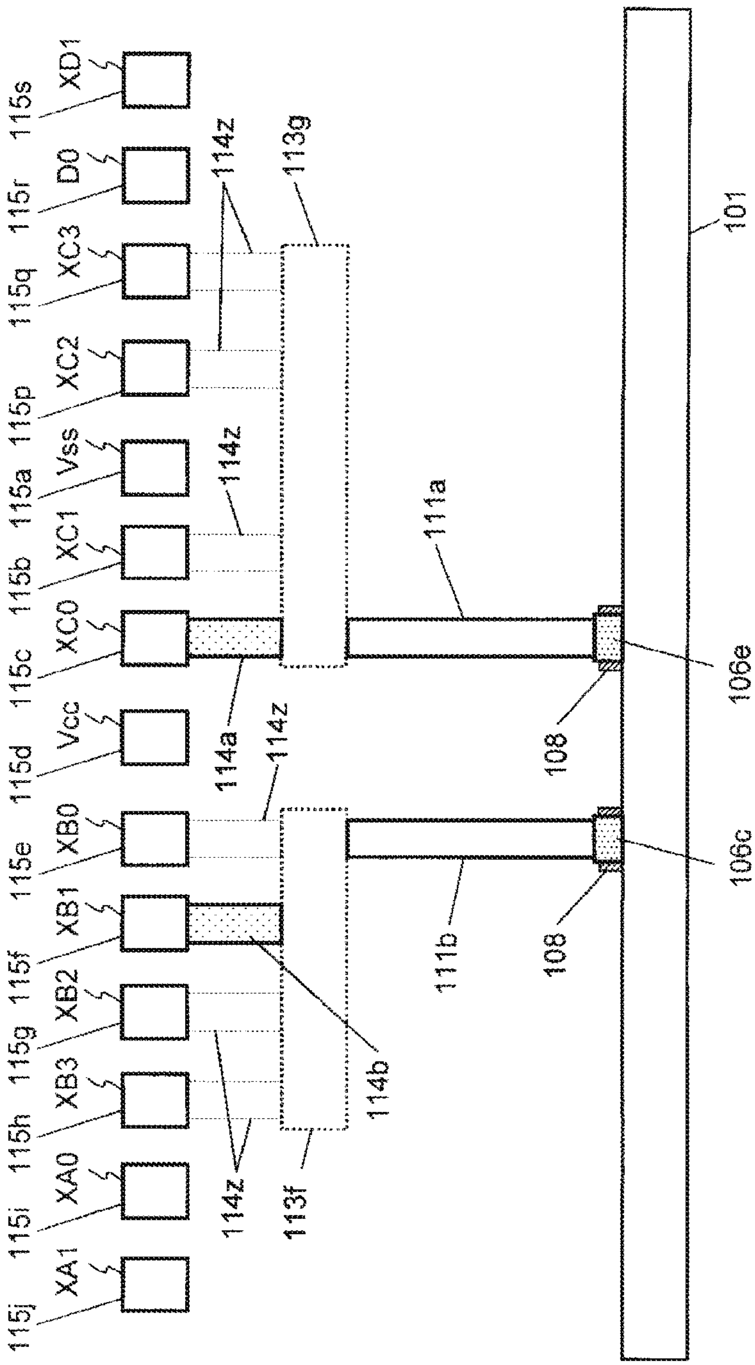
FIG. 16E is a cross-sectional view of the NAND decoder according to the ninth embodiment of the present invention.

FIGS. 16A, 16B, 16C, 16D, and 16E illustrate a ninth embodiment. FIG. 16A is a plan view of a layout (arrangement) of a NAND decoder according to this embodiment. FIG. 16B is a cross-sectional view taken along cut line A-A' in FIG. 16A. FIG. 16C is a cross-sectional view taken along cut line B-B' in FIG. 16A. FIG. 16D is a cross-sectional view taken along cut line C-C' in FIG. 16A. FIG. 16E is a cross-sectional view taken along cut line D-D' in FIG. 16A.

In FIG. 16A, the PMOS transistor Tp4 and the NMOS transistor Tn4 are additionally arranged to the right of the three-input NAND decoder illustrated in the plan view of a layout (arrangement) in FIG. 8A. The PMOS transistors Tp1, Tp2, and Tp3 and the NMOS transistors Tn1, Tn2, and Tn3 have the same structures and are arranged in the same manner as those illustrated in FIG. 8A and so on. In FIG. 16A and so on, the PMOS transistor Tp4 and the NMOS transistor Tn4 are arranged on the right, and therefore, locations where selection address signal lines are arranged and connections of the selection address lines, the selection address lines being implemented as second metal lines, are partially different from those in FIG. 8A and so on.

Note that in FIGS. 16A, 16B, 16C, 16D, and 16E, a portion having the same structure as the corresponding one in FIGS. 8A, 8B, 8C, 8D, 8E, 8F, 8G, 8H, and 8I is denoted by a corresponding reference numeral in the one hundreds.

On an insulating film, such as a buried oxide (BOX) film layer 101, formed on a substrate, planer silicon layers (hereinafter also referred to as lower diffusion layers) 102*p*, 102*na*, and 102*nb* are formed. The planer silicon layers 102*p*, 102*na*, and 102*nb* are respectively formed as a p+ diffusion layer, an n+ diffusion layer, and an n+ diffusion layer through impurity implantation or the like. Reference numeral 103 denotes a silicide layer formed on the surfaces of the planar silicon layers 102*p*, 102*na*, and 102*nb*. Reference numerals 104*n*1, 104*n*2, 104*n*3, and 104*n*4 denote n-type silicon pillars. Reference numerals 104*p*1, 104*p*2, 104*p*3, and 104*p*4 denote p-type silicon pillars. Reference numeral 105 denotes a gate insulating film that surrounds the silicon pillars 104*n*1, 104*n*2, 104*n*3, 104*n*4, 104*p*1, 104*p*2, 104*p*3, and 104*p*4. Reference numeral 106 denotes a gate electrode. Reference numerals 106*a*, 106*b*, 106*c*, 106*d*, 106*e*, and 106*f* denote gate lines. On the top portions of the silicon pillars 104*n*1, 104*n*2, 104*n*3, and 104*n*4, p+ diffusion layers (hereinafter also referred to as upper diffusion layers) 107*p*1, 107*p*2, 107*p*3, and 107*p*4 are respectively formed through impurity implantation or the like. On the top portions of the silicon pillars 104*p*1, 104*p*2, 104*p*3, and 104*p*4, n+ diffusion layers (hereinafter also referred to as upper diffusion layers) 107*n*1, 107*n*2, 107*n*3, and 107*n*4 are respectively formed through impurity implantation or the like. Reference numeral 108 denotes a silicon nitride film for protecting the gate insulating film 105. Reference numerals 109*p*1, 109*p*2, 109*p*3, 109*p*4, 109*n*1, 109*n*2, 109*n*3, and 109*n*4 denote silicide layers respectively connected to the p+ diffusion layers 107*p*1, 107*p*2, 107*p*3, and 107*p*4 and the n+ diffusion layers 107*n*1, 107*n*2, 107*n*3, and 107*n*4. Reference numerals 110*p*1, 110*p*2, 110*p*3, 110*p*4, 110*n*1, 110*n*2, 110*n*3, and 110*n*4 denote contacts that respectively connect the silicide layers 109*p*1, 109*p*2, 109*p*3, 109*p*4, 109*n*1, 109*n*2, 109*n*3, and 109*n*4 to first metal lines 113*b*, 113*b*, 113*b*, 113*b*, 113*b*, 113*d*, 113*d*, and 113*c*. Reference numeral 111*c* denotes a contact that connects the gate line 106*d* to a first metal line 113*e*. Reference numeral 111*b* denotes a contact that connects the gate line 106*c* to a first metal line 113*f*. Reference numeral 111*a* denotes a contact that connects the gate line 106*e* to a first metal line 113*g*. Reference numeral 111*d* denotes a contact that connects the gate line 106*f* to a first metal line 113*h*.

Reference numeral 112*a* denotes a contact (seven contacts 112*a* are illustrated in FIG. 16A) that connects the silicide layer 103 covering the lower diffusion layer 102*p* for connection to a first metal line 113*a*.

The silicon pillar 104*n*1, the lower diffusion layer 102*p*, the upper diffusion layer 107*p*1, the gate insulating film 105, and the gate electrode 106 constitute the PMOS transistor Tp1. The silicon pillar 104*n*2, the lower diffusion layer 102*p*, the upper diffusion layer 107*p*2, the gate insulating film 105, and the gate electrode 106 constitute the PMOS transistor Tp2. The silicon pillar 104*n*3, the lower diffusion layer 102*p*, the upper diffusion layer 107*p*3, the gate insulating film 105, and the gate electrode 106 constitute the PMOS transistor Tp3. The silicon pillar 104*n*4, the lower diffusion layer 102*p*, the upper diffusion layer 107*p*4, the gate insulating film 105, and the gate electrode 106 constitute the PMOS transistor Tp4. The silicon pillar 104*p*1, the lower diffusion layer 102*na*, the upper diffusion layer 107*n*1, the gate insulating film 105, and the gate electrode 106 constitute the NMOS transistor Tn1. The silicon pillar 104*p*2, the lower diffusion layer 102*na*, the upper diffusion layer 107*n*2, the gate insulating film 105, and the gate electrode 106 constitute the NMOS transistor Tn2. The silicon pillar 104*p*3, the lower diffusion layer 102*nb*, the upper diffusion layer 107*n*3, the gate insulating film 105, and the gate electrode 106 constitute the NMOS transistor Tn3. The silicon pillar 104*p*4, the lower diffusion layer 102*nb*, the upper diffusion layer 107*n*4, the gate insulating film 105, and the gate electrode 106 constitute the NMOS transistor Tn4.

To the gate electrodes 106 of the PMOS transistor Tp1 and the NMOS transistor Tn1, the gate line 106*d* is connected. To the gate electrodes 106 of the PMOS transistor Tp2 and the NMOS transistor Tn2, the gate line 106*b* is connected. Further, to the gate electrode 106 of the NMOS transistor Tn2, the gate line 106*c* is connected. To the gate electrodes 106 of the PMOS transistor Tp3 and the NMOS transistor Tn3, the gate line 106*a* is connected. Further, to the gate electrode 106 of the NMOS transistor Tn3, the gate line 106*e* is connected. To the gate electrodes 106 of the PMOS transistor Tp4 and the NMOS transistor Tn4, the gate line 106*f* is connected.

The sources of the PMOS transistors Tp1, Tp2, Tp3, and Tp4 are formed of the lower diffusion layer 102*p*, and the lower diffusion layer 102*p* is connected to the first metal line 113*a* via the silicide layer 103 and via the contact 112*a* (seven contacts 112*a* are arranged in FIG. 16A). The first metal line 113*a* is connected to a second metal line 115*d* via a contact 114*d*. To the second metal line 115*d*, the supply voltage Vcc is supplied. Here, the second metal line 115*d* extends in a direction perpendicular to the row direction. Note that the first metal line 113*a* extends along the row direction and is used to supply the supply voltage Vcc to the lower diffusion layer 102*p* and the silicide layer 103, and the resistance of the silicide layer 103 is at a level that requires almost no attention. The upper diffusion layer 107*p*1 that serves as the drain of the PMOS transistor Tp1 is connected to the first metal line 113*b* via the silicide layer 109*p*1 and via the contact 110*p*1. The first metal line 113*b* serves as output DECOUT4. The upper diffusion layer 107*p*2 that serves as the drain of the PMOS transistor Tp2 is connected to the first metal line 113*b* via the silicide layer 109*p*2 and via the contact 110*p*2. The upper diffusion layer 107*p*3 that serves as the drain of the PMOS transistor Tp3 is connected to the first metal line 113*b* via the silicide layer 109*p*3 and via the contact 110*p*3. The upper diffusion layer 107*p*4 that serves as the drain of the PMOS transistor Tp4 is connected to the first metal line 113*b* via the silicide layer 109*p*4 and via the contact 110*p*4. The upper diffusion layer 107*n*1 that serves as the drain of the NMOS transistor Tn1 is connected to the first metal line 113*b* via the silicide layer 109*n*1 and via the contact 110*n*1. Here, the drains of the PMOS transistors Tp1, Tp2, Tp3, and Tp4 and the drain of the NMOS transistor Tn1 are connected in common to the first metal line 113*b* via the contacts, as described above. The lower diffusion layer 102*na* that serves as the source of the NMOS transistor Tn1 is connected to the drain of the NMOS transistor Tn2 via the silicide layer 103. The upper diffusion layer 107*n*2 that serves as the source of the NMOS transistor Tn2 is connected to the first metal line 113d via the silicide layer 109n2 and via the contact 110n2. The upper diffusion layer 107n3 that serves as the drain of the NMOS transistor Tn3 is connected to the first metal line 113d via the silicide layer 109n3 and via the contact 110n2. Here, the source of the NMOS transistor Tn2 and the drain of the NMOS transistor Tn3 are connected to each other via the first metal line 113d. The source of the NMOS transistor Tn3 is connected to the drain of the NMOS transistor Tn4 via the lower diffusion layer 102nb and via the silicide layer 103. The source of the NMOS transistor Tn4 is formed of the upper diffusion layer 107n4, and the upper diffusion layer 107n4 is connected to the first metal line 113c via the silicide layer 109n4 and via the contact 110n4. The first metal line 113c is connected to a second metal line 115a via a contact 114n4. To the second metal line 115a, the reference voltage Vss is supplied. Here, the second metal line 115a extends in the direction perpendicular to the row direction.

The gate line 106d that receives any of the selection address signals XA0 to XA3 supplied through second metal lines is connected to the first metal line 113e via the contact 111c. The first metal line 113e extends in a direction parallel to the row (to the left of FIG. 16A). The selection address signal lines XA0 to XA3 extend in the direction perpendicular to the row direction. A contact 114c is arranged at one of the intersection points of the first metal line 113e that extends parallel to the row direction and the selection address signal lines XA0 to XA3 that extend in the direction perpendicular to the row direction, and connects a selection address signal XAh (h=0 to 3) to the gate line 106d. In FIG. 16A and so on, the contact 114c is provided at the intersection point of a second metal line 115i for the selection address signal XA0 and the first metal line 113e. That is, to the gate of the PMOS transistor Tp1 and to the gate of the NMOS transistor Tn1 of the NAND decoder of this embodiment, the selection address signal XA0 is input.

In FIG. 16A and so on, although the selection address signal lines XA2 and XA3 are not illustrated, the selection address signal lines XA2 and XA3 are arranged to the left of the selection address signal line XA1 and extend in the direction perpendicular to the row direction similarly to the selection address signal lines XA0 and XA1.

Note that at the intersection point of the selection address signal line XA1 (second metal line 115j) and the first metal line 113e, a contact 114z is illustrated with a dotted line in FIG. 16A and so on, which indicates that no contact is present at the intersection point. The location of the contact illustrated with a dotted line indicates the location of a possible contact that is to be provided in a case where the selection address signal XA1 (second metal line 115j) is to be input.

The gate line 106c that receives any of the selection address signals XB0 to XB3 supplied through second metal lines is connected to the first metal line 113f via the contact 111b. The first metal line 113f extends in the direction parallel to the row (to the left of FIG. 16A). The selection address signal lines XB0 to XB3 extend in the direction perpendicular to the row direction. A contact 114b is arranged at one of the intersection points of the first metal line 113f and the selection address signal lines XB0 to XB3, and connects a selection address signal XBi (i=0 to 3) to the gate line 106c. In FIG. 16A and so on, the contact 114b is provided at the intersection point of a second metal line 115f for the selection address signal XB1 and the first metal line 113f. That is, to the gate of the PMOS transistor Tp2 and to the gate of the NMOS transistor Tn2 of the NAND decoder of this embodiment, the selection address signal XB1 is input.

Note that at the intersection point of the selection address signal line XB2 (second metal line 115g) and the first metal line 113f and at the intersection point of the selection address signal line XB3 (second metal line 115h) and the first metal line 113f, contacts 114z are respectively illustrated with a dotted line in FIG. 16A and so on, which indicates that no contacts are present at the respective intersection points, as described above. The location of a contact illustrated with a dotted line indicates the location of a possible contact.

The gate line 106e that receives any of the selection address signals XC0 to XC3 supplied through second metal lines is connected to the first metal line 113g via the contact 111a. The first metal line 113g extends in the direction parallel to the row (to the right of FIG. 16A). The selection address signal lines XC0 to XC3 extend in the direction perpendicular to the row direction. A contact 114a is arranged at one of the intersection points of the first metal line 113g and the selection address signal lines XC0 to XC3, and connects a selection address signal XCj (j=0 to 3) to the gate line 106e. In FIG. 16A and so on, the contact 114a is provided at the intersection point of a second metal line 115c for the selection address signal XC0 and the first metal line 113g. That is, to the gate of the PMOS transistor Tp3 and to the gate of the NMOS transistor Tn3 of the NAND decoder of this embodiment, the selection address signal XC0 is input.

Note that at the intersection point of the selection address signal line XC1 (second metal line 115b) and the first metal line 113g, at the intersection point of the selection address signal line XC2 (second metal line 115p) and the first metal line 113g, and at the intersection point of the selection address signal line XC3 (second metal line 115q) and the first metal line 113g, contacts 114z are respectively illustrated with a dotted line in FIG. 16A and so on, which indicates that no contacts are present at the respective intersection points, as described above. The location of a contact illustrated with a dotted line indicates the location of a possible contact.

The gate line 106f that receives any of the selection address signals XD0 to XD3 supplied through second metal lines is connected to the first metal line 113h via the contact 111d. The first metal line 113h extends in the direction parallel to the row (to the right of FIG. 16A). The selection address signal lines XD0 to X03 extend in the direction perpendicular to the row direction. A contact 114d is arranged at one of the intersection points of the first metal line 113h that extends parallel to the row direction and the selection address signal lines XD0 to X03 that extend in the direction perpendicular to the row direction, and connects a selection address signal XDj (j=0 to 3) to the gate line 106f. In FIG. 16A and so on, the contact 114d is provided at the intersection point of a second metal line 115r for the selection address signal XD0 and the first metal line 113h. That is, to the gate of the PMOS transistor Tp4 and to the gate of the NMOS transistor Tn4 of the NAND decoder of this embodiment, the selection address signal XD0 is input.

In FIG. 16A and so on, although the selection address signal lines X02 and X03 are not illustrated, the selection address signal lines X02 and X03 are arranged to the right of the selection address signal line X01 and extend in the direction perpendicular to the row direction similarly to the selection address signal lines XD0 and XD1.

Note that at the intersection point of the selection address signal line XD1 (second metal line 115s) and the first metal line 113*h*, a contact 114*z* is illustrated with a dotted line in FIG. 16A, which indicates that no contact is present at the intersection point. The location of the contact illustrated with a dotted line indicates the location of a possible contact that is to be provided in a case where the selection address signal XD1 (second metal line 115*s*) is to be input.

In FIG. 16A and so on, the selection address signals XA0, XB1, XC0, and XD0 are input to the NAND decoder of this embodiment, and DECOUT4 is selected as output in accordance with FIG. 2.

The NAND decoder of this embodiment (NAND decoder BL211A) corresponds to a region surrounded by a frame in FIG. 16A, and the dimension in the longitudinal direction is Ly2.

According to this embodiment, the supply voltage line, reference voltage line, and selection address signal lines are implemented as the second metal lines and extend in the direction perpendicular to the row direction of the NAND decoder having a two-row four-column arrangement, and the input gates of the NAND decoder are connected to the second metal lines via the first metal lines that are arranged in parallel to the row direction to thereby enable supply of any selection address signals to the input of the NAND decoder. Consequently, a NAND decoder that allows arrangement in accordance with the minimum pitch of the second metal lines and has a smaller area can be implemented.

Tenth Embodiment

Figure 17A:
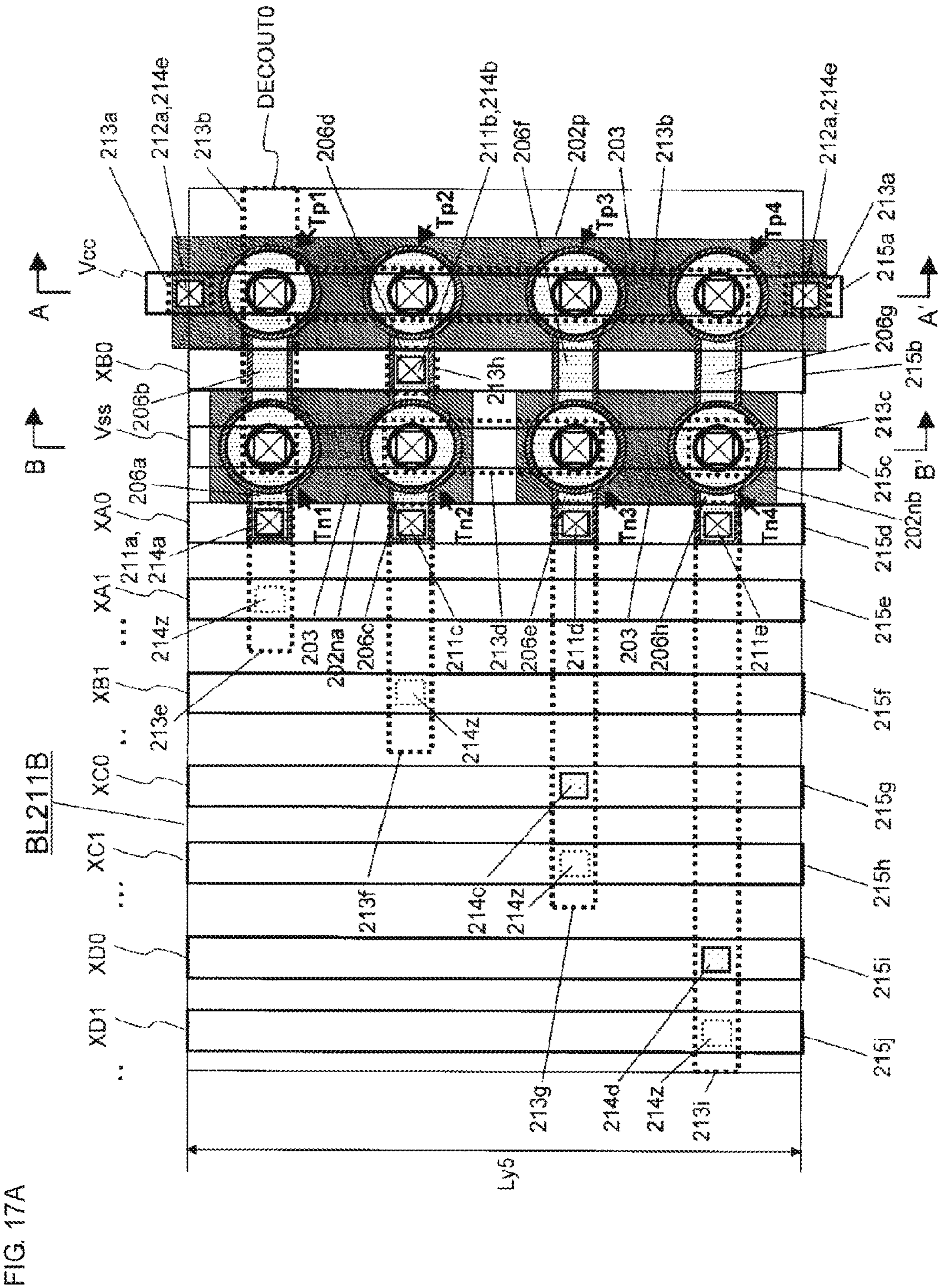
FIG. 17A is a plan view of a NAND decoder according to a tenth embodiment of the present invention.
Figure 17B:
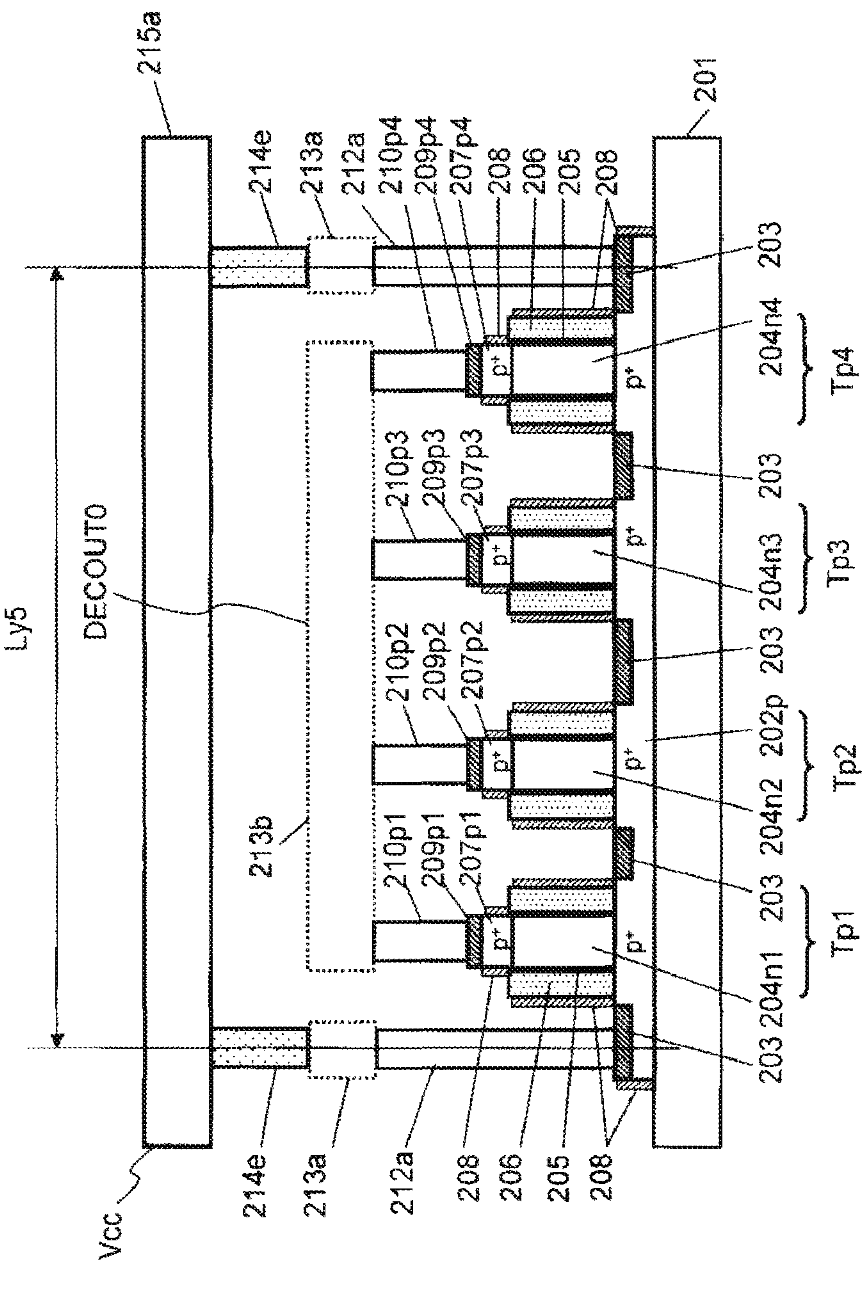
FIG. 17B is a cross-sectional view of the NAND decoder according to the tenth embodiment of the present invention.
Figure 17C:
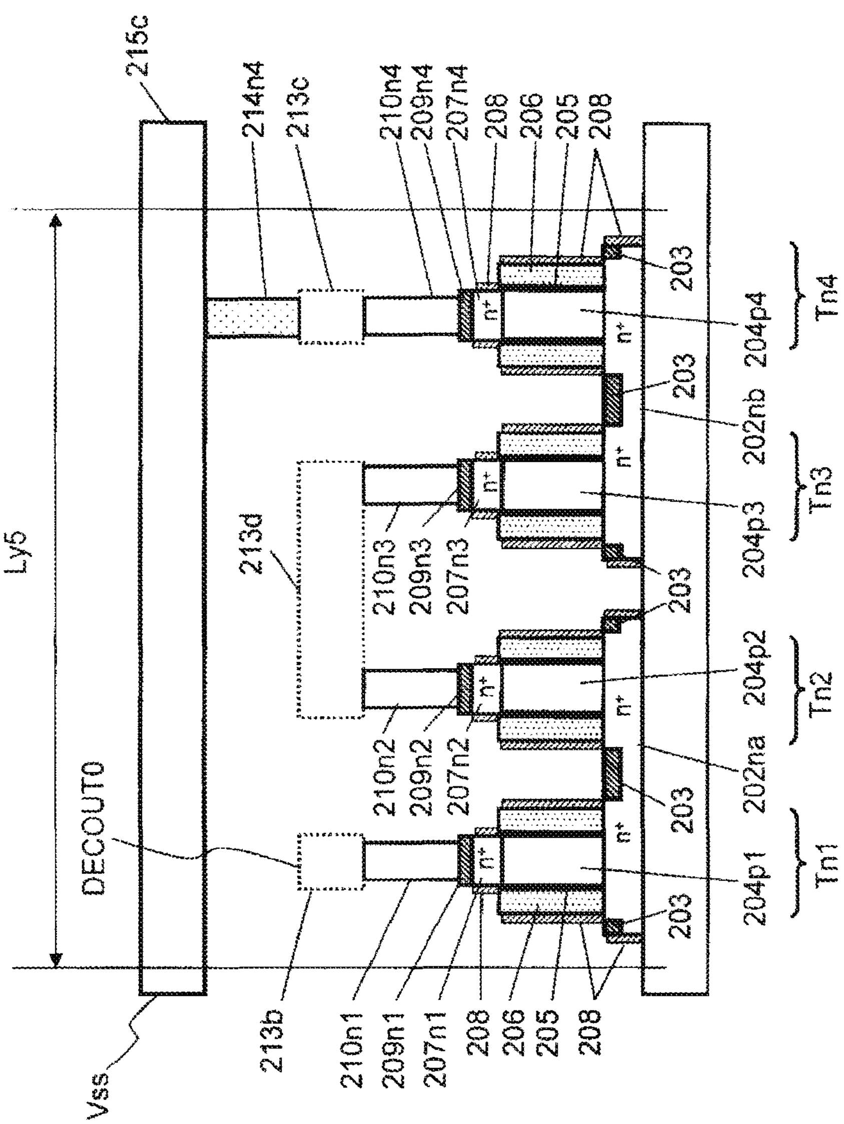
FIG. 17C is a cross-sectional view of the NAND decoder according to the tenth embodiment of the present invention.

FIGS. 17A, 17B, and 17C illustrate a tenth embodiment. This embodiment relates to a NAND decoder and implements the equivalent circuit illustrated in FIG. 15. FIG. 17A is a plan view of a layout (arrangement) of a NAND decoder (four-input NAND decoder) according to this embodiment. FIG. 17B is a cross-sectional view taken along cut line A-A' in FIG. 17A. FIG. 17C is a cross-sectional view taken along cut line B-B' in FIG. 17A.

In this embodiment, the PMOS transistors Tp1, Tp2, Tp3, and Tp4 that constitute the NAND decoder 211*k* are arranged in a column in the longitudinal direction, and the NMOS transistors Tn1, Tn2, Tn3, and Tn4 that constitute the NAND decoder 211*k* are arranged in a column in the longitudinal direction, as in the eighth embodiment (FIG. 12A).

That is, in this embodiment, the PMOS transistor Tp1 and the NMOS transistor Tn1 are arranged in the first row in order from the right, the PMOS transistor Tp2 and the NMOS transistor Tn2 are arranged in the second row in order from the right, the PMOS transistor Tp3 and the NMOS transistor Tn3 are arranged in the third row in order from the right, and the PMOS transistor Tp4 and the NMOS transistor Tn4 are arranged in the fourth row in order from the right.

Further, in this embodiment, the sources of the PMOS transistors Tp1, Tp2, Tp3, and Tp4 and the NMOS transistors Tn1, Tn2, Tn3, and Tn4 and the drains thereof are arranged so as to be reversed in an up-down direction, and the drains of the PMOS transistors Tp1, Tp2, Tp3, and Tp4 and the drain of the NMOS transistor Tn1 are connected in common via contacts, as in the eighth embodiment.

Note that in FIGS. 17A, 17B, and 17C, a portion having the same structure as the corresponding one in FIGS. 12A to 12E is denoted by a corresponding reference numeral in the two hundreds.

On an insulating film, such as a buried oxide (BOX) film layer 201, formed on a substrate, planer silicon layers (hereinafter also referred to as lower diffusion layers) 202*p*, 202*na*, and 202*nb* are formed. The planer silicon layers 202*p*, 202*na*, and 202*nb* are respectively formed as a p+ diffusion layer, an n+ diffusion layer, and an n+ diffusion layer through impurity implantation or the like. Reference numeral 203 denotes a silicide layer formed on the surfaces of the planar silicon layers 202*p*, 202*na*, and 202*nb*. Reference numerals 204*n*1, 204*n*2, 204*n*3, and 204*n*4 denote n-type silicon pillars. Reference numerals 204*p*1, 204*p*2, 204*p*3, and 204*p*4 denote p-type silicon pillars. Reference numeral 205 denotes a gate insulating film that surrounds the silicon pillars 204*n*1, 204*n*2, 204*n*3, 204*n*4, 204*p*1, 204*p*2, 204*p*3, and 204*p*4. Reference numeral 206 denotes a gate electrode. Reference numerals 206*a*, 206*b*, 206*c*, 206*d*, 206*e*, 206*f*, 206*g*, and 206*h* denote gate lines. On the top portions of the silicon pillars 204*n*1, 204*n*2, 204*n*3, and 204*n*4, p+ diffusion layers (hereinafter also referred to as upper diffusion layers) 207*p*1, 207*p*2, 207*p*3, and 207*p*4 are respectively formed through impurity implantation or the like. On the top portions of the silicon pillars 204*p*1, 204*p*2, 204*p*3, and 204*p*4, n+ diffusion layers (hereinafter also referred to as upper diffusion layers) 207*n*1, 207*n*2, 207*n*3, and 207*n*4 are respectively formed through impurity implantation or the like. Reference numeral 208 denotes a silicon nitride film for protecting the gate insulating film 205. Reference numerals 209*p*1, 209*p*2, 209*p*3, 209*p*4, 209*n*1, 209*n*2, 209*n*3, and 209*n*4 denote silicide layers respectively connected to the p+ diffusion layers 207*p*1, 207*p*2, 207*p*3, and 207*p*4 and the n+ diffusion layers 207*n*1, 207*n*2, 207*n*3, and 207*n*4. Reference numerals 210*p*1, 210*p*2, 210*p*3, 210*p*4, 210*n*1, 210*n*2, 210*n*3, and 210*n*4 denote contacts that respectively connect the silicide layers 209*p*1, 209*p*2, 209*p*3, 209*p*4, 209*n*1, 209*n*2, 209*n*3, and 209*n*4 to first metal lines 213*b*, 213*b*, 213*b*, 213*b*, 213*b*, 213*d*, 213*d*, and 213*c*. Reference numeral 211*a* denotes a contact that connects the gate line 206*a* to a first metal line 213*e*. Reference numeral 211*b* denotes a contact that connects the gate line 206*d* to a first metal line 213*h*. Reference numeral 211*c* denotes a contact that connects the gate line 206*c* to a first metal line 213*f*. Reference numeral 211*d* denotes a contact that connects the gate line 206*e* to a first metal line 213*g*. Reference numeral 211*e* denotes a contact that connects the gate line 206*h* to a first metal line 213*i*.

Reference numeral 212*a* denotes a contact (two contacts 212*a* are arranged, one in an upper portion and the other in a lower portion, in FIG. 17A) that connects the silicide layer 203 covering the lower diffusion layer 202*p* for connection to a first metal line 213*a*.

The silicon pillar 204*n*1, the lower diffusion layer 202*p*, the upper diffusion layer 207*p*1, the gate insulating film 205, and the gate electrode 206 constitute the PMOS transistor Tp1. The silicon pillar 204*n*2, the lower diffusion layer 202*p*, the upper diffusion layer 207*p*2, the gate insulating film 205, and the gate electrode 206 constitute the PMOS transistor Tp2. The silicon pillar 204*n*3, the lower diffusion layer 202*p*, the upper diffusion layer 207*p*3, the gate insulating film 205, and the gate electrode 206 constitute the PMOS transistor Tp3. The silicon pillar 204*n*4, the lower diffusion layer 202*p*, the upper diffusion layer 207*p*4, the gate insulating film 205, and the gate electrode 206 constitute the PMOS transistor Tp4. The silicon pillar 204*p*1, the lower diffusion layer 202*na*, the upper diffusion layer 207*n*1, the gate insulating film 205, and the gate electrode 206 constitute the NMOS transistor Tn1. The silicon pillar 204*p*2, the lower diffusion layer 202*na*, the upper diffusion layer 207*n*2, the gate insulating film 205, and the gate electrode 206 constitute the NMOS transistor Tn2. The silicon pillar 204$p$3, the lower diffusion layer 202$nb$, the upper diffusion layer 207$n$3, the gate insulating film 205, and the gate electrode 206 constitute the NMOS transistor Tn3. The silicon pillar 204$p$4, the lower diffusion layer 202$nb$, the upper diffusion layer 207$n$4, the gate insulating film 205, and the gate electrode 206 constitute the NMOS transistor Tn4.

To the gate electrodes 206 of the PMOS transistor Tp1 and the NMOS transistor Tn1, the gate line 206$b$ is connected. Further, to the gate electrode 206 of the NMOS transistor Tn1, the gate line 206$a$ is connected. To the gate electrodes 206 of the PMOS transistor Tp2 and the NMOS transistor Tn2, the gate line 206$d$ is connected. Further, to the gate electrode 206 of the NMOS transistor Tn2, the gate line 206$c$ is connected. To the gate electrodes 206 of the PMOS transistor Tp3 and the NMOS transistor Tn3, the gate line 206$f$ is connected. Further, to the gate electrode 206 of the NMOS transistor Tn3, the gate line 206$e$ is connected. To the gate electrodes 206 of the PMOS transistor Tp4 and the NMOS transistor Tn4, the gate line 206$g$ is connected. Further, to the gate electrode 206 of the NMOS transistor Tn4, the gate line 206$h$ is connected.

The sources of the PMOS transistors Tp1, Tp2, Tp3, and Tp4 are formed of the lower diffusion layer 202$p$, and the lower diffusion layer 202$p$ is connected to the first metal line 213$a$ via the silicide layer 203 and via the contact 212$a$ (two contacts 212$a$ are arranged, one in an upper portion and the other in a lower portion, in FIG. 17A). The first metal line 213$a$ is connected to a second metal line 215$a$ via a contact 214$d$. To the second metal line 215$a$, the supply voltage Vcc is supplied. Here, the second metal line 215$a$ extends in a direction perpendicular to the row direction. The upper diffusion layer 207$p$1 that serves as the drain of the PMOS transistor Tp1 is connected to the first metal line 213$b$ via the silicide layer 209$p$1 and via the contact 210$p$1. The first metal line 213$b$ serves as output DECOUTO. The upper diffusion layer 207$p$2 that serves as the drain of the PMOS transistor Tp2 is connected to the first metal line 213$b$ via the silicide layer 209$p$2 and via the contact 210$p$2. The upper diffusion layer 207$p$3 that serves as the drain of the PMOS transistor Tp3 is connected to the first metal line 213$b$ via the silicide layer 209$p$3 and via the contact 210$p$32. The upper diffusion layer 207$p$4 that serves as the drain of the PMOS transistor Tp4 is connected to the first metal line 213$b$ via the silicide layer 209$p$4 and via the contact 210$p$4. The upper diffusion layer 207$n$1 that serves as the drain of the NMOS transistor Tn1 is connected to the first metal line 213$b$ via the silicide layer 209$n$1 and via the contact 210$n$1. Here, the drains of the PMOS transistors Tp1, Tp2, Tp3, and Tp4 and the drain of the NMOS transistor Tn1 are connected in common to the first metal line 213$b$ via the contacts, as described above. The lower diffusion layer 202$na$ that serves as the source of the NMOS transistor Tn1 is connected to the drain of the NMOS transistor Tn2 via the silicide layer 203. The upper diffusion layer 207$n$2 that serves as the source of the NMOS transistor Tn2 is connected to the first metal line 213$d$ via the silicide layer 209$n$2 and via the contact 210$n$2. The upper diffusion layer 207$n$3 that serves as the drain of the NMOS transistor Tn3 is connected to the first metal line 213$d$ via the silicide layer 209$n$3 and via the contact 210$n$3. Here, the source of the NMOS transistor Tn2 and the drain of the NMOS transistor Tn3 are connected to each other via the first metal line 213$d$. The source of the NMOS transistor Tn3 is formed of the lower diffusion layer 202$nb$, and the lower diffusion layer 202$nb$ is connected to the drain of the NMOS transistor Tn4 via the silicide layer 203. The upper diffusion layer 207$n$4 that serves as the source of the NMOS transistor Tn4 is connected to the first metal line 213$c$ via the silicide layer 209$n$4 and via the contact 210$n$4. The first metal line 213$c$ is connected to a second metal line 215$c$ via a contact 214$n$4. To the second metal line 215$c$, the reference voltage Vss is supplied. Here, the second metal line 215$c$ extends in the direction perpendicular to the row direction.

The gate line 206$a$ that receives any of the selection address signals XA0 to XA3 supplied through second metal lines is connected to the first metal line 213$e$ via the contact 211$a$. The first metal line 213$e$ extends in a direction parallel to the row (to the left of FIG. 17A). The selection address signal lines XA0 to XA3 extend in the direction perpendicular to the row direction. A contact 214$a$ is arranged at one of the intersection points of the first metal line 213$e$ that extends parallel to the row direction and the selection address signal lines XA0 to XA3 that extend in the direction perpendicular to the row direction, and connects a selection address signal XAh (h=0 to 3) to the gate line 206$a$. In FIG. 17A, the contact 214$a$ is provided at the intersection point of a second metal line 215$d$ for the selection address signal XA0 and the first metal line 213$e$. That is, to the gate of the PMOS transistor Tp1 and to the gate of the NMOS transistor Tn1 of the NAND decoder of this embodiment, the selection address signal XA0 is input.

In FIG. 17A, although the selection address signal lines XA2 and XA3 are not illustrated, the selection address signal lines XA2 and XA3 are arranged to the left of the selection address signal line XA1 and extend in the direction perpendicular to the row direction similarly to the selection address signal lines XA0 and XA1.

Note that at the intersection point of the selection address signal line XA1 (second metal line 215$e$) and the first metal line 213$e$, a contact 214$z$ is illustrated with a dotted line in FIG. 17A, which indicates that no contact is present at the intersection point. The location of the contact illustrated with a dotted line indicates the location of a possible contact that is to be provided in a case where the selection address signal XA1 (second metal line 215$e$) is to be input.

The gate line 206$d$ that selectively receives the selection address signal XB0 supplied through a second metal line is connected to the first metal line 213$h$ via the contact 211$b$. The gate line 206$c$ that receives any of the selection address signals XB1 to XB3 is connected to the first metal line 213$f$ via the contact 211$c$. The first metal line 213$f$ extends in the direction parallel to the row (to the left of FIG. 17A). The selection address signal lines XB0 to XB3 extend in the direction perpendicular to the row direction. A contact 214$b$ is arranged at one of the intersection points of the first metal line 213$f$ or 213$h$ and the selection address signal lines XB0 to XB3, and connects a selection address signal XBi (I=0 to 3) to the gate line 206$d$ or 206$c$. In FIG. 17A, the contact 214$b$ is provided at the intersection point of a second metal line 215$b$ for the selection address signal XB0 and the first metal line 213$h$. That is, to the gate of the PMOS transistor Tp2 and to the gate of the NMOS transistor Tn2 of the NAND decoder of this embodiment, the selection address signal XB0 is input.

Note that at the intersection point of the selection address signal line XB1 (second metal line 215$f$) and the first metal line 213$f$, a contact 214$z$ is illustrated with a dotted line in FIG. 17A, which indicates that no contact is present at the intersection point, as described above. The location of a contact illustrated with a dotted line indicates the location of a possible contact.

In FIG. 17A, although the selection address signal lines XB2 and XB3 are not illustrated for convenience sake, the selection address signal lines XB2 and XB3 are arranged to the left of the selection address signal line XB1 and extend in the direction perpendicular to the row direction similarly to the selection address signal lines XB0 and XB1.

The gate line 206*e* that receives any of the selection address signals XC0 to XC3 supplied through second metal lines is connected to the first metal line 213*g* via the contact 211*d*. The first metal line 213*g* extends in the direction parallel to the row (to the left of FIG. 17A). The selection address signal lines XC0 to XC3 extend in the direction perpendicular to the row direction. A contact 214*c* is arranged at one of the intersection points of the first metal line 213*g* and the selection address signal lines XC0 to XC3, and connects a selection address signal XCj (j=0 to 3) to the gate line 206*e*. In FIG. 17A, the contact 214*c* is provided at the intersection point of a second metal line 215*g* for the selection address signal XC0 and the first metal line 213*g*. That is, to the gate of the PMOS transistor Tp3 and to the gate of the NMOS transistor Tn3 of the NAND decoder of this embodiment, the selection address signal XC0 is input.

Note that at the intersection point of the selection address signal line XC1 (second metal line 215*h*) and the first metal line 213*g*, a contact 214*z* is illustrated with a dotted line in FIG. 17A, which indicates that no contact is present at the intersection point, as described above. The location of a contact illustrated with a dotted line indicates the location of a possible contact.

In FIG. 17A, although the selection address signal lines XC2 and XC3 are not illustrated for convenience sake, the selection address signal lines XC2 and XC3 are arranged to the left of the selection address signal line XC1 and extend in the direction perpendicular to the row direction similarly to the selection address signal lines XC0 and XC1.

The gate line 206*h* that receives any of the selection address signals XD0 to XD3 supplied through second metal lines is connected to the first metal line 213*i* via the contact 211*e*. The first metal line 213*i* extends in the direction parallel to the row (to the left of FIG. 17A). The selection address signal lines XD0 to XD3 extend in the direction perpendicular to the row direction. A contact 214*d* is arranged at one of the intersection points of the first metal line 213*i* and the selection address signal lines XD0 to XD3, and connects a selection address signal XDj (j=0 to 3) to the gate line 206*h*. In FIG. 17A, the contact 214*d* is provided at the intersection point of a second metal line 215*i* for the selection address signal XD0 and the first metal line 213*i*. That is, to the gate of the PMOS transistor Tp4 and to the gate of the NMOS transistor Tn4 of the NAND decoder of this embodiment, the selection address signal XD0 is input.

Note that at the intersection point of the selection address signal line XD1 (second metal line 215*j*) and the first metal line 213*i*, a contact 214*z* is illustrated with a dotted line in FIG. 17A, which indicates that no contact is present at the intersection point, as described above. The location of a contact illustrated with a dotted line indicates the location of a possible contact.

In FIG. 17A, although the selection address signal lines XD2 and XD3 are not illustrated for convenience sake, the selection address signal lines XD2 and XD3 are arranged to the left of the selection address signal line XD1 and extend in the direction perpendicular to the row direction similarly to the selection address signal lines XD0 and XD1.

In this embodiment, the selection address signals XA0, XB0, XC0, and XD0 are input to the NAND decoder of this embodiment, and DECOUTO is selected as output in accordance with FIG. 14.

The NAND decoder of this embodiment (NAND decoder BL211B) corresponds to a region surrounded by a frame in FIG. 17A, and the dimension in the longitudinal direction denoted by Ly5 includes 2.0 diffusion intervals, which are dead space, in the longitudinal direction for four rows.

According to this embodiment, the supply voltage line, reference voltage line, and selection address signal lines are implemented as the second metal lines and extend in the direction perpendicular to the row direction of the NAND decoder having a four-row two-column arrangement, and the input gates of the NAND decoder are connected to the second metal lines via the first metal lines that are arranged in parallel to the row direction to thereby enable supply of any selection address signals to the input of the NAND decoder. Consequently, a NAND decoder that allows arrangement in accordance with the minimum pitch of the second metal lines and has a smaller area can be implemented. Further, eight MOS transistors are arranged in four rows and two columns, and locations of the diffusion intervals are reduced to thereby reduce the dimension in the lateral direction and further reduce the area of the NAND decoder.

Eleventh Embodiment

In the embodiments described above, arrangement has been described while assuming, for example, a process of arranging planar silicon layers on an insulating film, such as a buried oxide (BOX) film layer, formed on a substrate. The arrangement is similarly performed by using a bulk CMOS process. FIGS. 18A to 18D illustrate an eleventh embodiment in which arrangement according to the embodiment illustrated in FIG. 4A and so on is performed by using a bulk CMOS process, for example.

Figure 18A:
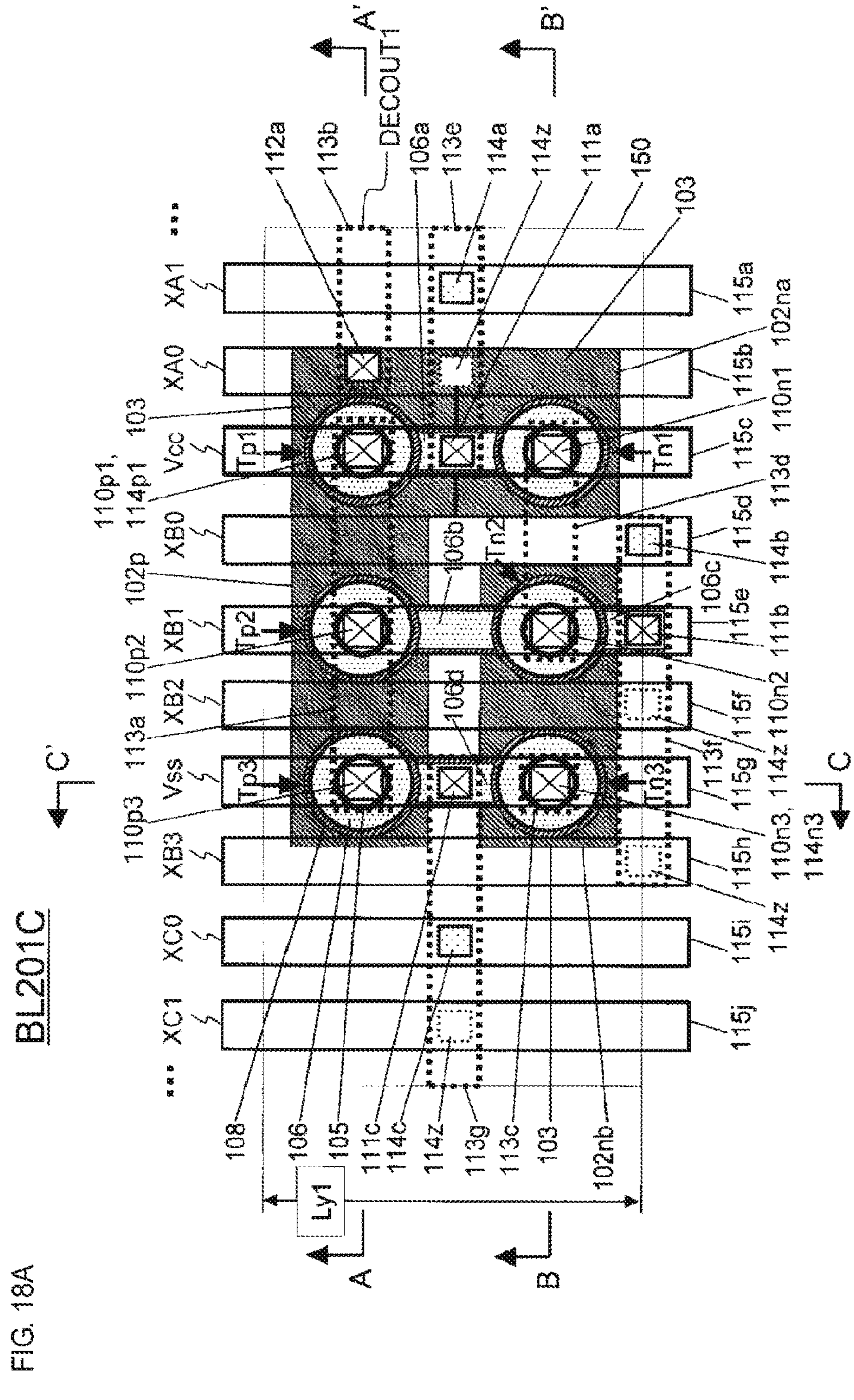
FIG. 18A is a plan view of a NAND decoder according to an eleventh embodiment of the present invention.
Figure 18B:
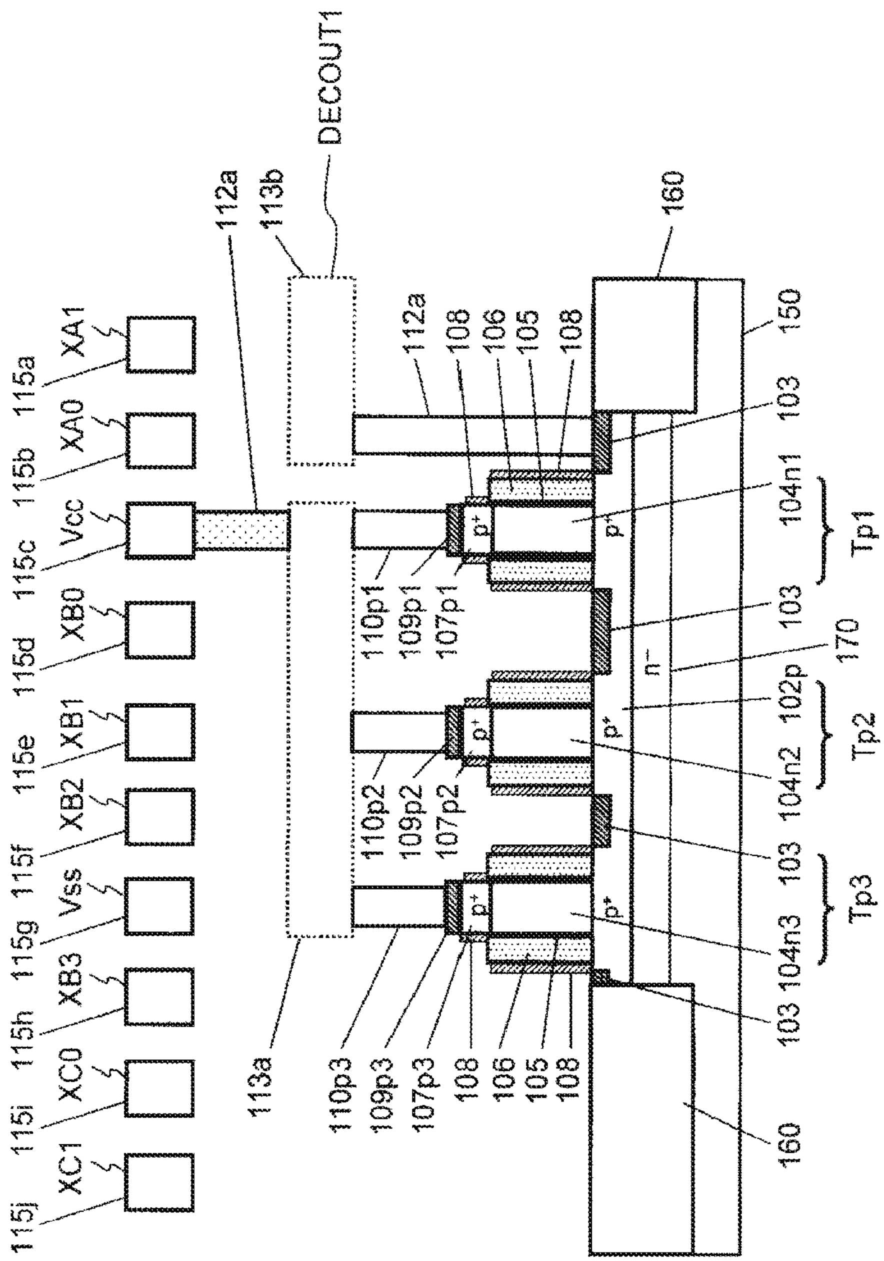
FIG. 18B is a cross-sectional view of the NAND decoder according to the eleventh embodiment of the present invention.
Figure 18C:
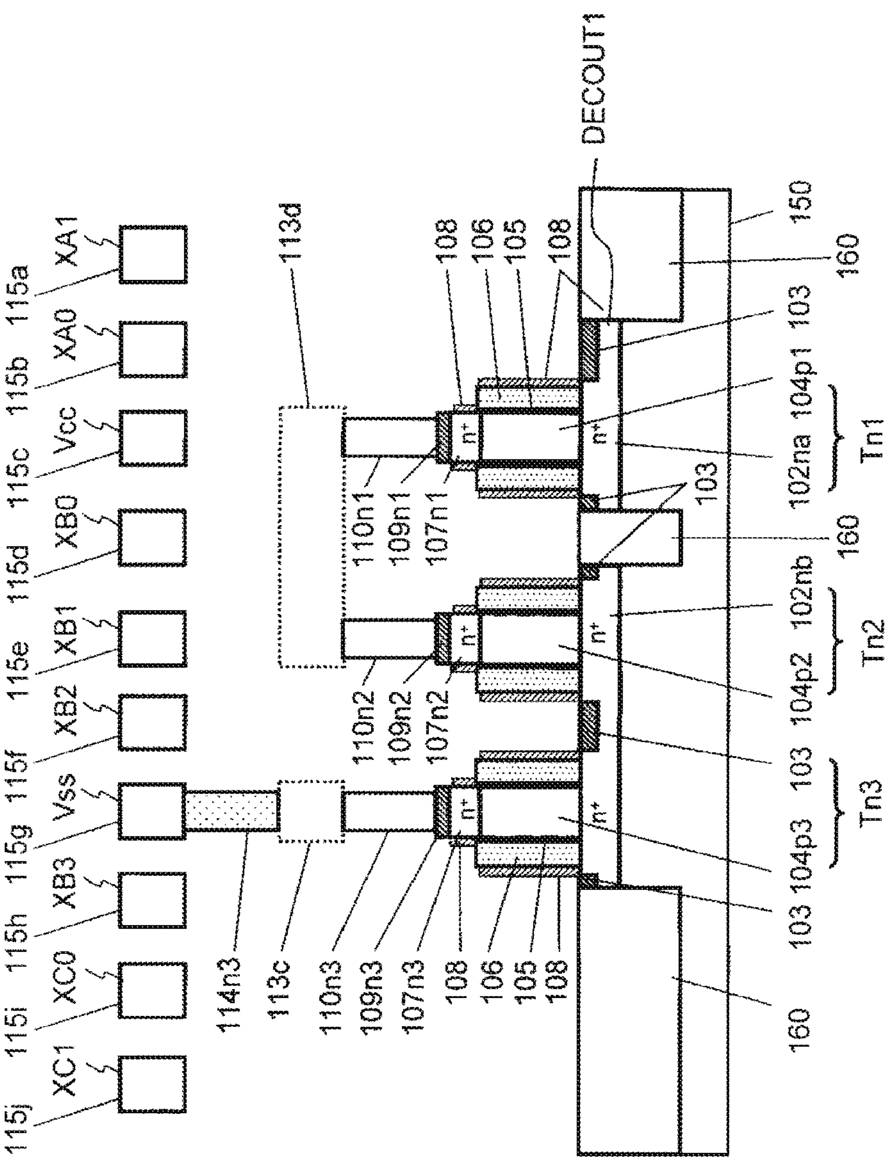
FIG. 18C is a cross-sectional view of the NAND decoder according to the eleventh embodiment of the present invention.
Figure 18D:
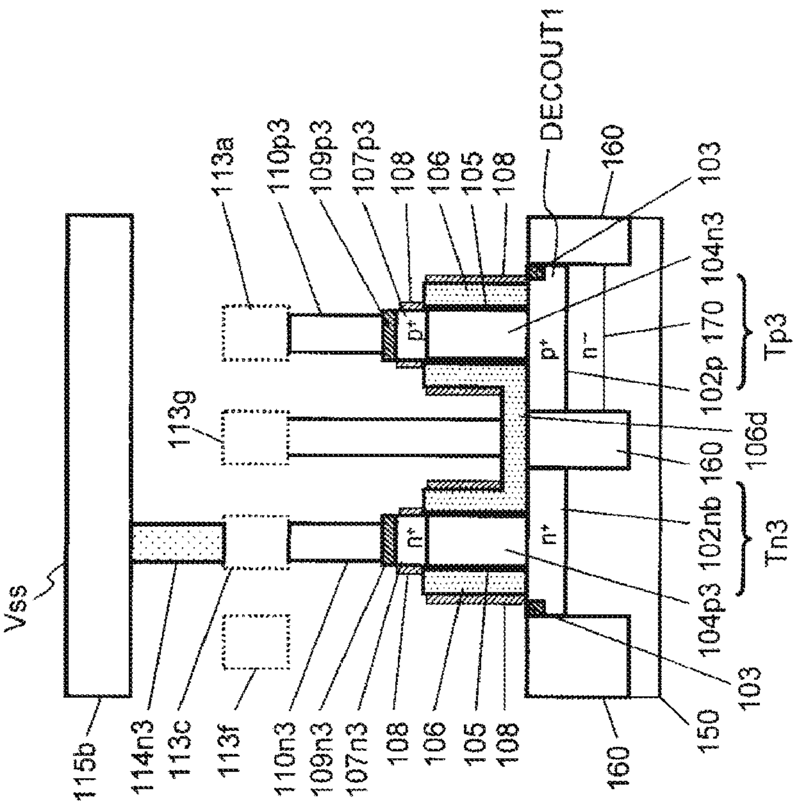
FIG. 18D is a cross-sectional view of the NAND decoder according to the eleventh embodiment of the present invention.

FIG. 18A is a plan view of a layout (arrangement) of a NAND decoder (three-input NAND decoder) according to this embodiment. FIG. 18B is a cross-sectional view taken along cut line A-A' in FIG. 18A. FIG. 18C is a cross-sectional view taken along cut line B-B' in FIG. 18A. FIG. 18D is a cross-sectional view taken along cut line C-C' in FIG. 18A.

In FIGS. 18A, 18B, 18C, and 18D, a portion having the same structure as the corresponding one in FIGS. 4A, 4B, 4D, 4F, and 4I is denoted by a corresponding reference numeral in the one hundreds.

With reference to Japanese Patent No. 4756221, there is no difference between the plan view illustrated in FIG. 18A, the arrangement illustrated in FIG. 18A being performed by using a bulk CMOS process, and the plan view illustrated in FIG. 4A, the arrangement illustrated in FIG. 4A being performed by using a BOX process. However, the cross-sectional views illustrated in FIGS. 18B, 18C, and 18D differ from those illustrated in FIG. 4B and so on. In FIG. 18B, reference numeral 150 denotes a p-type silicon substrate. Reference numeral 160 denotes an insulator for element separation (isolation). Reference numeral 170 denotes an n-region that serves as a division layer for leak prevention. The lower diffusion layer and the portions thereabove other than the p-type silicon substrate 150, the insulator 160 for element separation, and the division layer 170 for leak prevention have completely the same structure as those illustrated in FIG. 4B and so on, and are structured by using the same process. The first to tenth embodiments of the present invention can be implemented by using a bulk CMOS process.

The first to eleventh embodiments have been described above. In the above-described embodiments, in order to minimize the areas of the decoders, the number of transistors that constitute each of the decoders is minimized. A modification in which a plurality of transistors are arranged in parallel in order to increase the operating speed of the NAND decoder or in order to increase the driving capability (amount of current) of the inverter, for example, is included in the present invention as a matter of design choice. Providing a reset transistor that resets the decoder or adding a standby (current cut) function is also included as a matter of design choice.

In the description of the embodiments, the silicon pillars of the PMOS transistors are defined as n-type silicon layers, and the silicon pillars of the NMOS transistors are defined as p-type silicon layers, for convenience sake. However, the concentration control through impurity implantation is difficult in a miniaturized process. Therefore, there may be a case where so-called neutral (intrinsic) semiconductors, in which no impurity implantation is involved, are used as silicon pillars for both PMOS transistors and NMOS transistors, and channels are controlled, that is, the thresholds for PMOS and NMOS are controlled by using a difference in the work function specific to the metal gate material.

In the embodiments, the lower diffusion layers or the upper diffusion layers are covered by a silicide layer. Silicide is employed in order to lower the resistance. Other low-resistance materials may be used. As a generic term of a metallic compound, silicide is defined to be the material.

The principle of the present invention is to provide a decoder that is aligned with the pitch of the memory cells and that has a reduced area including the wiring regions by connecting the drains of the transistors connected to an output terminal in common via a lower diffusion layer or connecting the drains of the transistors connected to the output terminal in common via an upper diffusion layer and via a contact, which is the characteristics of SGTs, so as to reduce the area of the decoder, and by devising the method for wiring the supply voltage line, reference voltage line, and plurality of selection address signal lines that are input to the decoder. As long as the arrangement method described above is employed, a wiring method and wiring positions relating to the gate lines, a wiring method and wiring positions relating to the metal lines, and the like other than those illustrated in the drawings of the embodiments fall within the technical scope of the present invention.

The invention claimed is:

1. A semiconductor device forming a decoder circuit, comprising:

a plurality of rows each row including a NAND decoder connected to an inverter, each NAND decoder including a plurality of transistors on a substrate in M rows and N columns, each of the plurality of transistors having a source, a drain, and a gate in layers arranged in a direction perpendicular to the substrate;

each of the plurality of transistors including:

a semiconductor pillar, an insulator surrounding a side surface of the semiconductor pillar, a gate surrounding the insulator, a source region arranged on a top or on a bottom of the semiconductor pillar; and a drain region arranged on the top or on the bottom of the semiconductor pillar, on a side of the semiconductor pillar opposite from the source region;

each NAND decoder including i P-channel MOS transistors, and i N-channel MOS transistors, where i=3 or 4, and wherein in the i P-channel MOS transistors and the i N-channel MOS transistors, a k-th P-channel MOS transistor, where k=1 to 4, and a k-th N-channel MOS transistor constitute a pair, and the gate conductive layer of the k-th P-channel MOS transistor and the gate conductive layer of the k-th N-channel MOS transistor are connected to each other;

the drain regions of the i P-channel MOS transistors and the drain region of a first N-channel MOS transistor are arranged on a side of the semiconductor pillars closer to the substrate, and the drain regions of the i P-channel MOS transistors and the drain region of the first N-channel MOS transistor are connected to one another via a conductive region;

the source region of an s-th N-channel MOS transistor, where s=1 to n−1, and the drain region of an s+1-th N-channel MOS transistor are connected to each other via a connection including a conductive region;

the source regions of the i P-channel MOS transistors are each connected to a supply voltage line, and the source region of an i-th N-channel MOS transistor is connected to a reference voltage line;

the gate conductive layers of k pairs of MOS transistors, the gate conductive layers of each pair of MOS transistors being connected to each other, are connected to input signal lines, where the gate conductive layer of the first N-channel MOS transistor is connected to a same signal line as a first P-channel MOS transistor and gate conductive layers of a second and a third P-channel transistor are each connected to a different signal line than the gate conductive layer of the first N-channel MOS transistor; and the supply voltage line, the reference voltage line, and the input signal lines extend in an identical direction.

2. The semiconductor device according to claim 1, wherein the i P-channel MOS transistors are arranged in one row and n columns, the i N-channel MOS transistors are arranged in one row and n columns, and the supply voltage line, the reference voltage line, and the input signal lines extend in a direction perpendicular to a row direction.

3. The semiconductor device according to claim 2, wherein the source regions of the i P-channel MOS transistors are connected to a first conductive line, the source region of an N-channel MOS transistor in an n-th column is connected to another first conductive line, the supply voltage line and the reference voltage line that extend perpendicular to the row are constituted by second conductive lines, and the source regions of the i P-channel MOS transistors are connected to one of the second conductive lines via the first conductive line, and the source region of the N-channel MOS transistor in the n-th column is connected to the other of the second conductive lines via the other first conductive line.

4. The semiconductor device according to claim 2, wherein the input signal lines that extend perpendicular to the row are constituted by second conductive lines, and the gate conductive layers of the k pairs of MOS transistors, the gate conductive layers of each pair of MOS transistors being connected to each other, are connected to the second conductive lines via first conductive lines that extend in the row direction.

5. The semiconductor device according to claim 2, wherein the decoder circuit further comprises a first inverter arranged along the MOS transistors having the two-row N-column arrangement the drain regions of the i P-channel MOS transistors and the drain region of the N-channel MOS transistor in the first column being connected in common to one another, are connected to input of the first inverter, and output of the first inverter serves as output of the decoder circuit.

6. A semiconductor device forming a decoder circuit, comprising:

a plurality of rows each row including a NAND decoder connected to an inverter, each NAND decoder including a plurality of transistors arranged on a substrate in M rows and N columns, each of the plurality of transistors having a source, a drain, and a gate in layers arranged in a direction perpendicular to the substrate;

each of the plurality of transistors including:

a semiconductor pillar, an insulator surrounding a side surface of the semiconductor pillar, a gate surrounding the insulator, a source region arranged on a top or on a bottom of the semiconductor pillar; and a drain region on the top or on the bottom of the semiconductor pillar, on a side of the semiconductor pillar opposite from the source region;

each NAND decoder including i P-channel MOS transistors, and i N-channel MOS transistors, where i=3 or 4, and wherein in the i P-channel MOS transistors and the i N-channel MOS transistors, a k-th P-channel MOS transistor, where k=1 to n 4, and a k-th N-channel MOS transistor constitute a pair, and the gate conductive layer of the k-th P-channel MOS transistor and the gate conductive layer of the k-th N-channel MOS transistor are connected to each other;

the drain regions of the i P-channel MOS transistors and the drain region of a first N-channel MOS transistor are arranged on a side of the semiconductor pillars closer to the substrate, and the drain regions of the i P-channel MOS transistors and the drain region of the first N-channel MOS transistor are connected to one another via a conductive region;

the source region of an s-th N-channel MOS transistor, where s=1 to i−1, and the drain region of an s+1-th N-channel MOS transistor are connected to each other via a connection including a conductive region;

the source regions of the i P-channel MOS transistors are each connected to a supply voltage line, and the source region of an i-th N-channel MOS transistor is connected to a reference voltage line;

the gate conductive layers of k pairs of MOS transistors, the gate conductive layers of each pair of MOS transistors being connected to each other, are connected to input signal lines, where the gate conductive layer of a first N-channel MOS transistor is connected to a same signal line as a first P-channel MOS transistor and gate conductive layers of a second and a third P-channel transistor are each connected to a different signal line than the gate conductive layer of the first N-channel MOS transistor; and the supply voltage line, the reference voltage line, and the input signal lines extend in an identical direction, wherein the i P-channel MOS transistors are arranged in M rows and one column, the i N-channel MOS transistors are arranged in M rows and one column, and the supply voltage line, the reference voltage line, and the input signal lines extend in a direction perpendicular to a row direction.

7. The semiconductor device according to claim 6, wherein the source regions of the i P-channel MOS transistors are connected to a first conductive line, the source region of an N-channel MOS transistor in an M-th row is connected to another first conductive line, the supply voltage line and the reference voltage line that extend perpendicular to the rows are constituted by second conductive lines, and the source regions of the i P-channel MOS transistors are connected to one of the second conductive lines via the first conductive line, and the source region of the N-channel MOS transistor in the M-th row is connected to the other of the second conductive lines via the other first conductive line.

8. The semiconductor device according to claim 6, wherein the input signal lines that extend perpendicular to the rows are constituted by second conductive lines, and the gate conductive layers of the k pairs of MOS transistors, the gate conductive layers of each pair of MOS transistors being connected to each other, are connected to the second conductive lines via first conductive lines that extend in a direction parallel to the rows.

9. The semiconductor device according to claim 6, wherein the decoder circuit further comprises a first inverter arranged along the MOS transistors having the one-row N-column arrangement the drain regions of the i P-channel MOS transistors and the drain region of the N-channel MOS transistor in the first row being connected in common to one another, are connected to input of the first inverter, and output of the first inverter serves as output of the decoder circuit.

10. A semiconductor device forming a decoder circuit, comprising:

a plurality of rows each row including a NAND decoder connected to an inverter, each NAND decoder including a plurality of transistors on a substrate in M rows and N columns, each of the plurality of transistors having a source, a drain, and a gate conductive layer in layers in a direction perpendicular to the substrate;

each of the plurality of transistors including:

a semiconductor pillar, an insulator surrounding a side surface of the semiconductor pillar, a gate surrounding the insulator, a source region arranged on a top or on a bottom of the semiconductor pillar, and a drain region arranged on the top or on the bottom of the semiconductor pillar, on a side of the semiconductor pillar opposite to the source region:

each NAND decoder including i P-channel MOS transistors, and i N-channel MOS transistors, where i=3 or 4, and wherein in the i P-channel MOS transistors and the i N-channel MOS transistors, a k-th P-channel MOS transistor, where k=1 to 4, and a k-th N-channel MOS transistor constitute a pair, and the gate conductive layer of the k-th P-channel MOS transistor and the gate conductive layer of the k-th N-channel MOS transistor are connected to each other, the source regions of the i P-channel MOS transistors and the source region of a first N-channel MOS transistor are arranged on a side of the semiconductor pillars closer to the substrate, and the drain regions of the i P-channel MOS transistors and the drain region of the first N-channel MOS transistor are connected to one another via contacts, the source region of an s-th N-channel MOS transistor, where s=1 to i−1, and the drain region of an s+1-th N-channel MOS transistor are connected to each other, the source regions of the i P-channel MOS transistors are each connected to a supply voltage line, and the source region of an i-th N-channel MOS transistor is connected to a reference voltage line, the gate conductive layers of k pairs of MOS transistors, the gate conductive layers of each pair of MOS transistors being connected to each other, are connected to input signal lines, and the supply voltage line, the reference voltage line, and the input signal lines extend in an identical direction, where the gate conductive layer of a first N-channel MOS transistor is connected to a same signal line as a first P-channel MOS transistor and gate conductive layers of a second and a third P-channel transistor are each connected to a different signal line than the gate conductive layer of the first N-channel MOS transistor, and the supply voltage line, the reference voltage line, and the input signal lines extend in an identical direction, wherein the source regions of P-channel MOS transistors adjacent to each other in the decoder circuit are connected in common via a conductive region.

11. The semiconductor device according to claim 10, wherein the i P-channel MOS transistors are arranged in one row and n columns, the i N-channel MOS transistors are arranged in one row and n columns, and the supply voltage line, the reference voltage line, and the input signal lines extend in a direction perpendicular to a row direction.

12. The semiconductor device according to claim 11, wherein the source regions of the i P-channel MOS transistors are connected to a first conductive line that extends in a direction parallel to the row, the source region of an N-channel MOS transistor in an N-th column is connected to another first conductive line, the supply voltage line and the reference voltage line that extend perpendicular to the row are constituted by second conductive lines, and the source regions of the i P-channel MOS transistors are connected to one of the second conductive lines via the first conductive line, and the source region of the N-channel MOS transistor in the n-th column is connected to the other of the second conductive lines via the other first conductive line.

13. The semiconductor device according to claim 11, wherein the input signal lines that extend perpendicular to the row are constituted by second conductive lines, and the gate conductive layers of the k pairs of MOS transistors, the gate conductive layers of each pair of MOS transistors being connected to each other, are connected to the second conductive lines via first conductive lines that extend in the row direction.

14. The semiconductor device according to claim 11, wherein a plurality of the decoder circuits are arranged in a column direction.

15. The semiconductor device according to claim 11, wherein the decoder circuit further comprises a first inverter arranged along the MOS transistors having the one-row n-column arrangement the drain regions of the i P-channel MOS transistors and the drain region of the N-channel MOS transistor in the first column being connected in common to one another via contacts, are connected to input of the first inverter, and output of the first inverter serves as output of the decoder circuit.

16. The semiconductor device according to claim 15, wherein the first inverter includes at least an n+1-th P-channel MOS transistor, and an n+1-th N-channel MOS transistor, the source regions of the i P-channel MOS transistors and the source region of the n+1-th P-channel MOS transistor are connected in common via a conductive region, and are connected to a first conductive line, the source region of the N-channel MOS transistor in the n-th column and the source region of the n+1-th N-channel MOS transistor are connected in common via a conductive region, and are connected to another first conductive line, the supply voltage line and the reference voltage line that extend perpendicular to the row are constituted by second conductive lines, and the source regions of the i P-channel MOS transistors are connected to one of the second conductive lines via the first conductive line, and the source region of the N-channel MOS transistor in the n-th column is connected to the other of the second conductive lines via the other first conductive line.

17. A semiconductor device forming a decoder circuit, comprising:

a plurality of rows each row including a NAND decoder connected to an inverter, each NAND decoder including a plurality of transistors arranged on a substrate in M rows and N columns, each of the plurality of transistors having a source, a drain, and a gate in layers in a direction perpendicular to the substrate;

each of the plurality of transistors including:

a semiconductor pillar, an insulator surrounding a side surface of the semiconductor pillar, a gate surrounding the insulator, a source region arranged on a top or on a bottom of the semiconductor pillar, and a drain region arranged on the top or on the bottom of the semiconductor pillar, on a side of the semiconductor pillar opposite to the source region:

each NAND decoder including i P-channel MOS transistors, and i N-channel MOS transistors, where i=3 or 4, and wherein in the i P-channel MOS transistors and the i N-channel MOS transistors, a k-th P-channel MOS transistor, where k=1 to 4, and a k-th N-channel MOS transistor constitute a pair, and the gate conductive layer of the k-th P-channel MOS transistor and the gate conductive layer of the k-th N-channel MOS transistor are connected to each other, the source regions of the i P-channel MOS transistors and the source region of a first N-channel MOS transistor are arranged on a side of the semiconductor pillars closer to the substrate, and the drain regions of the i P-channel MOS transistors and the drain region of the first N-channel MOS transistor are connected to one another via contacts, the source region of an s-th N-channel MOS transistor, where s=1 to n−1, and the drain region of an s+1-th N-channel MOS transistor are connected to each other, the source regions of the i P-channel MOS transistors are each connected to a supply voltage line, and the source region of an n-th N-channel MOS transistor is connected to a reference voltage line, the gate conductive layers of k pairs of MOS transistors, the gate conductive layers of each pair of MOS transistors being connected to each other, are connected to input signal lines, where the gate conductive layer of a first N-channel MOS transistor is connected to a same signal line as a first P-channel MOS transistor and gate conductive layers of a second and a third P-channel transistor are each connected to a different signal line than the gate conductive layer of the first N-channel MOS transistor, and the supply voltage line, the reference voltage line, and the input signal lines extend in an identical direction, wherein the i P-channel MOS transistors are arranged in M rows and one column, the i N-channel MOS transistors are arranged in M rows and one column, and the supply voltage line, the reference voltage line, and the input signal lines extend in a direction perpendicular to a row direction, wherein the source regions of P-channel MOS transistors adjacent to each other in the decoder circuit are connected in common via a conductive region.

18. The semiconductor device according to claim 17, wherein the source regions of the i P-channel MOS transistors are connected to a first conductive line, the source region of an N-channel MOS transistor in an M-th row is connected to another first conductive line, the supply voltage line and the reference voltage line that extend perpendicular to the rows are constituted by second conductive lines, and the source regions of the n P-channel MOS transistors are connected to one of the second conductive lines via the first conductive line, and the source region of the N-channel MOS transistor in the n-th row is connected to the other of the second conductive lines via the other first conductive line.

19. The semiconductor device according to claim 17, wherein the input signal lines that extend perpendicular to the row direction are constituted by second conductive lines, and the gate conductive layers of the k pairs of MOS transistors, the gate conductive layers of each pair of MOS transistors being connected to each other, are connected to the second conductive lines via first conductive lines that extend in a direction along the rows.

20. The semiconductor device according to claim 17, wherein the decoder circuit further comprises a first inverter having a one-row and two-column arrangement, the drain regions of the i P-channel MOS transistors and the drain region of the N-channel MOS transistor in the first row being connected in common to one another via contacts, are connected to an input of the first inverter, and an output of the first inverter serves as an output of the decoder circuit.

21. The semiconductor device according to claim 20, wherein the first inverter includes at least an n+1-th P-channel MOS transistor, and an i+1-th N-channel MOS transistor, the source regions of the i P-channel MOS transistors and the source region of the n+1-th P-channel MOS transistor are connected in common via a conductive region, and are connected to a first conductive line, the source region of the N-channel MOS transistor in the M-th row and the source region of the n+1-th N-channel MOS transistor are connected in common via a conductive region, and are connected to another first conductive line, the supply voltage line and the reference voltage line that extend perpendicular to the rows are constituted by second conductive lines, and the source regions of the i P-channel MOS transistors are connected to one of the second conductive lines via the first conductive line, and the source region of the N-channel MOS transistor in the n-th row is connected to the other of the second conductive lines via the other first conductive line.

22. A semiconductor device forming a static memory including a plurality of transistors arranged on a substrate, each of the plurality of transistors having a source, a drain, and a gate in layers in a direction perpendicular to the substrate, the static memory comprising:

a plurality of static memory cells each including at least six MOS transistors arranged on an insulating film formed on the substrate and arranged in a matrix;

a plurality of row address circuits each specifying one row-line of the static memory cells; and a plurality of row decoder circuits each including a plurality of MOS transistors and each selecting one row of the static memory cells in accordance with signals from the row address circuits;

each of the six MOS transistors that constitute each of the static memory cells, and each of the plurality of MOS transistors that constitute each of the row decoder circuits including:

a semiconductor pillar, an insulator surrounding a side surface of the semiconductor pillar, a gate surrounding the insulator, a source region arranged on a top or on a bottom of the semiconductor pillar, and a drain region arranged on the top or on the bottom of the semiconductor pillar, on a side of the semiconductor pillar opposite from source region, the six MOS transistors included in each of the static memory cells being arranged in two rows and three columns, each of the row decoder circuits including at least n P-channel MOS transistors arranged in one row and N columns, i N-channel MOS transistors arranged in one row and N columns, and an inverter, wherein, in the i P-channel MOS transistors and the i N-channel MOS transistors, a P-channel MOS transistor in a k-th column, where k=1 to n and n=2 to 4, arranged in one row and an N-channel MOS transistor in the k-th column arranged in one row constitute a pair, and the gate conductive layer of the P-channel MOS transistor in the k-th column and the gate conductive layer of the N-channel MOS transistor in the k-th column are connected to each other, the drain regions of the i P-channel MOS transistors and the drain region of an N-channel MOS transistor in a first column are arranged on a side of the semiconductor pillars closer to the substrate, and the drain regions of the i P-channel MOS transistors and the drain region of the N-channel MOS transistor in the first column are connected to one another via a conductive region, the source region of an N-channel MOS transistor in an s-th column, where s=1 to n−1, and the drain region of an N-channel MOS transistor in an s+1-th column are connected to each other, the source regions of the i P-channel MOS transistors are each connected to a supply voltage line that extends in a direction perpendicular to the row, and the source region of an N-channel MOS transistor in an N-th column is connected to a reference voltage line that extends in the direction perpendicular to the row, input signal lines that are connected to the gate conductive layers of k pairs of MOS transistors, the gate conductive layers of each pair of MOS transistors being connected to each other, are constituted by lines that extend in the direction perpendicular to the row, and the drain regions of the i P-channel MOS transistors and the drain region of the N-channel MOS transistor in the first column are connected to an input gate conductive layer of the inverter, and output of the inverter is connected to a row selection line of the static memory cells.

23. The semiconductor device according to claim 22, wherein the source regions of the i P-channel MOS transistors are connected to a first conductive line, the source region of the N-channel MOS transistor in the N-th column is connected to another first conductive line, the supply voltage line and the reference voltage line that extend perpendicular to the row are constituted by second conductive lines, the source regions of the i P-channel MOS transistors are connected to one of the second conductive lines via the first conductive line, and the source region of the N-channel MOS transistor in the N-th column is connected to the other of the second conductive lines via the other first conductive line, the input signal lines that extend perpendicular to the row are constituted by second conductive lines, and the gate conductive layers of the k pairs of MOS transistors, the gate conductive layers of each pair of MOS transistors being connected to each other, are connected to the second conductive lines via first conductive lines that extend in a direction along the row.

24. A semiconductor device forming a static memory including a plurality of transistors arranged on a substrate, each of the plurality of transistors having a source, a drain, and a gate arranged in layers in a direction perpendicular to the substrate, the static memory comprising:

a plurality of static memory cells each including at least six MOS transistors arranged on an insulating film formed on the substrate and arranged in a matrix;

a plurality of row address circuits each specifying one row-line of the static memory cells; and a plurality of row decoder circuits each including a plurality of MOS transistors and each selecting one row of the static memory cells in accordance with signals from the row address circuits, each of the six MOS transistors that constitute each of the static memory cells, and each of the plurality of MOS transistors that constitute each of the row decoder circuits including a semiconductor pillar, an insulator surrounding a side surface of the semiconductor pillar, a gate surrounding the insulator, a source region arranged on a top or on a bottom of the semiconductor pillar, and a drain region arranged on the top or on the bottom of the semiconductor pillar, on a side of the semiconductor pillar opposite from the source region, the six MOS transistors included in each of the static memory cells being arranged in two rows and three columns, each of the row decoder circuits including at least n P-channel MOS transistors arranged in one row and N columns, n N-channel MOS transistors arranged in one row and N columns, and an inverter, wherein, in the i P-channel MOS transistors and the i N-channel MOS transistors, a P-channel MOS transistor in a k-th column, where k=1 to n and n=2 to 4, arranged in one row and an N-channel MOS transistor in the k-th column arranged in one row constitute a pair, and the gate conductive layer of the P-channel MOS transistor in the k-th column and the gate conductive layer of the N-channel MOS transistor in the k-th column are connected to each other, the source regions of the i P-channel MOS transistors and the source region of an N-channel MOS transistor in a first column are arranged on a side of the semiconductor pillars closer to the substrate, and the drain regions of the i P-channel MOS transistors and the drain region of the N-channel MOS transistor in the first column are connected to one another via contacts, the source region of an N-channel MOS transistor in an s-th column, where s=1 to n−1, and the drain region of an N-channel MOS transistor in an s+1-th column are connected to each other, the source regions of the i P-channel MOS transistors are each connected to a supply voltage line that extends in a direction perpendicular to the row, and the source region of an N-channel MOS transistor in an N-th column is connected to a reference voltage line that extends in the direction perpendicular to the row, input signal lines that are connected to the gate conductive layers of n pairs of MOS transistors, the gate conductive layers of each pair of MOS transistors being connected to each other, are constituted by lines that extend in the direction perpendicular to the row, and the drain regions of the i P-channel MOS transistors and the drain region of the N-channel MOS transistor in the first column are connected to an input gate of the inverter, and output of the inverter is connected to a row selection line of the static memory cells.

25. The semiconductor device according to claim 24, wherein the source regions of the i P-channel MOS transistors are connected to a first conductive line that extends in a direction parallel to the row, the source region of the N-channel MOS transistor in the N-th column is connected to another first conductive line, the supply voltage line and the reference voltage line that extend perpendicular to the row are constituted by second conductive lines, the source regions of the i P-channel MOS transistors are connected to one of the second conductive lines via the first conductive line, and the source region of the N-channel MOS transistor in the N-th column is connected to the other of the second conductive lines via the other first conductive line, the input signal lines that extend perpendicular to the row are constituted by second conductive lines, and the gate conductive layers of the k pairs of MOS transistors, the gate conductive layers of each pair of MOS transistors being connected to each other, are connected to the second conductive lines via first conductive lines that extend in a direction along the row.

* * * * *